(12) United States Patent
Or-Bach et al.

(10) Patent No.: US 12,362,219 B2
(45) Date of Patent: Jul. 15, 2025

(54) 3D SEMICONDUCTOR MEMORY DEVICE AND STRUCTURE

(71) Applicant: Monolithic 3D Inc., San Jose, CA (US)

(72) Inventors: Zvi Or-Bach, San Jose, CA (US); Brian Cronquist, Klamath Falls, OR (US); Deepak C. Sekar, Sunnyvale, CA (US); Zeev Wurman, Palo Alto, CA (US); Israel Beinglass, Sunnyvale, CA (US)

(73) Assignee: Monolithic 3D Inc., Klamath Falls, OR (US)

( * ) Notice: Subject to any disclaimer, the term of this patent is extended or adjusted under 35 U.S.C. 154(b) by 0 days.

(21) Appl. No.: 16/537,564

(22) Filed: Aug. 10, 2019

(65) Prior Publication Data
US 2019/0363001 A1 Nov. 28, 2019

Related U.S. Application Data

(63) Continuation-in-part of application No. 15/460,230, filed on Mar. 16, 2017, now Pat. No. 10,497,713,
(Continued)

(51) Int. Cl.
*H01L 21/683* (2006.01)
*G11C 8/16* (2006.01)
(Continued)

(52) U.S. Cl.
CPC ............ *H01L 21/6835* (2013.01); *G11C 8/16* (2013.01); *H01L 21/743* (2013.01);
(Continued)

(58) Field of Classification Search
CPC .............. H01L 27/249; H01L 27/2436; H01L 29/0649; H01L 27/11529; H01L 27/11551;
(Continued)

(56) References Cited

U.S. PATENT DOCUMENTS 3,007,090 A 10/1961 Rutz
3,819,959 A 6/1974 Chang et al.
(Continued)

FOREIGN PATENT DOCUMENTS

EP 1267594 A2 12/2002
WO PCT/US2008/063483 5/2008

OTHER PUBLICATIONS

Topol, A.W., et al., "Enabling SOI-Based Assembly Technology for Three-Dimensional (3D) Integrated Circuits (ICs)," IEDM Tech. Digest, Dec. 5, 2005, pp. 363-366.
(Continued)

*Primary Examiner* — Mary A Wilczewski
(74) *Attorney, Agent, or Firm* — PatentPC/PowerPatent; Bao Tran

(57) ABSTRACT

A 3D semiconductor memory, the memory including: a first level including first memory cells, first transistors, and a first control line, where the first memory cells each include one of the first transistors; a second level including second memory cells, second transistors, and a second control line, where the second memory cells each include one of the second transistors, where the second level overlays the first level, where the second control line and the first control line have been processed following the same lithography step and accordingly are self-aligned, where the first control line is directly connected to each source or drain of at least five of the first transistors, and where the second control line is directly connected to each source or drain of at least five of the second transistors; and an oxide layer disposed between the first control line and the second control line.

20 Claims, 50 Drawing Sheets

Related U.S. Application Data which is a continuation-in-part of application No. 14/821,683, filed on Aug. 7, 2015, now Pat. No. 9,613,844, which is a continuation-in-part of application No. 13/492,395, filed on Jun. 8, 2012, now Pat. No. 9,136,153, which is a continuation of application No. 13/273,712, filed on Oct. 14, 2011, now Pat. No. 8,273,610, which is a continuation-in-part of application No. 13/016,313, filed on Jan. 28, 2011, now Pat. No. 8,362,482, which is a continuation-in-part of application No. 12/970,602, filed on Dec. 16, 2010, now Pat. No. 9,711,407, which is a continuation-in-part of application No. 12/949,617, filed on Nov. 18, 2010, now Pat. No. 8,754,533.

(51) Int. Cl.

| | | |
|---|---|---|
| *H01L 21/74* | (2006.01) | |
| *H01L 21/762* | (2006.01) | |
| *H01L 21/768* | (2006.01) | |
| *H01L 23/48* | (2006.01) | |
| *H01L 23/525* | (2006.01) | |
| *H10B 10/00* | (2023.01) | |
| *H10B 12/00* | (2023.01) | |
| *H10B 20/00* | (2023.01) | |
| *H10B 20/25* | (2023.01) | |
| *H10B 41/20* | (2023.01) | |
| *H10B 41/40* | (2023.01) | |
| *H10B 41/41* | (2023.01) | |
| *H10B 43/20* | (2023.01) | |
| *H10B 43/40* | (2023.01) | |
| *H10D 10/01* | (2025.01) | |
| *H10D 30/01* | (2025.01) | |
| *H10D 30/60* | (2025.01) | |
| *H10D 30/68* | (2025.01) | |
| *H10D 30/69* | (2025.01) | |
| *H10D 64/01* | (2025.01) | |
| *H10D 64/27* | (2025.01) | |
| *H10D 84/01* | (2025.01) | |
| *H10D 84/03* | (2025.01) | |
| *H10D 84/85* | (2025.01) | |
| *H10D 84/90* | (2025.01) | |
| *H10D 86/00* | (2025.01) | |
| *H10D 86/01* | (2025.01) | |
| *H10D 88/00* | (2025.01) | |
| *H10D 89/10* | (2025.01) | |
| *H01L 23/00* | (2006.01) | |
| *H01L 23/367* | (2006.01) | |
| *H01L 25/00* | (2006.01) | |
| *H01L 25/065* | (2023.01) | |
| *H10D 86/40* | (2025.01) | |
| *H10D 86/60* | (2025.01) | |

(52) U.S. Cl.
CPC .. *H01L 21/76254* (2013.01); *H01L 21/76898* (2013.01); *H01L 23/481* (2013.01); *H01L 23/5252* (2013.01); *H10B 10/00* (2023.02); *H10B 10/125* (2023.02); *H10B 12/053* (2023.02); *H10B 12/09* (2023.02); *H10B 12/20* (2023.02); *H10B 12/50* (2023.02); *H10B 20/00* (2023.02); *H10B 20/25* (2023.02); *H10B 41/20* (2023.02); *H10B 41/40* (2023.02); *H10B 41/41* (2023.02); *H10B 43/20* (2023.02); *H10B 43/40* (2023.02); *H10D 10/051* (2025.01); *H10D 30/0411* (2025.01); *H10D 30/0413* (2025.01); *H10D 30/0512* (2025.01); *H10D 30/60* (2025.01); *H10D 30/681* (2025.01); *H10D 30/69* (2025.01); *H10D 30/711* (2025.01); *H10D 30/792* (2025.01); *H10D 64/027* (2025.01); *H10D 64/513* (2025.01); *H10D 84/0172* (2025.01); *H10D 84/038* (2025.01); *H10D 84/85* (2025.01); *H10D 84/907* (2025.01); *H10D 84/998* (2025.01); *H10D 86/01* (2025.01); *H10D 86/201* (2025.01); *H10D 88/00* (2025.01); *H10D 88/01* (2025.01); *H10D 89/10* (2025.01); *H01L 23/3677* (2013.01); *H01L 24/13* (2013.01); *H01L 24/16* (2013.01); *H01L 24/45* (2013.01); *H01L 24/48* (2013.01); *H01L 25/0655* (2013.01); *H01L 25/0657* (2013.01); *H01L 25/50* (2013.01); *H01L 2221/68368* (2013.01); *H01L 2223/5442* (2013.01); *H01L 2223/54426* (2013.01); *H01L 2224/131* (2013.01); *H01L 2224/16145* (2013.01); *H01L 2224/16146* (2013.01); *H01L 2224/16227* (2013.01); *H01L 2224/16235* (2013.01); *H01L 2224/32145* (2013.01); *H01L 2224/32225* (2013.01); *H01L 2224/45124* (2013.01); *H01L 2224/45147* (2013.01); *H01L 2224/48091* (2013.01); *H01L 2224/48227* (2013.01); *H01L 2224/73204* (2013.01); *H01L 2224/73253* (2013.01); *H01L 2224/73265* (2013.01); *H01L 2224/81005* (2013.01); *H01L 2224/83894* (2013.01); *H01L 2225/06513* (2013.01); *H01L 2225/06541* (2013.01); *H01L 2924/00011* (2013.01); *H01L 2924/01002* (2013.01); *H01L 2924/01004* (2013.01); *H01L 2924/01013* (2013.01); *H01L 2924/01018* (2013.01); *H01L 2924/01019* (2013.01); *H01L 2924/01029* (2013.01); *H01L 2924/01046* (2013.01); *H01L 2924/01066* (2013.01); *H01L 2924/01068* (2013.01); *H01L 2924/01077* (2013.01); *H01L 2924/01078* (2013.01); *H01L 2924/01322* (2013.01); *H01L 2924/10253* (2013.01); *H01L 2924/10329* (2013.01); *H01L 2924/12032* (2013.01); *H01L 2924/12033* (2013.01); *H01L 2924/12036* (2013.01); *H01L 2924/12042* (2013.01); *H01L 2924/1301* (2013.01); *H01L 2924/1305* (2013.01); *H01L 2924/13062* (2013.01); *H01L 2924/13091* (2013.01); *H01L 2924/14* (2013.01); *H01L 2924/1461* (2013.01); *H01L 2924/15311* (2013.01); *H01L 2924/1579* (2013.01); *H01L 2924/16152* (2013.01); *H01L 2924/181* (2013.01); *H01L 2924/19041* (2013.01); *H01L 2924/30105* (2013.01); *H01L 2924/3011* (2013.01); *H01L 2924/3025* (2013.01); *H10B 12/05* (2023.02); *H10D 86/0214* (2025.01); *H10D 86/40* (2025.01); *H10D 86/60* (2025.01)

(58) Field of Classification Search
CPC ... H01L 27/11578; H10B 20/00; H10B 20/30; H10B 41/20; H10B 41/41; H10B 63/10; H10B 63/30; H10B 63/84; H10B 63/845; H10D 88/00; H10D 88/01
See application file for complete search history.

(56) References Cited

U.S. PATENT DOCUMENTS

| | | |
|---|---|---|
| 4,009,483 A | 2/1977 | Clark |
| 4,197,555 A | 4/1980 | Uehara et al. |

(56) References Cited

U.S. PATENT DOCUMENTS

| | | |
|---|---|---|
| 4,213,139 A | 7/1980 | Rao et al. |
| 4,400,715 A | 8/1983 | Barbee et al. |
| 4,487,635 A | 12/1984 | Kugimiya et al. |
| 4,510,670 A | 4/1985 | Schwabe |
| 4,522,657 A | 6/1985 | Rohatgi et al. |
| 4,612,083 A | 9/1986 | Yasumoto et al. |
| 4,643,950 A | 2/1987 | Ogura et al. |
| 4,704,785 A | 11/1987 | Curran |
| 4,711,858 A | 12/1987 | Harder et al. |
| 4,721,885 A | 1/1988 | Brodie |
| 4,732,312 A | 3/1988 | Kennedy et al. |
| 4,733,288 A | 3/1988 | Sato |
| 4,829,018 A | 5/1989 | Wahlstrom |
| 4,854,986 A | 8/1989 | Raby |
| 4,866,304 A | 9/1989 | Yu |
| 4,939,568 A | 7/1990 | Kato et al. |
| 4,956,307 A | 9/1990 | Pollack et al. |
| 5,012,153 A | 4/1991 | Atkinson et al. |
| 5,032,007 A | 7/1991 | Silverstein et al. |
| 5,047,979 A | 9/1991 | Leung |
| 5,087,585 A | 2/1992 | Hayashi |
| 5,093,704 A | 3/1992 | Sato et al. |
| 5,106,775 A | 4/1992 | Kaga et al. |
| 5,152,857 A | 10/1992 | Ito et al. |
| 5,162,879 A | 11/1992 | Gill |
| 5,189,500 A | 2/1993 | Kusunoki |
| 5,217,916 A | 6/1993 | Anderson et al. |
| 5,250,460 A | 10/1993 | Yamagata et al. |
| 5,258,643 A | 11/1993 | Cohen |
| 5,265,047 A | 11/1993 | Leung et al. |
| 5,266,511 A | 11/1993 | Takao |
| 5,277,748 A | 1/1994 | Sakaguchi et al. |
| 5,286,670 A | 2/1994 | Kang et al. |
| 5,294,556 A | 3/1994 | Kawamura |
| 5,308,782 A | 5/1994 | Mazure et al. |
| 5,312,771 A | 5/1994 | Yonehara |
| 5,317,236 A | 5/1994 | Zavracky et al. |
| 5,324,980 A | 6/1994 | Kusunoki |
| 5,355,022 A | 10/1994 | Sugahara et al. |
| 5,371,037 A | 12/1994 | Yonehara |
| 5,374,564 A | 12/1994 | Bruel |
| 5,374,581 A | 12/1994 | Ichikawa et al. |
| 5,424,560 A | 6/1995 | Norman et al. |
| 5,475,280 A | 12/1995 | Jones et al. |
| 5,478,762 A | 12/1995 | Chao |
| 5,485,031 A | 1/1996 | Zhang et al. |
| 5,498,978 A | 3/1996 | Takahashi et al. |
| 5,527,423 A | 6/1996 | Neville et al. |
| 5,535,342 A | 7/1996 | Taylor |
| 5,554,870 A | 9/1996 | Fitch et al. |
| 5,563,084 A | 10/1996 | Ramm et al. |
| 5,583,349 A | 12/1996 | Norman et al. |
| 5,583,350 A | 12/1996 | Norman et al. |
| 5,586,291 A | 12/1996 | Lasker |
| 5,594,563 A | 1/1997 | Larson |
| 5,604,137 A | 2/1997 | Yamazaki et al. |
| 5,617,991 A | 4/1997 | Pramanick et al. |
| 5,627,106 A | 5/1997 | Hsu |
| 5,656,548 A | 8/1997 | Zavracky et al. |
| 5,656,553 A | 8/1997 | Leas et al. |
| 5,659,194 A | 8/1997 | Iwamatsu |
| 5,670,411 A | 9/1997 | Yonehara |
| 5,681,756 A | 10/1997 | Norman et al. |
| 5,695,557 A | 12/1997 | Yamagata et al. |
| 5,701,027 A | 12/1997 | Gordon et al. |
| 5,707,745 A | 1/1998 | Forrest et al. |
| 5,714,395 A | 2/1998 | Bruel |
| 5,721,160 A | 2/1998 | Forrest et al. |
| 5,737,748 A | 4/1998 | Shigeeda |
| 5,739,552 A | 4/1998 | Kimura et al. |
| 5,744,979 A | 4/1998 | Goetting |
| 5,748,161 A | 5/1998 | Lebby et al. |
| 5,757,026 A | 5/1998 | Forrest et al. |
| 5,770,483 A | 6/1998 | Kadosh |
| 5,770,881 A | 6/1998 | Pelella et al. |
| 5,781,031 A | 7/1998 | Bertin et al. |
| 5,817,574 A | 10/1998 | Gardner |
| 5,829,026 A | 10/1998 | Leung et al. |
| 5,835,396 A | 11/1998 | Zhang |
| 5,854,123 A | 12/1998 | Sato et al. |
| 5,861,929 A | 1/1999 | Spitzer |
| 5,877,034 A | 3/1999 | Ramm |
| 5,877,070 A | 3/1999 | Goesele et al. |
| 5,882,987 A | 3/1999 | Srikrishnan |
| 5,883,525 A | 3/1999 | Tavana et al. |
| 5,889,903 A | 3/1999 | Rao |
| 5,893,721 A | 4/1999 | Huang et al. |
| 5,915,167 A | 6/1999 | Leedy |
| 5,920,788 A | 7/1999 | Reinberg |
| 5,937,312 A | 8/1999 | Iyer et al. |
| 5,943,574 A | 8/1999 | Tehrani et al. |
| 5,952,680 A | 9/1999 | Strite |
| 5,952,681 A | 9/1999 | Chen |
| 5,965,875 A | 10/1999 | Merrill |
| 5,977,579 A | 11/1999 | Noble |
| 5,977,961 A | 11/1999 | Rindal |
| 5,980,633 A | 11/1999 | Yamagata et al. |
| 5,985,742 A | 11/1999 | Henley et al. |
| 5,994,746 A | 11/1999 | Reisinger |
| 5,998,808 A | 12/1999 | Matsushita |
| 6,001,693 A | 12/1999 | Yeouchung et al. |
| 6,009,496 A | 12/1999 | Tsai |
| 6,020,252 A | 2/2000 | Aspar et al. |
| 6,020,263 A | 2/2000 | Shih et al. |
| 6,027,958 A | 2/2000 | Vu et al. |
| 6,030,700 A | 2/2000 | Forrest et al. |
| 6,052,498 A | 4/2000 | Paniccia |
| 6,054,370 A | 4/2000 | Doyle |
| 6,057,212 A | 5/2000 | Chan et al. |
| 6,071,795 A | 6/2000 | Cheung et al. |
| 6,075,268 A | 6/2000 | Gardner et al. |
| 6,103,597 A | 8/2000 | Aspar et al. |
| 6,111,260 A | 8/2000 | Dawson et al. |
| 6,125,217 A | 9/2000 | Paniccia et al. |
| 6,153,495 A | 11/2000 | Kub et al. |
| 6,191,007 B1 | 2/2001 | Matsui et al. |
| 6,200,878 B1 | 3/2001 | Yamagata |
| 6,222,203 B1 | 4/2001 | Ishibashi et al. |
| 6,226,197 B1 | 5/2001 | Nishimura |
| 6,229,161 B1 | 5/2001 | Nemati et al. |
| 6,242,324 B1 | 6/2001 | Kub et al. |
| 6,242,778 B1 | 6/2001 | Marmillion et al. |
| 6,252,465 B1 | 6/2001 | Katoh |
| 6,259,623 B1 | 7/2001 | Takahashi |
| 6,261,935 B1 | 7/2001 | See et al. |
| 6,264,805 B1 | 7/2001 | Forrest et al. |
| 6,281,102 B1 | 8/2001 | Cao et al. |
| 6,294,018 B1 | 9/2001 | Hamm et al. |
| 6,306,705 B1 | 10/2001 | Parekh et al. |
| 6,321,134 B1 | 11/2001 | Henley et al. |
| 6,322,903 B1 | 11/2001 | Siniaguine et al. |
| 6,331,468 B1 | 12/2001 | Aronowitz et al. |
| 6,331,790 B1 | 12/2001 | Or-Bach et al. |
| 6,331,943 B1 | 12/2001 | Naji et al. |
| 6,353,492 B2 | 3/2002 | McClelland et al. |
| 6,355,501 B1 | 3/2002 | Fung et al. |
| 6,355,976 B1 | 3/2002 | Faris |
| 6,358,631 B1 | 3/2002 | Forrest et al. |
| 6,365,270 B2 | 4/2002 | Forrest et al. |
| 6,376,337 B1 | 4/2002 | Wang et al. |
| 6,377,504 B1 | 4/2002 | Hilbert |
| 6,380,046 B1 | 4/2002 | Yamazaki |
| 6,392,253 B1 | 5/2002 | Saxena |
| 6,404,043 B1 | 6/2002 | Isaak |
| 6,417,108 B1 | 7/2002 | Akino et al. |
| 6,420,215 B1 | 7/2002 | Knall et al. |
| 6,423,614 B1 | 7/2002 | Doyle |
| 6,429,481 B1 | 8/2002 | Mo et al. |
| 6,429,484 B1 | 8/2002 | Yu |
| 6,430,734 B1 | 8/2002 | Zahar |
| 6,448,615 B1 | 9/2002 | Forbes |
| 6,475,869 B1 | 11/2002 | Yu |
| 6,476,493 B2 | 11/2002 | Or-Bach et al. |
| 6,479,821 B1 | 11/2002 | Hawryluk et al. |

(56) References Cited

U.S. PATENT DOCUMENTS

| | | |
|---|---|---|
| 6,483,707 B1 | 11/2002 | Freuler et al. |
| 6,507,115 B2 | 1/2003 | Hofstee |
| 6,515,334 B2 | 2/2003 | Yamazaki et al. |
| 6,515,511 B2 | 2/2003 | Sugibayashi et al. |
| 6,526,559 B2 | 2/2003 | Schiefele et al. |
| 6,528,391 B1 | 3/2003 | Henley et al. |
| 6,534,352 B1 | 3/2003 | Kim |
| 6,534,382 B1 | 3/2003 | Sakaguchi et al. |
| 6,544,837 B1 | 4/2003 | Divakauni et al. |
| 6,545,314 B2 | 4/2003 | Forbes et al. |
| 6,555,901 B1 | 4/2003 | Yoshihara et al. |
| 6,563,139 B2 | 5/2003 | Hen |
| 6,580,124 B1 | 6/2003 | Cleeves |
| 6,580,289 B2 | 6/2003 | Cox |
| 6,600,173 B2 | 7/2003 | Tiwari |
| 6,617,694 B2 | 9/2003 | Kodaira et al. |
| 6,620,659 B2 | 9/2003 | Emmma et al. |
| 6,624,046 B1 | 9/2003 | Zavracky et al. |
| 6,627,518 B1 | 9/2003 | Inoue et al. |
| 6,627,985 B2 | 9/2003 | Huppenthal et al. |
| 6,630,713 B2 | 10/2003 | Geusic |
| 6,635,552 B1 | 10/2003 | Gonzalez |
| 6,635,588 B1 | 10/2003 | Hawryluk et al. |
| 6,638,834 B2 | 10/2003 | Gonzalez |
| 6,642,744 B2 | 11/2003 | Or-Bach et al. |
| 6,653,209 B1 | 11/2003 | Yamagata |
| 6,653,712 B2 | 11/2003 | Knall et al. |
| 6,661,085 B2 | 12/2003 | Kellar et al. |
| 6,677,204 B2 | 1/2004 | Cleeves et al. |
| 6,686,253 B2 | 2/2004 | Or-Bach |
| 6,689,660 B1 | 2/2004 | Noble |
| 6,701,071 B2 | 3/2004 | Wada et al. |
| 6,703,328 B2 | 3/2004 | Tanaka et al. |
| 6,756,633 B2 | 6/2004 | Wang et al. |
| 6,756,811 B2 | 6/2004 | Or-Bach |
| 6,759,282 B2 | 7/2004 | Campbell et al. |
| 6,762,076 B2 | 7/2004 | Kim et al. |
| 6,774,010 B2 | 8/2004 | Chu et al. |
| 6,805,979 B2 | 10/2004 | Ogura et al. |
| 6,806,171 B1 | 10/2004 | Ulyashin et al. |
| 6,809,009 B2 | 10/2004 | Aspar et al. |
| 6,815,781 B2 | 11/2004 | Vyvoda et al. |
| 6,819,136 B2 | 11/2004 | Or-Bach |
| 6,821,826 B1 | 11/2004 | Chan et al. |
| 6,841,813 B2 | 1/2005 | Walker et al. |
| 6,844,243 B1 | 1/2005 | Gonzalez |
| 6,864,534 B2 | 3/2005 | Ipposhi et al. |
| 6,875,671 B2 | 4/2005 | Faris |
| 6,882,572 B2 | 4/2005 | Wang et al. |
| 6,888,375 B2 | 5/2005 | Feng et al. |
| 6,917,219 B2 | 7/2005 | New |
| 6,927,431 B2 | 8/2005 | Gonzalez |
| 6,930,511 B2 | 8/2005 | Or-Bach |
| 6,943,067 B2 | 9/2005 | Greenlaw |
| 6,943,407 B2 | 9/2005 | Ouyang et al. |
| 6,949,421 B1 | 9/2005 | Padmanabhan et al. |
| 6,953,956 B2 | 10/2005 | Or-Bach et al. |
| 6,967,149 B2 | 11/2005 | Meyer et al. |
| 6,985,012 B2 | 1/2006 | Or-Bach |
| 6,989,687 B2 | 1/2006 | Or-Bach |
| 6,995,430 B2 | 2/2006 | Langdo et al. |
| 6,995,456 B2 | 2/2006 | Nowak |
| 7,015,719 B1 | 3/2006 | Feng et al. |
| 7,016,569 B2 | 3/2006 | Mule et al. |
| 7,018,875 B2 | 3/2006 | Madurawe |
| 7,019,557 B2 | 3/2006 | Madurawe |
| 7,043,106 B2 | 5/2006 | West et al. |
| 7,052,941 B2 | 5/2006 | Lee |
| 7,064,579 B2 | 6/2006 | Madurawe |
| 7,067,396 B2 | 6/2006 | Aspar et al. |
| 7,067,909 B2 | 6/2006 | Reif et al. |
| 7,068,070 B2 | 6/2006 | Or-Bach |
| 7,068,072 B2 | 6/2006 | New et al. |
| 7,078,739 B1 | 7/2006 | Nemati et al. |
| 7,094,667 B1 | 8/2006 | Bower |
| 7,098,691 B2 | 8/2006 | Or-Bach et al. |
| 7,105,390 B2 | 9/2006 | Brask et al. |
| 7,105,871 B2 | 9/2006 | Or-Bach et al. |
| 7,109,092 B2 | 9/2006 | Tong |
| 7,110,629 B2 | 9/2006 | Bjorkman et al. |
| 7,111,149 B2 | 9/2006 | Eilert |
| 7,112,815 B2 | 9/2006 | Prall |
| 7,115,945 B2 | 10/2006 | Lee et al. |
| 7,115,966 B2 | 10/2006 | Ido et al. |
| 7,141,853 B2 | 11/2006 | Campbell et al. |
| 7,148,119 B1 | 12/2006 | Sakaguchi et al. |
| 7,157,787 B2 | 1/2007 | Kim et al. |
| 7,157,937 B2 | 1/2007 | Apostol et al. |
| 7,166,520 B1 | 1/2007 | Henley |
| 7,170,807 B2 | 1/2007 | Fazan et al. |
| 7,173,369 B2 | 2/2007 | Forrest et al. |
| 7,180,091 B2 | 2/2007 | Yamazaki et al. |
| 7,180,379 B1 | 2/2007 | Hopper et al. |
| 7,183,611 B2 | 2/2007 | Bhattacharyya |
| 7,189,489 B2 | 3/2007 | Kunimoto et al. |
| 7,205,204 B2 | 4/2007 | Ogawa et al. |
| 7,209,384 B1 | 4/2007 | Kim |
| 7,217,636 B1 | 5/2007 | Atanackovic |
| 7,223,612 B2 | 5/2007 | Sarma |
| 7,242,012 B2 | 7/2007 | Leedy |
| 7,245,002 B2 | 7/2007 | Akino et al. |
| 7,256,104 B2 | 8/2007 | Ito et al. |
| 7,259,091 B2 | 8/2007 | Schuehrer et al. |
| 7,265,421 B2 | 9/2007 | Madurawe |
| 7,271,420 B2 | 9/2007 | Cao |
| 7,274,207 B2 | 9/2007 | Sugawara et al. |
| 7,282,951 B2 | 10/2007 | Huppenthal et al. |
| 7,284,226 B1 | 10/2007 | Kondapalli |
| 7,296,201 B2 | 11/2007 | Abramovici |
| 7,304,355 B2 | 12/2007 | Zhang |
| 7,312,109 B2 | 12/2007 | Madurawe |
| 7,312,487 B2 | 12/2007 | Alam et al. |
| 7,314,788 B2 | 1/2008 | Shaw |
| 7,335,573 B2 | 2/2008 | Takayama et al. |
| 7,337,425 B2 | 2/2008 | Kirk |
| 7,338,884 B2 | 3/2008 | Shimoto et al. |
| 7,342,415 B2 | 3/2008 | Teig et al. |
| 7,351,644 B2 | 4/2008 | Henley |
| 7,358,601 B1 | 4/2008 | Plants et al. |
| 7,362,133 B2 | 4/2008 | Madurawe |
| 7,369,435 B2 | 5/2008 | Forbes |
| 7,371,660 B2 | 5/2008 | Henley et al. |
| 7,378,702 B2 | 5/2008 | Lee |
| 7,381,989 B2 | 6/2008 | Kim |
| 7,385,283 B2 | 6/2008 | Wu |
| 7,393,722 B1 | 7/2008 | Issaq et al. |
| 7,402,483 B2 | 7/2008 | Yu et al. |
| 7,402,897 B2 | 7/2008 | Leedy |
| 7,419,844 B2 | 9/2008 | Lee et al. |
| 7,432,185 B2 | 10/2008 | Kim |
| 7,436,027 B2 | 10/2008 | Ogawa et al. |
| 7,439,773 B2 | 10/2008 | Or-Bach et al. |
| 7,446,563 B2 | 11/2008 | Madurawe |
| 7,459,752 B2 | 12/2008 | Doris et al. |
| 7,459,763 B1 | 12/2008 | Issaq et al. |
| 7,459,772 B2 | 12/2008 | Speers |
| 7,463,062 B2 | 12/2008 | Or-Bach et al. |
| 7,463,502 B2 | 12/2008 | Stipe |
| 7,470,142 B2 | 12/2008 | Lee |
| 7,470,598 B2 | 12/2008 | Lee |
| 7,476,939 B2 | 1/2009 | Okhonin et al. |
| 7,477,540 B2 | 1/2009 | Okhonin et al. |
| 7,485,968 B2 | 2/2009 | Enquist et al. |
| 7,486,563 B2 | 2/2009 | Waller et al. |
| 7,488,980 B2 | 2/2009 | Takafuji et al. |
| 7,492,632 B2 | 2/2009 | Carman |
| 7,495,473 B2 | 2/2009 | McCollum et al. |
| 7,498,675 B2 | 3/2009 | Farnworth et al. |
| 7,499,352 B2 | 3/2009 | Singh |
| 7,499,358 B2 | 3/2009 | Bauser |
| 7,508,034 B2 | 3/2009 | Takafuji et al. |
| 7,514,748 B2 | 4/2009 | Fazan et al. |
| 7,521,806 B2 | 4/2009 | Trezza |
| 7,525,186 B2 | 4/2009 | Kim et al. |

(56) References Cited

U.S. PATENT DOCUMENTS

| | | |
|---|---|---|
| 7,535,089 B2 | 5/2009 | Fitzgerald |
| 7,541,616 B2 | 6/2009 | Fazan et al. |
| 7,547,589 B2 | 6/2009 | Iriguchi |
| 7,553,745 B2 | 6/2009 | Lim |
| 7,557,367 B2 | 7/2009 | Rogers et al. |
| 7,558,141 B2 | 7/2009 | Katsumata et al. |
| 7,563,659 B2 | 7/2009 | Kwon et al. |
| 7,566,855 B2 | 7/2009 | Olsen et al. |
| 7,566,974 B2 | 7/2009 | Konevecki |
| 7,586,778 B2 | 9/2009 | Ho et al. |
| 7,589,375 B2 | 9/2009 | Jang et al. |
| 7,608,848 B2 | 10/2009 | Ho et al. |
| 7,612,411 B2 | 11/2009 | Walker |
| 7,615,462 B2 | 11/2009 | Kim et al. |
| 7,622,367 B1 | 11/2009 | Nuzzo et al. |
| 7,632,738 B2 | 12/2009 | Lee |
| 7,633,162 B2 | 12/2009 | Lee |
| 7,666,723 B2 | 2/2010 | Frank et al. |
| 7,670,912 B2 | 3/2010 | Yeo |
| 7,671,371 B2 | 3/2010 | Lee |
| 7,671,460 B2 | 3/2010 | Lauxtermann et al. |
| 7,674,687 B2 | 3/2010 | Henley |
| 7,687,372 B2 | 3/2010 | Jain |
| 7,687,872 B2 | 3/2010 | Cazaux |
| 7,688,619 B2 | 3/2010 | Lung et al. |
| 7,692,202 B2 | 4/2010 | Bensch |
| 7,692,448 B2 | 4/2010 | Solomon |
| 7,692,944 B2 | 4/2010 | Bernstein et al. |
| 7,697,316 B2 | 4/2010 | Lai et al. |
| 7,709,932 B2 | 5/2010 | Nemoto et al. |
| 7,718,508 B2 | 5/2010 | Lee |
| 7,719,876 B2 | 5/2010 | Chevallier |
| 7,723,207 B2 | 5/2010 | Alam et al. |
| 7,728,326 B2 | 6/2010 | Yamazaki et al. |
| 7,732,301 B1 | 6/2010 | Pinnington et al. |
| 7,741,673 B2 | 6/2010 | Tak et al. |
| 7,742,331 B2 | 6/2010 | Watanabe |
| 7,745,250 B2 | 6/2010 | Han |
| 7,749,884 B2 | 7/2010 | Mathew et al. |
| 7,750,669 B2 | 7/2010 | Spangaro |
| 7,755,622 B2 | 7/2010 | Yvon |
| 7,759,043 B2 | 7/2010 | Tanabe et al. |
| 7,768,115 B2 | 8/2010 | Lee et al. |
| 7,772,039 B2 | 8/2010 | Kerber |
| 7,772,096 B2 | 8/2010 | DeSouza et al. |
| 7,774,735 B1 | 8/2010 | Sood |
| 7,776,715 B2 | 8/2010 | Wells et al. |
| 7,777,330 B2 | 8/2010 | Pelley et al. |
| 7,786,460 B2 | 8/2010 | Lung et al. |
| 7,786,535 B2 | 8/2010 | Abou-Khalil et al. |
| 7,790,524 B2 | 9/2010 | Abadeer et al. |
| 7,795,619 B2 | 9/2010 | Hara |
| 7,799,675 B2 | 9/2010 | Lee |
| 7,800,099 B2 | 9/2010 | Yamazaki et al. |
| 7,800,148 B2 | 9/2010 | Lee et al. |
| 7,800,163 B2 | 9/2010 | Izumi et al. |
| 7,800,199 B2 | 9/2010 | Oh et al. |
| 7,816,721 B2 | 10/2010 | Yamazaki |
| 7,843,718 B2 | 11/2010 | Koh et al. |
| 7,846,814 B2 | 12/2010 | Lee |
| 7,863,095 B2 | 1/2011 | Sasaki et al. |
| 7,864,568 B2 | 1/2011 | Fujisaki et al. |
| 7,867,822 B2 | 1/2011 | Lee |
| 7,888,764 B2 | 2/2011 | Lee |
| 7,910,432 B2 | 3/2011 | Tanaka et al. |
| 7,915,164 B2 | 3/2011 | Konevecki et al. |
| 7,919,845 B2 | 4/2011 | Karp |
| 7,965,102 B1 | 6/2011 | Bauer et al. |
| 7,968,965 B2 | 6/2011 | Kim |
| 7,969,193 B1 | 6/2011 | Wu et al. |
| 7,973,314 B2 | 7/2011 | Yang |
| 7,982,250 B2 | 7/2011 | Yamazaki et al. |
| 7,983,065 B2 | 7/2011 | Samachisa |
| 8,008,732 B2 | 8/2011 | Kiyotoshi |
| 8,013,399 B2 | 9/2011 | Thomas et al. |
| 8,014,166 B2 | 9/2011 | Yazdani |
| 8,014,195 B2 | 9/2011 | Okhonin et al. |
| 8,022,493 B2 | 9/2011 | Bang |
| 8,030,780 B2 | 10/2011 | Kirby et al. |
| 8,031,544 B2 | 10/2011 | Kim et al. |
| 8,032,857 B2 | 10/2011 | McIlrath |
| 8,044,448 B2 | 10/2011 | Kamigaichi et al. |
| 8,044,464 B2 | 10/2011 | Yamazaki et al. |
| 8,068,364 B2 | 11/2011 | Maejima |
| 8,106,520 B2 | 1/2012 | Keeth et al. |
| 8,107,276 B2 | 1/2012 | Breitwisch et al. |
| 8,129,256 B2 | 3/2012 | Farooq et al. |
| 8,129,258 B2 | 3/2012 | Hosier et al. |
| 8,130,547 B2 | 3/2012 | Widjaja et al. |
| 8,136,071 B2 | 3/2012 | Solomon |
| 8,138,502 B2 | 3/2012 | Nakamura et al. |
| 8,153,520 B1 | 4/2012 | Chandrashekar |
| 8,158,515 B2 | 4/2012 | Farooq et al. |
| 8,178,919 B2 | 5/2012 | Fujiwara et al. |
| 8,183,630 B2 | 5/2012 | Batude et al. |
| 8,184,463 B2 | 5/2012 | Saen et al. |
| 8,185,685 B2 | 5/2012 | Selinger |
| 8,203,187 B2 | 6/2012 | Lung et al. |
| 8,208,279 B2 | 6/2012 | Lue |
| 8,209,649 B2 | 6/2012 | McIlrath |
| 8,228,684 B2 | 7/2012 | Losavio et al. |
| 8,266,560 B2 | 8/2012 | McIlrath |
| 8,264,065 B2 | 9/2012 | Su et al. |
| 8,288,816 B2 | 10/2012 | Komori et al. |
| 8,294,199 B2 | 10/2012 | Yahashi et al. |
| 8,324,680 B2 | 12/2012 | Izumi et al. |
| 8,338,882 B2 | 12/2012 | Tanaka et al. |
| 8,343,851 B2 | 1/2013 | Kim et al. |
| 8,354,308 B2 | 1/2013 | Kang et al. |
| 8,355,273 B2 | 1/2013 | Liu |
| 8,362,482 B2 * | 1/2013 | Or-Bach ............ H01L 27/0688 |
| | | 257/48 |
| 8,374,033 B2 | 2/2013 | Kito et al. |
| 8,426,294 B2 | 4/2013 | Lung et al. |
| 8,432,719 B2 | 4/2013 | Lue |
| 8,432,751 B2 | 4/2013 | Hafez |
| 8,455,941 B2 | 6/2013 | Ishihara et al. |
| 8,470,689 B2 | 6/2013 | Desplobain et al. |
| 8,497,512 B2 | 7/2013 | Nakamura et al. |
| 8,501,564 B2 | 8/2013 | Suzawa |
| 8,507,972 B2 | 8/2013 | Oota et al. |
| 8,508,994 B2 | 8/2013 | Okhonin |
| 8,513,725 B2 | 8/2013 | Sakuma et al. |
| 8,514,623 B2 | 8/2013 | Widjaja et al. |
| 8,516,408 B2 | 8/2013 | Dell |
| 8,566,762 B2 | 8/2013 | Morimoto et al. |
| 8,525,342 B2 | 10/2013 | Chandrasekaran |
| 8,546,956 B2 | 10/2013 | Nguyen |
| 8,603,888 B2 | 12/2013 | Liu |
| 8,611,388 B2 | 12/2013 | Krasulick et al. |
| 8,619,490 B2 | 12/2013 | Yu |
| 8,630,326 B2 | 1/2014 | Krasulick et al. |
| 8,643,162 B2 | 2/2014 | Madurawe |
| 8,650,516 B2 | 2/2014 | McIlrath |
| 8,654,584 B2 | 2/2014 | Kim et al. |
| 8,679,861 B2 | 3/2014 | Bose |
| 8,736,068 B2 | 5/2014 | Bartley et al. |
| 8,773,562 B1 | 7/2014 | Fan |
| 8,775,998 B2 | 7/2014 | Morimoto |
| 8,824,183 B2 | 9/2014 | Samachisa et al. |
| 8,841,777 B2 | 9/2014 | Farooq |
| 8,853,785 B2 | 10/2014 | Augendre |
| 8,896,054 B2 | 11/2014 | Sakuma et al. |
| 8,928,119 B2 | 1/2015 | Leedy |
| 8,971,114 B2 | 3/2015 | Kang |
| 9,105,689 B1 | 8/2015 | Fanelli |
| 9,172,008 B2 | 10/2015 | Hwang |
| 9,227,456 B2 | 1/2016 | Chien |
| 9,230,973 B2 | 1/2016 | Pachamuthu et al. |
| 9,269,608 B2 | 2/2016 | Fanelli |
| 9,334,582 B2 | 5/2016 | See |
| 9,391,090 B2 | 7/2016 | Manorotkul et al. |
| 9,472,568 B2 | 10/2016 | Shin et al. |
| 9,564,450 B2 | 2/2017 | Sakuma et al. |

(56) References Cited

U.S. PATENT DOCUMENTS

| | | |
|---|---|---|
| 9,570,683 B1 | 2/2017 | Jo |
| 9,589,982 B1 | 3/2017 | Cheng et al. |
| 9,595,530 B1 | 3/2017 | Zhou |
| 9,627,287 B2 | 4/2017 | Engelhardt et al. |
| 9,673,257 B1 | 6/2017 | Takaki |
| 9,997,530 B2 | 6/2018 | Yon et al. |
| 10,199,354 B2 | 2/2019 | Modi et al. |
| 2001/0000005 A1 | 3/2001 | Forrest et al. |
| 2001/0014391 A1 | 8/2001 | Forrest et al. |
| 2001/0028059 A1 | 10/2001 | Emma et al. |
| 2002/0024140 A1 | 2/2002 | Nakajima et al. |
| 2002/0025604 A1 | 2/2002 | Tiwari |
| 2002/0074668 A1 | 6/2002 | Hofstee et al. |
| 2002/0081823 A1 | 6/2002 | Cheung et al. |
| 2002/0090758 A1 | 7/2002 | Henley et al. |
| 2002/0096681 A1 | 7/2002 | Yamazaki et al. |
| 2002/0113289 A1 | 8/2002 | Cordes et al. |
| 2002/0132465 A1 | 9/2002 | Leedy |
| 2002/0140091 A1 | 10/2002 | Callahan |
| 2002/0141233 A1 | 10/2002 | Hosotani et al. |
| 2002/0153243 A1 | 10/2002 | Forrest et al. |
| 2002/0153569 A1 | 10/2002 | Katayama |
| 2002/0175401 A1 | 11/2002 | Huang et al. |
| 2002/0180069 A1 | 12/2002 | Houston |
| 2002/0190232 A1 | 12/2002 | Chason |
| 2002/0199110 A1 | 12/2002 | Kean |
| 2003/0015713 A1 | 1/2003 | Yoo |
| 2003/0032262 A1 | 2/2003 | Dennison et al. |
| 2003/0059999 A1 | 3/2003 | Gonzalez |
| 2003/0060034 A1 | 3/2003 | Beyne et al. |
| 2003/0061555 A1 | 3/2003 | Kamei |
| 2003/0067043 A1 | 4/2003 | Zhang |
| 2003/0076706 A1 | 4/2003 | Andoh |
| 2003/0102079 A1 | 6/2003 | Kalvesten et al. |
| 2003/0107117 A1 | 6/2003 | Antonell et al. |
| 2003/0113963 A1 | 6/2003 | Wurzer |
| 2003/0119279 A1 | 6/2003 | Enquist |
| 2003/0139011 A1 | 7/2003 | Cleeves et al. |
| 2003/0153163 A1 | 8/2003 | Letertre |
| 2003/0157748 A1 | 8/2003 | Kim et al. |
| 2003/0160888 A1 | 8/2003 | Yoshikawa |
| 2003/0173631 A1 | 9/2003 | Murakami |
| 2003/0206036 A1 | 11/2003 | Or-Bach |
| 2003/0213967 A1 | 11/2003 | Forrest et al. |
| 2003/0224582 A1 | 12/2003 | Shimoda et al. |
| 2003/0224596 A1 | 12/2003 | Marxsen et al. |
| 2004/0007376 A1 | 1/2004 | Urdahl et al. |
| 2004/0014299 A1 | 1/2004 | Moriceau et al. |
| 2004/0033676 A1 | 2/2004 | Coronel et al. |
| 2004/0036126 A1 | 2/2004 | Chau et al. |
| 2004/0047539 A1 | 3/2004 | Okubora et al. |
| 2004/0061176 A1 | 4/2004 | Takafuji et al. |
| 2004/0113207 A1 | 6/2004 | Hsu et al. |
| 2004/0143797 A1 | 7/2004 | Nguyen |
| 2004/0150068 A1 | 8/2004 | Leedy |
| 2004/0150070 A1 | 8/2004 | Okada |
| 2004/0152272 A1 | 8/2004 | Fladre et al. |
| 2004/0155301 A1 | 8/2004 | Zhang |
| 2004/0156172 A1 | 8/2004 | Lin et al. |
| 2004/0156233 A1 | 8/2004 | Bhattacharyya |
| 2004/0164425 A1 | 8/2004 | Urakawa |
| 2004/0166649 A1 | 8/2004 | Bressot et al. |
| 2004/0174732 A1 | 9/2004 | Morimoto |
| 2004/0175902 A1 | 9/2004 | Rayssac et al. |
| 2004/0178819 A1 | 9/2004 | New |
| 2004/0195572 A1 | 10/2004 | Kato et al. |
| 2004/0219765 A1 | 11/2004 | Reif et al. |
| 2004/0229444 A1 | 11/2004 | Couillard |
| 2004/0259312 A1 | 12/2004 | Schlosser et al. |
| 2004/0262635 A1 | 12/2004 | Lee |
| 2004/0262772 A1 | 12/2004 | Ramanathan et al. |
| 2005/0003592 A1 | 1/2005 | Jones |
| 2005/0010725 A1 | 1/2005 | Eilert |
| 2005/0023656 A1 | 2/2005 | Leedy |
| 2005/0045919 A1 | 3/2005 | Kaeriyama et al. |
| 2005/0067620 A1 | 3/2005 | Chan et al. |
| 2005/0067625 A1 | 3/2005 | Hata |
| 2005/0073060 A1 | 4/2005 | Datta et al. |
| 2005/0082526 A1 | 4/2005 | Bedell et al. |
| 2005/0098822 A1 | 5/2005 | Mathew |
| 2005/0110041 A1 | 5/2005 | Boutros et al. |
| 2005/0121676 A1 | 6/2005 | Fried et al. |
| 2005/0121789 A1 | 6/2005 | Madurawe |
| 2005/0130351 A1 | 6/2005 | Leedy |
| 2005/0130429 A1 | 6/2005 | Rayssac et al. |
| 2005/0148137 A1 | 7/2005 | Brask et al. |
| 2005/0176174 A1 | 8/2005 | Leedy |
| 2005/0218521 A1 | 10/2005 | Lee |
| 2005/0225237 A1 | 10/2005 | Winters |
| 2005/0266659 A1 | 12/2005 | Ghyselen et al. |
| 2005/0273749 A1 | 12/2005 | Kirk |
| 2005/0280061 A1 | 12/2005 | Lee |
| 2005/0280090 A1 | 12/2005 | Anderson et al. |
| 2005/0280154 A1 | 12/2005 | Lee |
| 2005/0280155 A1 | 12/2005 | Lee |
| 2005/0280156 A1 | 12/2005 | Lee |
| 2005/0282019 A1 | 12/2005 | Fukushima et al. |
| 2006/0014331 A1 | 1/2006 | Tang et al. |
| 2006/0024923 A1 | 2/2006 | Sarma et al. |
| 2006/0033110 A1 | 2/2006 | Alam et al. |
| 2006/0033124 A1 | 2/2006 | Or-Bach et al. |
| 2006/0043367 A1 | 2/2006 | Chang et al. |
| 2006/0049449 A1 | 3/2006 | Iino |
| 2006/0065953 A1 | 3/2006 | Kim et al. |
| 2006/0067122 A1 | 3/2006 | Verhoeven |
| 2006/0071322 A1 | 4/2006 | Kitamura |
| 2006/0071332 A1 | 4/2006 | Speers |
| 2006/0083280 A1 | 4/2006 | Tauzin et al. |
| 2006/0108613 A1 | 5/2006 | Song |
| 2006/0108627 A1 | 5/2006 | Choi et al. |
| 2006/0113522 A1 | 6/2006 | Lee et al. |
| 2006/0118935 A1 | 6/2006 | Kamiyama et al. |
| 2006/0121690 A1 | 6/2006 | Pogge et al. |
| 2006/0150137 A1 | 7/2006 | Madurawe |
| 2006/0158511 A1 | 7/2006 | Harrold |
| 2006/0170046 A1 | 8/2006 | Hara |
| 2006/0179417 A1 | 8/2006 | Madurawe |
| 2006/0181202 A1 | 8/2006 | Liao et al. |
| 2006/0189095 A1 | 8/2006 | Ghyselen et al. |
| 2006/0194401 A1 | 8/2006 | Hu et al. |
| 2006/0195729 A1 | 8/2006 | Huppenthal et al. |
| 2006/0207087 A1 | 9/2006 | Jafri et al. |
| 2006/0224814 A1 | 10/2006 | Kim et al. |
| 2006/0237777 A1 | 10/2006 | Choi |
| 2006/0249859 A1 | 11/2006 | Eiles et al. |
| 2006/0275962 A1 | 12/2006 | Lee |
| 2007/0004150 A1 | 1/2007 | Huang |
| 2007/0014508 A1 | 1/2007 | Chen et al. |
| 2007/0035329 A1 | 2/2007 | Madurawe |
| 2007/0063259 A1 | 3/2007 | Derderian et al. |
| 2007/0072391 A1 | 3/2007 | Pocas et al. |
| 2007/0076509 A1 | 4/2007 | Zhang |
| 2007/0077694 A1 | 4/2007 | Lee |
| 2007/0077743 A1 | 4/2007 | Rao et al. |
| 2007/0090416 A1 | 4/2007 | Doyle et al. |
| 2007/0102737 A1 | 5/2007 | Kashiwabara et al. |
| 2007/0103191 A1 | 5/2007 | Sugawara et al. |
| 2007/0108523 A1 | 5/2007 | Ogawa et al. |
| 2007/0109831 A1 | 5/2007 | RaghuRam |
| 2007/0111386 A1 | 5/2007 | Kim et al. |
| 2007/0111406 A1 | 5/2007 | Joshi et al. |
| 2007/0132049 A1 | 6/2007 | Stipe |
| 2007/0132369 A1 | 6/2007 | Forrest et al. |
| 2007/0135013 A1 | 6/2007 | Faris |
| 2007/0141781 A1 | 6/2007 | Park |
| 2007/0158659 A1 | 7/2007 | Bensce |
| 2007/0158831 A1 | 7/2007 | Cha et al. |
| 2007/0176214 A1 | 8/2007 | Kwon et al. |
| 2007/0187775 A1 | 8/2007 | Okhonin et al. |
| 2007/0190746 A1 | 8/2007 | Ito et al. |
| 2007/0194453 A1 | 8/2007 | Chakraborty et al. |
| 2007/0206408 A1 | 9/2007 | Schwerin |
| 2007/0210336 A1 | 9/2007 | Madurawe |
| 2007/0211535 A1 | 9/2007 | Kim |

(56) References Cited

U.S. PATENT DOCUMENTS

| | | |
|---|---|---|
| 2007/0215903 A1 | 9/2007 | Sakamoto et al. |
| 2007/0218622 A1 | 9/2007 | Lee et al. |
| 2007/0228383 A1 | 10/2007 | Bernstein et al. |
| 2007/0252201 A1 | 11/2007 | Kito et al. |
| 2007/0252203 A1 | 11/2007 | Zhu et al. |
| 2007/0262457 A1 | 11/2007 | Lin |
| 2007/0275520 A1 | 11/2007 | Suzuki |
| 2007/0281439 A1 | 12/2007 | Bedell et al. |
| 2007/0283298 A1 | 12/2007 | Bernstein et al. |
| 2007/0287224 A1 | 12/2007 | Alam et al. |
| 2007/0296073 A1 | 12/2007 | Wu |
| 2007/0297232 A1 | 12/2007 | Iwata |
| 2008/0001204 A1 | 1/2008 | Lee |
| 2008/0003818 A1 | 1/2008 | Seidel et al. |
| 2008/0030228 A1 | 2/2008 | Amarilio |
| 2008/0032463 A1 | 2/2008 | Lee |
| 2008/0038902 A1 | 2/2008 | Lee |
| 2008/0048239 A1 | 2/2008 | Huo |
| 2008/0048327 A1 | 2/2008 | Lee |
| 2008/0054359 A1 | 3/2008 | Yang et al. |
| 2008/0067573 A1 | 3/2008 | Jang et al. |
| 2008/0070340 A1 | 3/2008 | Borrelli et al. |
| 2008/0072182 A1 | 3/2008 | He et al. |
| 2008/0099780 A1 | 5/2008 | Tran |
| 2008/0099819 A1 | 5/2008 | Kito et al. |
| 2008/0108171 A1 | 5/2008 | Rogers et al. |
| 2008/0123418 A1 | 5/2008 | Widjaja |
| 2008/0124845 A1 | 5/2008 | Yu et al. |
| 2008/0128745 A1 | 6/2008 | Mastro et al. |
| 2008/0128780 A1 | 6/2008 | Nishihara |
| 2008/0135949 A1 | 6/2008 | Lo et al. |
| 2008/0136455 A1 | 6/2008 | Diamant et al. |
| 2008/0142937 A1 | 6/2008 | Chen et al. |
| 2008/0142959 A1 | 6/2008 | DeMulder et al. |
| 2008/0143379 A1 | 6/2008 | Norman |
| 2008/0150579 A1 | 6/2008 | Madurawe |
| 2008/0160431 A1 | 7/2008 | Scott et al. |
| 2008/0160726 A1 | 7/2008 | Lim et al. |
| 2008/0165521 A1 | 7/2008 | Bernstein et al. |
| 2008/0175032 A1 | 7/2008 | Tanaka et al. |
| 2008/0179678 A1 | 7/2008 | Dyer et al. |
| 2008/0180132 A1 | 7/2008 | Ishikawa |
| 2008/0185648 A1 | 8/2008 | Jeong |
| 2008/0191247 A1 | 8/2008 | Yin et al. |
| 2008/0191312 A1 | 8/2008 | Oh et al. |
| 2008/0194068 A1 | 8/2008 | Temmler et al. |
| 2008/0203452 A1 | 8/2008 | Moon et al. |
| 2008/0213982 A1 | 9/2008 | Park et al. |
| 2008/0220558 A1 | 9/2008 | Zehavi et al. |
| 2008/0220565 A1 | 9/2008 | Hsu et al. |
| 2008/0224260 A1 | 9/2008 | Schmit et al. |
| 2008/0237591 A1 | 10/2008 | Leedy |
| 2008/0239818 A1 | 10/2008 | Mokhlesi |
| 2008/0242028 A1 | 10/2008 | Mokhlesi |
| 2008/0248618 A1 | 10/2008 | Ahn et al. |
| 2008/0251862 A1 | 10/2008 | Fonash et al. |
| 2008/0254561 A2 | 10/2008 | Yoo |
| 2008/0254572 A1 | 10/2008 | Leedy |
| 2008/0254623 A1 | 10/2008 | Chan |
| 2008/0261378 A1 | 10/2008 | Yao et al. |
| 2008/0266960 A1 | 10/2008 | Kuo |
| 2008/0272492 A1 | 11/2008 | Tsang |
| 2008/0277778 A1 | 11/2008 | Furman et al. |
| 2008/0283873 A1 | 11/2008 | Yang |
| 2008/0283875 A1 | 11/2008 | Mukasa et al. |
| 2008/0284611 A1 | 11/2008 | Leedy |
| 2008/0296681 A1 | 12/2008 | Georgakos et al. |
| 2008/0315253 A1 | 12/2008 | Yuan |
| 2008/0315351 A1 | 12/2008 | Kakehata |
| 2009/0001469 A1 | 1/2009 | Yoshida et al. |
| 2009/0001504 A1 | 1/2009 | Takei et al. |
| 2009/0016716 A1 | 1/2009 | Ishida |
| 2009/0026541 A1 | 1/2009 | Chung |
| 2009/0026618 A1 | 1/2009 | Kim |
| 2009/0032899 A1 | 2/2009 | Irie |
| 2009/0032951 A1 | 2/2009 | Andry et al. |
| 2009/0039918 A1 | 2/2009 | Madurawe |
| 2009/0052827 A1 | 2/2009 | Durfee et al. |
| 2009/0055789 A1 | 2/2009 | McIlrath |
| 2009/0057879 A1 | 3/2009 | Garrou et al. |
| 2009/0061572 A1 | 3/2009 | Hareland et al. |
| 2009/0064058 A1 | 3/2009 | McIlrath |
| 2009/0065827 A1 | 3/2009 | Hwang |
| 2009/0066365 A1 | 3/2009 | Solomon |
| 2009/0066366 A1 | 3/2009 | Solomon |
| 2009/0070721 A1 | 3/2009 | Solomon |
| 2009/0070727 A1 | 3/2009 | Solomon |
| 2009/0078970 A1 | 3/2009 | Yamazaki |
| 2009/0079000 A1 | 3/2009 | Yamazaki et al. |
| 2009/0081848 A1 | 3/2009 | Erokhin |
| 2009/0087759 A1 | 4/2009 | Matsumoto et al. |
| 2009/0096009 A1 | 4/2009 | Dong et al. |
| 2009/0096024 A1 | 4/2009 | Shingu et al. |
| 2009/0108318 A1 | 4/2009 | Yoon et al. |
| 2009/0115042 A1 | 5/2009 | Koyanagi |
| 2009/0128189 A1 | 5/2009 | Madurawe et al. |
| 2009/0134397 A1 | 5/2009 | Yokoi et al. |
| 2009/0144669 A1 | 6/2009 | Bose et al. |
| 2009/0144678 A1 | 6/2009 | Bose et al. |
| 2009/0146172 A1 | 6/2009 | Pumyea |
| 2009/0159870 A1 | 6/2009 | Lin et al. |
| 2009/0160482 A1 | 6/2009 | Karp et al. |
| 2009/0161401 A1 | 6/2009 | Bigler et al. |
| 2009/0162993 A1 | 6/2009 | Yui et al. |
| 2009/0166627 A1 | 7/2009 | Han |
| 2009/0174018 A1 | 7/2009 | Dungan |
| 2009/0179268 A1 | 7/2009 | Abou-Khalil et al. |
| 2009/0185407 A1 | 7/2009 | Park |
| 2009/0194152 A1 | 8/2009 | Liu et al. |
| 2009/0194768 A1 | 8/2009 | Leedy |
| 2009/0194829 A1 | 8/2009 | Chung |
| 2009/0194836 A1 | 8/2009 | Kim |
| 2009/0204933 A1 | 8/2009 | Rezgui |
| 2009/0212317 A1 | 8/2009 | Kolodin et al. |
| 2009/0218627 A1 | 9/2009 | Zhu |
| 2009/0221110 A1 | 9/2009 | Lee et al. |
| 2009/0224330 A1 | 9/2009 | Hong |
| 2009/0224364 A1 | 9/2009 | Oh et al. |
| 2009/0230462 A1 | 9/2009 | Tanaka et al. |
| 2009/0234331 A1 | 9/2009 | Langereis et al. |
| 2009/0236749 A1 | 9/2009 | Otemba et al. |
| 2009/0242893 A1 | 10/2009 | Tomiyasu |
| 2009/0242935 A1 | 10/2009 | Fitzgerald |
| 2009/0250686 A1 | 10/2009 | Sato et al. |
| 2009/0262572 A1 | 10/2009 | Krusin-Elbaum |
| 2009/0262583 A1 | 10/2009 | Lue |
| 2009/0263942 A1 | 10/2009 | Ohnuma et al. |
| 2009/0267233 A1 | 10/2009 | Lee |
| 2009/0268983 A1 | 10/2009 | Stone et al. |
| 2009/0272989 A1 | 11/2009 | Shum et al. |
| 2009/0290434 A1 | 11/2009 | Kurjanowicz |
| 2009/0294822 A1 | 12/2009 | Batude et al. |
| 2009/0294836 A1 | 12/2009 | Kiyotoshi |
| 2009/0294861 A1 | 12/2009 | Thomas et al. |
| 2009/0294990 A1 | 12/2009 | Ishino et al. |
| 2009/0302294 A1 | 12/2009 | Kim |
| 2009/0302387 A1 | 12/2009 | Joshi et al. |
| 2009/0302394 A1 | 12/2009 | Fujita |
| 2009/0309152 A1 | 12/2009 | Knoefler et al. |
| 2009/0315095 A1 | 12/2009 | Kim |
| 2009/0317950 A1 | 12/2009 | Okihara |
| 2009/0321830 A1 | 12/2009 | Maly |
| 2009/0321853 A1 | 12/2009 | Cheng |
| 2009/0321948 A1 | 12/2009 | Wang et al. |
| 2009/0325343 A1 | 12/2009 | Lee |
| 2010/0001282 A1 | 1/2010 | Mieno |
| 2010/0013049 A1 | 1/2010 | Tanaka |
| 2010/0025766 A1 | 2/2010 | Nuttinck et al. |
| 2010/0025825 A1 | 2/2010 | DeGraw et al. |
| 2010/0031217 A1 | 2/2010 | Sinha et al. |
| 2010/0032635 A1 | 2/2010 | Schwerin |
| 2010/0038699 A1 | 2/2010 | Katsumata et al. |
| 2010/0038743 A1 | 2/2010 | Lee |
| 2010/0045849 A1 | 2/2010 | Yamasaki |

(56) References Cited

U.S. PATENT DOCUMENTS

| | | |
|---|---|---|
| 2010/0052134 A1 | 3/2010 | Werner et al. |
| 2010/0058580 A1 | 3/2010 | Yazdani |
| 2010/0059796 A1 | 3/2010 | Scheuerlein |
| 2010/0059864 A1 | 3/2010 | Mahler et al. |
| 2010/0078770 A1 | 4/2010 | Purushothaman et al. |
| 2010/0081232 A1 | 4/2010 | Furman et al. |
| 2010/0089627 A1 | 4/2010 | Huang et al. |
| 2010/0090188 A1 | 4/2010 | Fatasuyama |
| 2010/0112753 A1 | 5/2010 | Lee |
| 2010/0112810 A1 | 5/2010 | Lee et al. |
| 2010/0117048 A1 | 5/2010 | Lung et al. |
| 2010/0123202 A1 | 5/2010 | Hofmann |
| 2010/0123480 A1 | 5/2010 | Kitada et al. |
| 2010/0133695 A1 | 6/2010 | Lee |
| 2010/0133704 A1 | 6/2010 | Marimuthu et al. |
| 2010/0137143 A1 | 6/2010 | Rothberg et al. |
| 2010/0139836 A1 | 6/2010 | Horikoshi |
| 2010/0140790 A1 | 6/2010 | Setiadi et al. |
| 2010/0155932 A1 | 6/2010 | Gambino |
| 2010/0157117 A1 | 6/2010 | Wang |
| 2010/0159650 A1 | 6/2010 | Song |
| 2010/0181600 A1 | 7/2010 | Law |
| 2010/0190334 A1 | 7/2010 | Lee |
| 2010/0193884 A1 | 8/2010 | Park et al. |
| 2010/0193964 A1 | 8/2010 | Farooq et al. |
| 2010/0219392 A1 | 9/2010 | Awaya |
| 2010/0221867 A1 | 9/2010 | Bedell et al. |
| 2010/0224876 A1 | 9/2010 | Zhu |
| 2010/0224915 A1 | 9/2010 | Kawashima et al. |
| 2010/0225002 A1 | 9/2010 | Law et al. |
| 2010/0232200 A1 | 9/2010 | Shepard |
| 2010/0252934 A1 | 10/2010 | Law |
| 2010/0264551 A1 | 10/2010 | Farooq |
| 2010/0276662 A1 | 11/2010 | Colinge |
| 2010/0289064 A1* | 11/2010 | Or-Bach ........... H01L 27/10897 257/209 |
| 2010/0289144 A1 | 11/2010 | Farooq |
| 2010/0291749 A1* | 11/2010 | Or-Bach .......... H03K 19/17756 438/401 |
| 2010/0297844 A1 | 11/2010 | Yelehanka |
| 2010/0307572 A1 | 12/2010 | Bedell et al. |
| 2010/0308211 A1 | 12/2010 | Cho et al. |
| 2010/0308863 A1 | 12/2010 | Gliese et al. |
| 2010/0320514 A1 | 12/2010 | Tredwell |
| 2010/0320526 A1 | 12/2010 | Kidoh et al. |
| 2010/0330728 A1 | 12/2010 | McCarten |
| 2010/0330752 A1 | 12/2010 | Jeong |
| 2011/0001172 A1 | 1/2011 | Lee |
| 2011/0003438 A1 | 1/2011 | Lee |
| 2011/0024724 A1 | 2/2011 | Frolov et al. |
| 2011/0026263 A1 | 2/2011 | Xu |
| 2011/0027967 A1 | 2/2011 | Beyne |
| 2011/0037052 A1 | 2/2011 | Schmidt et al. |
| 2011/0042696 A1 | 2/2011 | Smith et al. |
| 2011/0049336 A1 | 3/2011 | Matsunuma |
| 2011/0049577 A1* | 3/2011 | Or-Bach ................. H01L 21/84 257/209 |
| 2011/0050125 A1 | 3/2011 | Medendorp et al. |
| 2011/0053332 A1 | 3/2011 | Lee |
| 2011/0084314 A1* | 4/2011 | Or-Bach ........... H01L 29/66621 257/209 |
| 2011/0092030 A1* | 4/2011 | Or-Bach ......... H01L 21/823828 438/129 |
| 2011/0101537 A1 | 5/2011 | Barth et al. |
| 2011/0102014 A1 | 5/2011 | Madurawe |
| 2011/0108888 A1* | 5/2011 | Or-Bach ........... H01L 29/66795 257/204 |
| 2011/0111560 A1 | 5/2011 | Purushothaman |
| 2011/0115023 A1 | 5/2011 | Cheng |
| 2011/0121366 A1* | 5/2011 | Or-Bach ............. H01L 21/8221 257/204 |
| 2011/0128777 A1 | 6/2011 | Yamazaki |
| 2011/0134683 A1 | 6/2011 | Yamazaki |
| 2011/0143506 A1 | 6/2011 | Lee |
| 2011/0147791 A1 | 6/2011 | Norman et al. |
| 2011/0147849 A1 | 6/2011 | Augendre et al. |
| 2011/0159635 A1 | 6/2011 | Doan et al. |
| 2011/0170331 A1 | 7/2011 | Oh |
| 2011/0204917 A1 | 8/2011 | O'Neill |
| 2011/0221022 A1 | 9/2011 | Toda |
| 2011/0222356 A1 | 9/2011 | Banna |
| 2011/0227158 A1 | 9/2011 | Zhu |
| 2011/0241082 A1 | 10/2011 | Bernstein et al. |
| 2011/0284946 A1 | 11/2011 | Kiyotoshi |
| 2011/0284992 A1 | 11/2011 | Zhu |
| 2011/0286283 A1 | 11/2011 | Lung et al. |
| 2011/0304765 A1 | 12/2011 | Yogo et al. |
| 2011/0309432 A1 | 12/2011 | Ishihara et al. |
| 2011/0314437 A1 | 12/2011 | McIlrath |
| 2012/0001184 A1 | 1/2012 | Ha et al. |
| 2012/0003815 A1 | 1/2012 | Lee |
| 2012/0013013 A1 | 1/2012 | Sadaka et al. |
| 2012/0025388 A1 | 2/2012 | Law et al. |
| 2012/0032250 A1 | 2/2012 | Son et al. |
| 2012/0034759 A1 | 2/2012 | Sakaguchi et al. |
| 2012/0063090 A1 | 3/2012 | Hsiao et al. |
| 2012/0074466 A1 | 3/2012 | Setiadi et al. |
| 2012/0086100 A1 | 4/2012 | Andry |
| 2012/0126197 A1 | 5/2012 | Chung |
| 2012/0146193 A1 | 6/2012 | Stuber et al. |
| 2012/0161310 A1 | 6/2012 | Brindle et al. |
| 2012/0169319 A1 | 7/2012 | Dennard |
| 2012/0178211 A1 | 7/2012 | Hebert |
| 2012/0181654 A1 | 7/2012 | Lue |
| 2012/0182801 A1 | 7/2012 | Lue |
| 2012/0187444 A1 | 7/2012 | Oh |
| 2012/0193785 A1 | 8/2012 | Lin |
| 2012/0241919 A1 | 9/2012 | Mitani |
| 2012/0286822 A1 | 11/2012 | Madurawe |
| 2012/0304142 A1 | 11/2012 | Morimoto |
| 2012/0317528 A1 | 12/2012 | McIlrath |
| 2012/0319728 A1 | 12/2012 | Madurawe |
| 2013/0026663 A1 | 1/2013 | Radu et al. |
| 2013/0037802 A1 | 2/2013 | England |
| 2013/0049796 A1 | 2/2013 | Pang |
| 2013/0070506 A1 | 3/2013 | Kajigaya |
| 2013/0082235 A1 | 4/2013 | Gu et al. |
| 2013/0097574 A1 | 4/2013 | Balabanov et al. |
| 2013/0100743 A1 | 4/2013 | Lue |
| 2013/0128666 A1 | 5/2013 | Avila |
| 2013/0187720 A1 | 7/2013 | Ishii |
| 2013/0193550 A1 | 8/2013 | Sklenard et al. |
| 2013/0196500 A1 | 8/2013 | Batude et al. |
| 2013/0203248 A1 | 8/2013 | Ernst et al. |
| 2013/0207243 A1 | 8/2013 | Fuergut et al. |
| 2013/0263393 A1 | 10/2013 | Mazumder |
| 2013/0337601 A1 | 12/2013 | Kapur |
| 2014/0015136 A1 | 1/2014 | Gan et al. |
| 2014/0030871 A1 | 1/2014 | Arriagada et al. |
| 2014/0035616 A1 | 2/2014 | Oda et al. |
| 2014/0048867 A1 | 2/2014 | Toh |
| 2014/0099761 A1 | 4/2014 | Kim et al. |
| 2014/0103959 A1 | 4/2014 | Andreev |
| 2014/0117413 A1 | 5/2014 | Madurawe |
| 2014/0120695 A1 | 5/2014 | Ohtsuki |
| 2014/0131885 A1 | 5/2014 | Samadi et al. |
| 2014/0137061 A1 | 5/2014 | McIlrath |
| 2014/0145347 A1 | 5/2014 | Samadi et al. |
| 2014/0146630 A1 | 5/2014 | Xie et al. |
| 2014/0149958 A1 | 5/2014 | Samadi et al. |
| 2014/0151774 A1 | 6/2014 | Rhie |
| 2014/0191357 A1 | 7/2014 | Lee |
| 2014/0225218 A1 | 8/2014 | Du |
| 2014/0225235 A1 | 8/2014 | Du |
| 2014/0252306 A1 | 9/2014 | Du |
| 2014/0253196 A1 | 9/2014 | Du et al. |
| 2014/0264228 A1 | 9/2014 | Toh |
| 2014/0357054 A1 | 12/2014 | Son et al. |
| 2015/0021785 A1 | 1/2015 | Lin |
| 2015/0034898 A1 | 2/2015 | Wang |
| 2015/0243887 A1 | 8/2015 | Saitoh |
| 2015/0255418 A1 | 9/2015 | Gowda |
| 2015/0279829 A1 | 10/2015 | Kuo |

(56) References Cited

U.S. PATENT DOCUMENTS

| | | |
|---|---|---|
| 2015/0340369 A1 | 11/2015 | Lue |
| 2016/0049201 A1 | 2/2016 | Lue |
| 2016/0104780 A1 | 4/2016 | Mauder |
| 2016/0133603 A1 | 5/2016 | Ahn |
| 2016/0141299 A1 | 5/2016 | Hong |
| 2016/0141334 A1 | 5/2016 | Takaki |
| 2016/0307952 A1 | 10/2016 | Huang |
| 2016/0343687 A1 | 11/2016 | Vadhavkar |
| 2017/0069601 A1 | 3/2017 | Park |
| 2017/0092371 A1 | 3/2017 | Harari |
| 2017/0098596 A1 | 4/2017 | Lin |
| 2017/0148517 A1 | 5/2017 | Harari |
| 2017/0179146 A1 | 6/2017 | Park |
| 2017/0221900 A1 | 8/2017 | Widjaja |
| 2017/0278858 A1 | 9/2017 | Walker et al. |
| 2018/0090219 A1 | 3/2018 | Harari |
| 2018/0090368 A1 | 3/2018 | Eun-Jeong et al. |
| 2018/0108416 A1 | 4/2018 | Harari |
| 2018/0294284 A1 | 10/2018 | Tarakji |
| 2019/0006009 A1 | 1/2019 | Harari |
| 2019/0043836 A1 | 2/2019 | Fastow et al. |
| 2019/0067327 A1 | 2/2019 | Herner |
| 2019/0157296 A1 | 5/2019 | Harari et al. |
| 2020/0020408 A1 | 1/2020 | Norman |
| 2020/0020718 A1 | 1/2020 | Harari et al. |
| 2020/0051990 A1 | 2/2020 | Harari et al. |
| 2020/0105773 A1 | 4/2020 | Morris et al. |
| 2020/0227123 A1 | 7/2020 | Salahuddin et al. |
| 2020/0243486 A1 | 7/2020 | Quader et al. |

OTHER PUBLICATIONS

Demeester, P. et al., "Epitaxial lift-off and its applications," Semicond. Sci. Technol., 1993, pp. 1124-1135, vol. 8.

Yoon, J., et al., "GaAs Photovoltaics and optoelectronics using releasable multilayer epitaxial assemblies", Nature, vol. 465, May 20, 2010, pp. 329-334.

Bakir and Meindl, "Integrated Interconnect Technologies for 3D Nanoelectronic Systems", Artech House, 2009, Chapter 13, pp. 389-419.

Tanaka, H., et al., "Bit Cost Scalable Technology with Punch and Plug Process for Ultra High Density Flash Memory," VLSI Technology, 2007 IEEE Symposium on, vol. no., pp. 14-15, Jun. 12-14, 2007.

Lue, H.-T., et al., "A Highly Scalable 8-Layer 3D Vertical-Gate (VG) TFT NAND Flash Using Junction-Free Buried Channel BE-SONOS Device," Symposium on VLSI Technology, 2010, pp. 131-132.

Kim, W., et al., "Multi-layered Vertical Gate NAND Flash overcoming stacking limit for terabit density storage", Symposium on VLSI Technology Digest of Technical Papers, 2009, pp. 188-189.

Dicioccio, L., et al., "Direct bonding for wafer level 3D integration", ICICDT 2010, pp. 110-113.

Kim, W., et al., "Multi-Layered Vertical Gate NAND Flash Overcoming Stacking Limit for Terabit Density Storage," Symposium on VLSI Technology, 2009, pp. 188-189.

Walker, A. J., "Sub-50nm Dual-Gate Thin-Film Transistors for Monolithic 3-D Flash", IEEE Trans. Elect. Dev., vol. 56, No. 11, pp. 2703-2710, Nov. 2009.

Hubert, A., et al., "A Stacked SONOS Technology, Up to 4 Levels and 6nm Crystalline Nanowires, with Gate-All-Around or Independent Gates (ΦFlash), Suitable for Full 3D Integration", International Electron Devices Meeting, 2009, pp. 637-640.

Celler, G.K. et al., "Frontiers of silicon-on-insulator," J. App. Phys., May 1, 2003, pp. 4955-4978, vol. 93, No. 9.

Rajendran, B., et al., "Electrical Integrity of MOS Devices in Laser Annealed 3D IC Structures", proceedings VLSI Multi Level Interconnect Conference 2004, pp. 73-74.

Rajendran, B., "Sequential 3D IC Fabrication: Challenges and Prospects", Proceedings of VLSI Multi Level Interconnect Conference 2006, pp. 57-64.

Jung, S.-M., et al., "The revolutionary and truly 3-dimensional 25F2 SRAM technology with the smallest S3 (stacked single-crystal Si) cell, 0.16um2, and SSTFT (stacked single-crystal thin film transistor) for ultra high density SRAM," VLSI Technology, 2004. Digest of Technical Papers, pp. 228-229, Jun. 15-17, 2004.

Hui, K. N., et al., "Design of vertically-stacked polychromatic light-emitting diodes," Optics Express, Jun. 8, 2009, pp. 9873-9878, vol. 17, No. 12.

Chuai, D. X., et al., "A Trichromatic Phosphor-Free White Light-Emitting Diode by Using Adhesive Bonding Scheme," Proc. SPIE, 2009, vol. 7635.

Suntharalingam, V. et al., "Megapixel CMOS Image Sensor Fabricated in Three-Dimensional Integrated Circuit Technology," Solid-State Circuits Conference, Digest of Technical Papers, ISSCC, Aug. 29, 2005, pp. 356-357, vol. 1.

Coudrain, P. et al., "Setting up 3D Sequential Integration for Back-Illuminated CMOS Image Sensors with Highly Miniaturized Pixels with Low Temperature Fully-Depleted SOI Transistors," IEDM, 2008, pp. 1-4.

Flamand, G. et al., "Towards Highly Efficient 4-Terminal Mechanical Photovoltaic Stacks," III-Vs Review, Sep.-Oct. 2006, pp. 24-27, vol. 19, Issue 7.

Zahler, J.M. et al., "Wafer Bonding and Layer Transfer Processes for High Efficiency Solar Cells," Photovoltaic Specialists Conference, Conference Record of the Twenty-Ninth IEEE, May 19-24, 2002, pp. 1039-1042.

Sekar, D. C., et al., "A 3D-IC Technology with Integrated Microchannel Cooling", Proc. Intl. Interconnect Technology Conference, 2008, pp. 13-15.

Brunschweiler, T., et al., "Forced Convective Interlayer Cooling in Vertically Integrated Packages," Proc. Intersoc. Conference on Thermal Management (ITHERM), 2008, pp. 1114-1125.

Yu, H., et al., "Allocating Power Ground Vias in 3D ICs for Simultaneous Power and Thermal Integrity" ACM Transactions on Design Automation of Electronic Systems (TODAES), vol. 14, No. 3, Article 41, May 2009, pp. 41.1-41.31.

Motoyoshi, M., "3D-IC Integration," 3rd Stanford and Tohoku University Joint Open Workshop, Dec. 4, 2009, pp. 1-52.

Wong, S., et al., "Monolithic 3D Integrated Circuits," VLSI Technology, Systems and Applications, 2007, International Symposium on VLSI-TSA 2007, pp. 1-4.

Batude, P., et al., "Advances in 3D CMOS Sequential Integration," 2009 IEEE International Electron Devices Meeting (Baltimore, Maryland), Dec. 7-9, 2009, pp. 345-348.

Tan, C.S., et al., "Wafer Level 3-D ICs Process Technology," ISBN-10: 0387765328, Springer, 1st Ed., Sep. 19, 2008, pp. v-xii, 34, 58, and 59.

Yoon, S.W. et al., "Fabrication and Packaging of Microbump Interconnections for 3D TSV," IEEE International Conference on 3D System Integration (3DIC), Sep. 28-30, 2009, pp. 1-5.

Franzon, P.D. et al., "Design and CAD for 3D Integrated Circuits," 45th ACM/IEEE Design, Automation Conference (DAC), Jun. 8-13, 2008, pp. 668-673.

Lajevardi, P., "Design of a 3-Dimension FPGA," Thesis paper, University of British Columbia, Submitted to Dept. of Electrical Engineering and Computer Science, Massachusetts Institute of Technology, Jul. 2005, pp. 1-71.

Dong, C. et al., "Reconfigurable Circuit Design with Nanomaterials," Design, Automation & Test in Europe Conference & Exhibition, Apr. 20-24, 2009, pp. 442-447.

Razavi, S.A., et al., "A Tileable Switch Module Architecture for Homogeneous 3D FPGAs," IEEE International Conference on 3D System Integration (3DIC), Sep. 28-30, 2009, 4 pages.

Bakir M., et al., "3D Device-Stacking Technology for Memory," Chptr. 13.4, pp. 407-410, in "Integrated Interconnect Technologies for 3D Nano Electronic Systems", 2009, Artech House.

Weis, M. et al., "Stacked 3-Dimensional 6T SRAM Cell with Independent Double Gate Transistors," IC Design and Technology, May 18-20, 2009.

Doucette, P., "Integrating Photonics: Hitachi, Oki Put LEDs on Silicon," Solid State Technology, Jan. 2007, p. 22, vol. 50, No. 1.

(56) References Cited

OTHER PUBLICATIONS

Luo, Z.S. et al., "Enhancement of (In, Ga)N Light-emitting Diode Performance by Laser Liftoff and Transfer from Sapphire to Silicon," Photonics Technology Letters, Oct. 2002, pp. 1400-1402, vol. 14, No. 10.
Zahler, J.M. et al., "Wafer Bonding and Layer Transfer Processes for High Efficiency Solar Cells," NCPV and Solar Program Review Meeting, 2003, pp. 723-726.
Kada, M., "Updated results of R&D on functionally innovative 3D-integrated circuit (dream chip) technology in FY2009", (2010) International Microsystems Packaging Assembly and Circuits Technology Conference, IMPACT 2010 and International 3D IC Conference, Proceedings.
Kada, M., "Development of functionally innovative 3D-integrated circuit (dream chip) technology / high-density 3D-integration technology for multifunctional devices", (2009) IEEE International Conference on 3D System Integration, 3DIC 2009.
Marchal, P., et al., "3-D technology assessment: Path-finding the technology/design sweet-spot", (2009) Proceedings of the IEEE, 97 (1), pp. 96-107.
Xie, Y., et al., "Design space exploration for 3D architectures", (2006) ACM Journal on Emerging Technologies in Computing Systems, 2 (2), Apr. 2006, pp. 65-103.
Souri, S., et al., "Multiple Si layers ICs: motivation, performance analysis, and design Implications", (2000) Proceedings—Design Automation Conference, pp. 213-220.
Vinet, M., et.al., "3D monolithic integration: Technological challenges and electrical results", Microelectronic Engineering Apr. 2011 vol. 88, Issue 4, pp. 331-335.
Bobba, S. et al., "CELONCEL: Effective Design Technique for 3-D Monolithic Integration targeting High Performance Integrated Circuits", *Asia pacific DAC 2011*, paper 4A-4.
Choudhury, D., "3D Integration Technologies for Emerging Microsystems", IEEE Proceedings of the IMS 2010, pp. 1-4.
Lee, Y.-J., et al., "3D 65nm CMOS with 320°C Microwave Dopant Activation", IEDM 2010, pp. 1-4.
Crnogorac, F., et al., "Semiconductor crystal islands for three-dimensional integration", J. Vac. Sci. Technol. B 28(6), Nov./Dec. 2010, pp. C6P53-58.
Park, J.-H., et al., "N-Channel Germanium MOSFET Fabricated Below 360 °C by Cobalt-Induced Dopant Activation for Monolithic Three-Dimensional-ICs", IEEE Electron Device Letters, vol. 32, No. 3, Mar. 2011, pp. 234-236.
Jung, S.-M., et al., "Highly Area Efficient and Cost Effective Double Stacked S3( Stacked Single-crystal Si ) Peripheral CMOS SSTFT and SRAM Cell Technology for 512M bit density SRAM", IEDM 2003, pp. 265-268.
Joyner, J.W., "Opportunities and Limitations of Three-dimensional Integration for Interconnect Design", PhD Thesis, Georgia Institute of Technology, Jul. 2003.
Choi, S.-J., "A Novel TFT with a Laterally Engineered Bandgap for of 3D Logic and Flash Memory", 2010 Symposium of VLSI Technology Digest, pp. 111-112.
Radu, I., et al., "Recent Developments of Cu—Cu non-thermo compression bonding for wafer-to-wafer 3D stacking", IEEE 3D Systems Integration Conference (3DIC), Nov. 16-18, 2010.
Gaudin, G., et al., "Low temperature direct wafer to wafer bonding for 3D integration", 3D Systems Integration Conference (3DIC), IEEE, 2010, Munich, Nov. 16-18, 2010, pp. 1-4.
Jung, S.-M., et al., ""Three Dimensionally Stacked NAND Flash Memory Technology Using Stacking Single Crystal Si Layers on ILD and TANOS Structure for Beyond 30nm Node"", IEDM 2006, Dec. 11-13, 2006.
Souri, S. J., "Interconnect Performance in 3-Dimensional Integrated Circuits", PHD Thesis, Stanford, Jul. 2003.
Uemoto, Y., et al., "A High-Performance Stacked-CMOS SRAM Cell by Solid Phase Growth Technique", Symposium on VLSI Technology, 2010, pp. 21-22.
Jung, S.-M., et al., "Highly Cost Effective and High Performance 65nm S3( Stacked Single-crystal Si ) SRAM Technology with 25F2,
0.16µm2 cell and doubly Stacked SSTFT Cell Transistors for Ultra High Density and High Speed Applications", 2005 Symposium on VLSI Technology Digest of Technical papers, pp. 220-221.
Steen, S.E., et al., "Overlay as the key to drive wafer scale 3D integration", Microelectronic Engineering 84 (2007) 1412-1415.
Maeda, N., et al., "Development of Sub 10-µm Ultra-Thinning Technology using Device Wafers for 3D Manufacturing of Terabit Memory", 2010 Symposium on VLSI Technology Digest of Technical Papers, pp. 105-106.
Chan, M., et al., "3-Dimensional Integration for Interconnect Reduction in for Nano-CMOS Technologies", IEEE Tencon, Nov. 23, 2006, Hong Kong.
Dong, X., et al., "Chapter 10: System-Level 3D IC Cost Analysis and Design Exploration", in Xie, Y., et al., "Three-Dimensional Integrated Circuit Design", book in series "Integrated Circuits and Systems" ed. A. Andrakasan, Springer 2010.
Naito, T., et al., "World's first monolithic 3D-FPGA with TFT SRAM over 90nm 9 layer Cu CMOS", 2010 Symposium on VLSI Technology Digest of Technical Papers, pp. 219-220.
Bernard, E., et al., "Novel integration process and performances analysis of Low STandby Power (LSTP) 3D Multi-Channel Cmosfet (MCFET) on SOI with Metal / High-K Gate stack", 2008 Symposium on VLSI Technology Digest of Technical Papers, pp. 16-17.
Cong, J., et al., "Quantitative Studies of Impact of 3D IC Design on Repeater Usage", Proceedings of International VLSI/ULSI Multilevel Interconnection Conference, pp. 344-348, 2008.
Gutmann, R.J., et al., "Wafer-Level Three-Dimensional Monolithic Integration for Intelligent Wireless Terminals", Journal of Semiconductor Technology and Science, vol. 4, No. 3, Sep. 2004, pp. 196-203.
Crnogorac, F., et al., "Nano-graphoepitaxy of semiconductors for 3D integration", Microelectronic Engineering 84 (2007) 891-894.
Koyanagi, M, "Different Approaches to 3D Chips", 3D IC Review, Stanford University, May 2005.
Koyanagi, M, "Three-Dimensional Integration Technology and Integrated Systems", ASPDAC 2009 presentation.
Koyanagi, M., et al., "Three-Dimensional Integration Technology and Integrated Systems", ASPDAC 2009, paper 4D-1, pp. 409-415.
Hayashi, Y., et al., "A New Three Dimensional IC Fabrication Technology Stacking Thin Film Dual-CMOS Layers", IEDM 1991, paper 25.6.1, pp. 657-660.
Clavelier, L., et al., "Engineered Substrates for Future More Moore and More Than Moore Integrated Devices", IEDM 2010, paper 2.6.1, pp. 42-45.
Kim, K., "From The Future Si Technology Perspective: Challenges and Opportunities", IEDM 2010, pp1.1.1-1.1.9.
Ababei, C., et al., "Exploring Potential Benefits of 3D FPGA Integration", in book by Becker, J. et al. Eds., "Field Programmable Logic 2004", LNCS 3203, pp. 874-880, 2004, Springer-Verlag Berlin Heidelberg.
Ramaswami, S., "3D TSV IC Processing", 3DIC Technology Forum Semicon Taiwan 2010, Sep. 9, 2010.
Davis, W.R., et al., "Demystifying 3D Ics: Pros and Cons of Going Vertical", IEEE Design and Test of Computers, Nov.-Dec. 2005, pp. 498-510.
Lin, M., et al., "Performance Benefits of Monolithically Stacked 3DFPGA", FPGA06, Feb. 22-24, 2006, Monterey, California, pp. 113-122.
Dong, C., et al., "Performance and Power Evaluation of a 3D CMOS/Nanomaterial Reconfigurable Architecture", ICCAD 2007, pp. 758-764.
Gojman, B., et al., "3D Nanowire-Based Programmable Logic", International Conference on Nano-Networks (Nanonets 2006), Sep. 14-16, 2006.
Dong, C., et al., "3-D nFPGA: A Reconfigurable Architecture for 3-D CMOS/Nanomaterial Hybrid Digital Circuits", IEEE Transactions on Circuits and Systems, vol. 54, No. 11, Nov. 2007, pp. 2489-2501.
Golshani, N., et al., "Monolithic 3D Integration of SRAM and Image Sensor Using Two Layers of Single Grain Silicon", 2010 IEEE International 3D Systems Integration Conference (3DIC), Nov. 16-18, 2010, pp. 1-4.

(56) References Cited

OTHER PUBLICATIONS

Rajendran, B., et al., "Thermal Simulation of laser Annealing for 3D Integration", Proceedings VMIC 2003.
Woo, H.-J., et al., "Hydrogen Ion Implantation Mechanism in GaAs-on-insulator Wafer Formation by Ion-cut Process", Journal of Semiconductor Technology and Science, vol. 6, No. 2, Jun. 2006, pp. 95-100.
Sadaka, M., et al., "Building Blocks for wafer level 3D integration",www.electroiq.com, Aug. 18, 2010, last accessed Aug. 18, 2010.
Madan, N., et al., "Leveraging 3D Technology for Improved Reliability," Proceedings of the 40th Annual IEEE/ACM International Symposium on Microarchitecture (MICRO 2007), IEEE Computer Society.
Hayashi, Y., et al., "Fabrication of Three Dimensional IC Using "Cumulatively Bonded IC" (Cubic) Technology", 1990 Symposium on VLSI Technology, pp. 95-96.
Akasaka, Y., "Three Dimensional IC Trends," Proceedings of the IEEE, vol. 24, No. 12, Dec. 1986.
Guarini, K. W., et al., "Electrical Integrity of State-of-the-Art 0.13µm SOI Device and Circuits Transferred for Three-Dimensional (3D) Integrated Circuit (IC) Fabrication," IEDM 2002, paper 16.6, pp. 943-945.
Kunio, T., et al., "Three Dimensional Ics, Having Four Stacked Active Device Layers," IEDM 1989, paper 34.6, pp. 837-840.
Gaillardon, p. E., et al., "Can We Go Towards True 3-D Architectures? ," DAC 2011, paper 58, pp. 282-283.
Yun, J-G., et al., "Single-Crystalline Si Stacked Array (STAR) NAND Flash Memory," IEEE Transactions on Electron Devices, vol. 58, No. 4, Apr. 2011, pp. 1006-1014.
Kim, Y., et al., "Three-Dimensional NAND Flash Architecture Design Based on Single-Crystalline Stacked Array," IEEE Transactions on Electron Devices, vol. 59, No. 1, Jan. 2012, pp. 35-45.
Goplen, B., et al., "Thermal via Placement in 3DICs," Proceedings of the International Symposium on Physical Design, Apr. 3-6, 2005, San Francisco.
Bobba, S., et al., "Performance Analysis of 3-D Monolithic Integrated Circuits," 2010 IEEE International 3D Systems Integration Conference (3DIC), Nov. 2010, Munich, pp. 1-4.
Batude, P., et al., "Demonstration of low temperature 3D sequential FDSOI integration down to 50nm gate length," 2011 Symposium on VLSI Technology Digest of Technical Papers, pp. 158-159.
Batude, P., et al., "Advances, Challenges and Opportunties in 3D CMOS Sequential Integration," 2011 IEEE International Electron Devices Meeting, paper 7.3, Dec. 2011, pp. 151-154.
Yun, C. H., et al., "Transfer of patterned ion-cut silicon layers", Applied Physics Letters, vol. 73, No. 19, Nov. 1998, pp. 2772-2774.
Ishihara, R., et al., "Monolithic 3D-ICs with single grain Si thin film transistors," Solid-State Electronics 71 (2012) pp. 80-87.
Lee, S. Y., et al., "Architecture of 3D Memory Cell Array on 3D IC," IEEE International Memory Workshop, May 20, 2012, Monterey, CA.
Lee, S. Y., et al., "3D IC Architecture for High Density Memories," IEEE International Memory Workshop, p. 1-6, May 2010.
Rajendran, B., et al., "CMOS transistor processing compatible with monolithic 3-D Integration," Proceedings VMIC 2005.
Huet, K., "Ultra Low Thermal Budget Laser Thermal Annealing for 3D Semiconductor and Photovoltaic Applications," NCCAVS 2012 Junction Technology Group, Semicon West, San Francisco, Jul. 12, 2012.
Derakhshandeh, J., et al., "A Study of the CMP Effect on the Quality of Thin Silicon Films Crystallized by Using the u-Czochralski Process," Journal of the Korean Physical Society, vol. 54, No. 1, 2009, pp. 432-436.
Kim, J., et al., "A Stacked Memory Device on Logic 3D Technology for Ultra-high-density Data Storage," Nanotechnology, vol. 22, 254006 (2011).
Lee, K. W., et al., "Three-dimensional shared memory fabricated using wafer stacking technology," IEDM Tech. Dig., 2000, pp. 165-168.

Chen, H. Y., et al., "HfOx Based Vertical Resistive Random Access Memory for Cost Effective 3D Cross-Point Architecture without Cell Selector," Proceedings IEDM 2012, pp. 497-499.
Huet, K., et al., "Ultra Low Thermal Budget Anneals for 3D Memories: Access Device Formation," Ion Implantation Technology 2012, AIP Conf Proceedings 1496, 135-138 (2012).
Batude, P., et al., "3D Monolithic Integration," ISCAS 2011 pp. 2233-2236.
Batude, P., et al., "3D Sequential Integration: A Key Enabling Technology for Heterogeneous C-Integration of New Function With CMOS," IEEE Journal on Emerging and Selected Topics in Circuits and Systems (JETCAS), vol. 2, No. 4, Dec. 2012, pp. 714-722.
Vinet, M., et.al., "Germanium on Insulator and new 3D architectures opportunities for integration", International Journal of Nanotechnology, vol. 7, No. 4, (Aug. 2010) pp. 304-319.
Bernstein, K., et al., "Interconnects in the Third Dimension: Design Challenges for 3DICs," Design Automation Conference, 2007, DAC'07, 44th ACM/IEEE, vol., no., pp. 562-567, Jun. 4-8, 2007.
Kuroda, T., "ThruChip Interface for Heterogeneous Chip Stacking," ElectroChemicalSociety Transactions, 50 (14) 63-68 (2012).
Miura, N., et al., "A Scalable 3D Heterogeneous Multi-Core Processor with Inductive-Coupling ThruChip Interface," IEEE Micro Cool Chips XVI, Yokohama, Apr. 17-19, 2013, pp. 1-3(2013).
Kuroda, T., "Wireless Proximity Communications for 3D System Integration," Future Directions in IC and Package Design Workshop, Oct. 29, 2007.
Qiang, J-Q, "3-D Hyperintegration and Packaging Technologies for Micro-Nano Systems," Proceedings of the IEEE, 97.1 (2009) pp. 18-30.
Lee, B.H., et al., "A Novel Pattern Transfer Process for Bonded SOI Giga-bit DRAMs," Proceedings 1996 IEEE International SOI Conference, Oct. 1996, pp. 114-115.
Wu, B., et al., "Extreme ultraviolet lithography and three dimensional circuits," Applied Physics Reviews, 1, 011104 (2014).
Delhougne, R., et al., "First Demonstration of Monocrystalline Silicon Macaroni Channel for 3-D NAND Memory Devices" IEEE VLSI Tech Digest, 2018, pp. 203-204.
Colinge, J. P., et al., "Nanowire transistors without Junctions", Nature Nanotechnology, Feb. 21, 2010, pp. 1-5.
Kim, J.Y., et al., "The breakthrough in data retention time of DRAM using Recess-Channel-Array Transistor (RCAT) for 88 nm feature size and beyond," 2003 Symposium on VLSI Technology Digest of Technical Papers, pp. 11-12, Jun. 10-12, 2003.
Kim, J.Y., et al., "The excellent scalability of the RCAT (recess-channel-array-transistor) technology for sub-70nm DRAM feature size and beyond," 2005 IEEE VLSI-TSA International Symposium, pp. 33-34, Apr. 25-27, 2005.
Abramovici, Breuer and Friedman, Digital Systems Testing and Testable Design, Computer Science Press, 1990, pp. 432-447.
Yonehara, T., et al., "ELTRAN: SOI-Epi Wafer by Epitaxial Layer transfer from porous Silicon", the 198th Electrochemical Society Meeting, abstract No. 438 (2000).
Yonehara, T et al., "Eltran®, Novel SOI Wafer Technology," JSAP International, Jul. 2001, pp. 10-16, No. 4.
Suk, S. D., et al., "High performance 5 nm radius twin silicon nanowire MOSFET(TSNWFET): Fabrication on bulk Si wafer, characteristics, and reliability," in Proc. IEDM Tech. Dig., 2005, pp. 717-720.
Bangsaruntip, S., et al., "High performance and highly uniform gate-all-around silicon nanowire MOSFETs with wire size dependent scaling," Electron Devices Meeting (IEDM), 2009 IEEE International, pp. 297-300, Dec. 7-9, 2009.
Burr, G. W., et al., "Overview of candidate device technologies for storage-class memory," IBM Journal of Research and Development, vol. 52, No. 4.5, pp. 449-464, Jul. 2008.
Bez, R., et al., "Introduction to Flash memory," Proceedings IEEE, 91(4), 489-502 (2003).
Auth, C., et al., "45nm High-k + Metal Gate Strain-Enchanced Transistors," Symposium on VLSI Technology Digest of Technical Papers, 2008, pp. 128-129.
Jan, C. H., et al., "A 32nm SoC Platform Technology with 2nd Generation High-k/Metal Gate Transistors Optimized for Ultra Low

(56) References Cited

OTHER PUBLICATIONS

Power, High Performance, and High Density Product Applications," IEEE International Electronic Devices Meeting (IEDM), Dec. 7-9, 2009, pp. 1-4.
Mistry, K., "A 45nm Logic Technology With High-K+Metal Gate Transistors, Strained Silicon, 9 Cu Interconnect Layers, 193nm Dry Patterning, and 100% Pb-Free Packaging," Electron Devices Meeting, 2007, IEDM 2007, IEEE International, Dec. 10-12, 2007, p. 247.
Ragnarsson, L., et al., "Ultralow-EOT (5 Å) Gate-First and Gate-Last High Performance CMOS Achieved by Gate-Electrode Optimization," IEDM Tech. Dig., pp. 663-666, 2009.
Sen, P & Kim, C.J., "A Fast Liquid-Metal Droplet Microswitch Using EWOD-Driven Contact-Line Sliding", Journal of Microelectromechanical Systems, vol. 18, No. 1, Feb. 2009, pp. 174-185.
Iwai, H., et.al., "NiSi Salicide Technology for Scaled CMOS," Microelectronic Engineering, 60 (2002), pp. 157-169.
Froment, B., et.al., "Nickel vs. Cobalt Silicide integration for sub-50nm CMOS", IMEC ESS Circuits, 2003. pp. 215-219.
James, D., "65 and 45-nm Devices—an Overview", Semicon West, Jul. 2008, paper No. ctr_024377.
Davis, J.A., et.al., "Interconnect Limits on Gigascale Integration(GSI) in the 21st Century", Proc. IEEE, vol. 89, No. 3, pp. 305-324, Mar. 2001.
Shino, T., et al., "Floating Body RAM Technology and its Scalability to 32nm Node and Beyond," Electron Devices Meeting, 2006, IEDM '06, International, pp. 1-4, Dec. 11-13, 2006.
Hamamoto, T., et al., "Overview and future challenges of floating body RAM (FBRAM) technology for 32 nm technology node and beyond", Solid-State Electronics, vol. 53, Issue 7, Papers Selected from the 38th European Solid-State Device Research Conference—ESSDERC'08, Jul. 2009, pp. 676-683.
Okhonin, S., et al., "New Generation of Z-RAM", Electron Devices Meeting, 2007. IEDM 2007. IEEE International, pp. 925-928, Dec. 10-12, 2007.
Henttinen, K. et al., "Mechanically Induced Si Layer Transfer in Hydrogen-Implanted Si Wafers," Applied Physics Letters, Apr. 24, 2000, p. 2370-2372, vol. 76, No. 17.
Lee, C.-W., et al., "Junctionless multigate field-effect transistor," Applied Physics Letters, vol. 94, pp. 053511-1 to 053511-2, 2009.
Park, S. G., et al., "Implementation of HfSiON gate dielectric for sub-60nm DRAM dual gate oxide with recess channel array transistor (RCAT) and tungsten gate," International Electron Devices Meeting, IEDM 2004, pp. 515-518, Dec. 13-15, 2004.
Kim, J.Y., et al., "S-RCAT (sphere-shaped-recess-channel-array transistor) technology for 70nm DRAM feature size and beyond," 2005 Symposium on VLSI Technology Digest of Technical Papers, 2005 pp. 34-35, Jun. 14-16, 2005.
Oh, H.J., et al., "High-density low-power-operating DRAM device adopting 6F2 cell scheme with novel S-RCAT structure on 80nm feature size and beyond," Solid-State Device Research Conference, ESSDERC 2005. Proceedings of 35th European , pp. 177-180, Sep. 12-16, 2005.
Chung, S.-W., et al., "Highly Scalable Saddle-Fin (S-Fin) Transistor for Sub-50nm DRAM Technology," 2006 Symposium on VLSI Technology Digest of Technical Papers, pp. 32-33.
Lee, M. J., et al., "A Proposal on an Optimized Device Structure With Experimental Studies on Recent Devices for the DRAM Cell Transistor," IEEE Transactions on Electron Devices, vol. 54, No. 12, pp. 3325-3335, Dec. 2007.
Henttinen, K. et al., "Cold ion-cutting of hydrogen implanted Si," J. Nucl. Instr. and Meth. in Phys. Res. B, 2002, pp. 761-766, vol. 190.
Brumfiel, G., "Solar cells sliced and diced", May 19, 2010, Nature News.
Dragoi, et al., "Plasma-activated wafer bonding: the new low-temperature tool for MEMS fabrication", Proc. SPIE, vol. 6589, 65890T (2007).

Vengurlekar, A., et al., "Mechanism of Dopant Activation Enhancement in Shallow Junctions by Hydrogen", Proceedings of the Materials Research Society, vol. 864, Spring 2005, E9.28.1-6.
Yamada, M. et al., "Phosphor Free High-Luminous-Efficiency White Light-Emitting Diodes Composed of InGaN Multi-Quantum Well," Japanese Journal of Applied Physics, 2002, pp. L246-L248, vol. 41.
Guo, X. et al., "Cascade single-chip phosphor-free white light emitting diodes," Applied Physics Letters, 2008, pp. 013507-1-013507-3, vol. 92.
Takafuji, Y. et al., "Integration of Single Crystal Si TFTs and Circuits on a Large Glass Substrate," IEEE International Electron Devices Meeting (IEDM), Dec. 7-9, 2009, pp. 1-4.
Wierer, J.J. et al., "High-power AlGaInN flip-chip light-emitting diodes," Applied Physics Letters, May 28, 2001, pp. 3379-3381, vol. 78, No. 22.
El-Gamal, A., "Trends in CMOS Image Sensor Technology and Design," International Electron Devices Meeting Digest of Technical Papers, Dec. 2002.
Ahn, S.W., "Fabrication of a 50 nm half-pitch wire grid polarizer using nanoimprint lithography," Nanotechnology, 2005, pp. 1874-1877, vol. 16, No. 9.
Johnson, R.C., "Switching LEDs on and off to enlighten wireless communications," EE Times, Jun. 2010, last accessed Oct. 11, 2010, <http://www.embeddedinternetdesign.com/design/225402094>.
Ohsawa, et al., "Autonomous Refresh of Floating Body Cell (FBC)", International Electron Device Meeting, 2008, pp. 801-804.
Chen, P., et al., "Effects of Hydrogen Implantation Damage on the Performance of InP/InGaAs/InP p-i-n Photodiodes, Transferred on Silicon," Applied Physics Letters, vol. 94, No. 1, Jan. 2009, pp. 012101-1 to 012101-3.
Lee, D., et al., "Single-Crystalline Silicon Micromirrors Actuated by Self-Aligned Vertical Electrostatic Combdrives with Piston-Motion and Rotation Capability," Sensors and Actuators A114, 2004, pp. 423-428.
Shi, X., et al., "Characterization of Low-Temperature Processed Single-Crystalline Silicon Thin-Film Transistor on Glass," IEEE Electron Device Letters, vol. 24, No. 9, Sep. 2003, pp. 574-576.
Chen, W., et al., "InP Layer Transfer with Masked Implantation," Electrochemical and Solid-State Letters, Issue 12, No. 4, Apr. 2009, H149-150.
Feng, J., et al., "Integration of Germanium-on-Insulator and Silicon MOSFETs on a Silicon Substrate," IEEE Electron Device Letters, vol. 27, No. 11, Nov. 2006, pp. 911-913.
Zhang, S., et al., "Stacked CMOS Technology on SOI Substrate," IEEE Electron Device Letters, vol. 25, No. 9, Sep. 2004, pp. 661-663.
Brebner, G., "Tooling up for Reconfigurable System Design," IEE Colloquium on Reconfigurable Systems, 1999, Ref. No. 1999/061, p. 2/1-2/4.
Bae, Y.-D., "A Single-Chip Programmable Platform Based on a Multithreaded Processor and Configurable Logic Clusters," 2002 IEEE International Solid-State Circuits Conference, Feb. 3-7, 2002, Digest of Technical Papers, ISSCC, vol. 1, pp. 336-337.
Lu, N.C.C., et al., "A Buried-Trench DRAM Cell Using a Self-aligned Epitaxy Over Trench Technology," Electron Devices Meeting, IEDM '88 Technical Digest, International, 1988, pp. 588-591.
Valsamakis, E.A., "Generator for a Custom Statistical Bipolar Transistor Model," IEEE Journal of Solid-State Circuits, Apr. 1985, pp. 586-589, vol. SC-20, No. 2.
Srivastava, P. et al., "Silicon Substrate Removal of GaN DHFETs for enhanced (>1100V) Breakdown Voltage," Aug. 2010, IEEE Electron Device Letters, vol. 31, No. 8, pp. 851-852.
Gosele, U., et al., "Semiconductor Wafer Bonding," Annual Review of Materials Science, Aug. 1998, pp. 215-241, vol. 28.
Spangler, L.J. et al., "A Technology for High Performance Single-Crystal Silicon-on-Insulator Transistors," IEEE Electron Device Letters, Apr. 1987, pp. 137-139, vol. 8, No. 4.
Larrieu, G., et al., "Low Temperature Implementation of Dopant-Segregated Band-edger Metallic S/D junctions in Thin-Body SOI p-MOSFETs", Proceedings IEDM, 2007, pp. 147-150.
Qui, Z., et al., "A Comparative Study of Two Different Schemes to Dopant Segregation at NiSi/Si and PtSi/Si Interfaces for Schottky

(56) References Cited

OTHER PUBLICATIONS

Barrier Height Lowering", IEEE Transactions on Electron Devices, vol. 55, No. 1, Jan. 2008, pp. 396-403.

Khater, M.H., et al., "High-k/Metal-Gate Fully Depleted SOI CMOS With Single-Silicide Schottky Source/Drain With Sub-30-nm Gate Length", IEEE Electron Device Letters, vol. 31, No. 4, Apr. 2010, pp. 275-277.

Abramovici, M., "In-system silicon validation and debug", (2008) IEEE Design and Test of Computers, 25 (3), pp. 216-223.

Saxena, P., et al., "Repeater Scaling and Its Impact on CAD", IEEE Transactions on Computer-Aided Design of Integrated Circuits and Systems, vol. 23, No. 4, Apr. 2004.

Abrmovici, M., et al., A reconfigurable design-for-debug infrastructure for SoCs, (2006) Proceedings—Design Automation Conference, pp. 7-12.

Anis, E., et al., "Low cost debug architecture using lossy compression for silicon debug", (2007) Proceedings of the IEEE/ACM Design, pp. 225-230.

Anis, E., et al., "On using lossless compression of debug data in embedded logic analysis", (2007) Proceedings of the IEEE International Test Conference, paper 18.3, pp. 1-10.

Boule, M., et al., "Adding debug enhancements to assertion checkers for hardware emulation and silicon debug", (2006) Proceedings of the IEEE International Conference on Computer Design, pp. 294-299.

Boule, M., et al., "Assertion checkers in verification, silicon debug and in-field diagnosis", (2007) Proceedings—Eighth International Symposium on Quality Electronic Design, ISQED 2007, pp. 613-618.

Burtscher, M., et al., "The VPC trace-compression algorithms", (2005) IEEE Transactions on Computers, 54 (11), Nov. 2005, pp. 1329-1344.

Frieden, B., "Trace port on powerPC 405 cores", (2007) Electronic Product Design, 28 (6), pp. 12-14.

Hopkins, A.B.T., et al., "Debug support for complex systems on-chip: A review", (2006) IEEE Proceedings: Computers and Digital Techniques, 153 (4), Jul. 2006, pp. 197-207.

Hsu, Y.-C., et al., "Visibility enhancement for silicon debug", (2006) Proceedings—Design Automation Conference, Jul. 24-28, 2006, San Francisco, pp. 13-18.

Josephson, D., et al., "The crazy mixed up world of silicon debug", (2004) Proceedings of the Custom Integrated Circuits Conference, paper 30-1, pp. 665-670.

Josephson, D.D., "The manic depression of microprocessor debug", (2002) IEEE International Test Conference (TC), paper 23.4, pp. 657-663.

Ko, H.F., et al., "Algorithms for state restoration and trace-signal selection for data acquisition in silicon debug", (2009) IEEE Transactions on Computer-Aided Design of Integrated Circuits and Systems, 28 (2), pp. 285-297.

Ko, H.F., et al., "Distributed embedded logic analysis for post-silicon validation of SOCs", (2008) Proceedings of the IEEE International Test Conference, paper 16.3, pp. 755-763.

Ko, H.F., et al., "Functional scan chain design at RTL for skewed-load delay fault testing", (2004) Proceedings of the Asian Test Symposium, pp. 454-459.

Ko, H.F., et al., "Resource-efficient programmable trigger units for post-silicon validation", (2009) Proceedings of the 14th IEEE European Test Symposium, ETS 2009, pp. 17-22.

Liu, X., et al., "On reusing test access mechanisms for debug data transfer in SoC post-silicon validation", (2008) Proceedings of the Asian Test Symposium, pp. 303-308.

Liu, X., et al., "Trace signal selection for visibility enhancement in post-silicon validation", (2009) Proceedings Date, pp. 1338-1343.

McLaughlin, R., et al., "Automated debug of speed path failures using functional tests", (2009) Proceedings of the IEEE VLSI Test Symposium, pp. 91-96.

Morris, K., "On-Chip Debugging—Built-in Logic Analyzers on your FPGA", (2004) Journal of FPGA and Structured ASIC, 2 (3).

Nicolici, N., et al., "Design-for-debug for post-silicon validation: Can high-level descriptions help?", (2009) Proceedings—IEEE International High-Level Design Validation and Test Workshop, HLDVT, pp. 172-175.

Park, S.-B., et al., "IFRA: Instruction Footprint Recording and Analysis for Post-Silicon Bug Localization", (2008) Design Automation Conference (DAC08), Jun. 8-13, 2008, Anaheim, CA, USA, pp. 373-378.

Park, S.-B., et al., "Post-silicon bug localization in processors using instruction footprint recording and analysis (IFRA)", (2009) IEEE Transactions on Computer-Aided Design of Integrated Circuits and Systems, 28 (10), pp. 1545-1558.

Moore, B., et al., "High Throughput Non-contact SiP Testing", (2007) Proceedings—International Test Conference, paper 12.3.

Riley, M.W., et al., "Cell broadband engine debugging for unknown events", (2007) IEEE Design and Test of Computers, 24 (5), pp. 486-493.

Vermeulen, B., "Functional debug techniques for embedded systems", (2008) IEEE Design and Test of Computers, 25 (3), pp. 208-215.

Vermeulen, B., et al., "Automatic Generation of Breakpoint Hardware for Silicon Debug", Proceeding of the 41st Design Automation Conference, Jun. 7-11, 2004, p. 514-517.

Vermeulen, B., et al., "Design for debug: Catching design errors in digital chips", (2002) IEEE Design and Test of Computers, 19 (3), pp. 37-45.

Vermeulen, B., et al., "Core-based scan architecture for silicon debug", (2002) IEEE International Test Conference (TC), pp. 638-647.

Vanrootselaar, G. J., et al., "Silicon debug: scan chains alone are not enough", (1999) IEEE International Test Conference (TC), pp. 892-902.

Kim, G.-S., et al., "A 25-mV-sensitivity 2-GB/s optimum-logic-threshold capacitive-coupling receiver for wireless wafer probing systems", (2009) IEEE Transactions on Circuits and Systems II: Express Briefs, 56 (9), pp. 709-713.

Sellathamby, C.V., et al., "Non-contact wafer probe using wireless probe cards", (2005) Proceedings—International Test Conference, 2005, pp. 447-452.

Jung, S.-M., et al., "Soft Error Immune 0.46pm2 SRAM Cell with MIM Node Capacitor by 65nm CMOS Technology for Ultra High Speed SRAM", IEDM 2003, pp. 289-292.

Brillouet, M., "Emerging Technologies on Silicon", IEDM 2004, pp. 17-24.

Meindl, J. D., "Beyond Moore's Law: The Interconnect Era", IEEE Computing in Science & Engineering, Jan./Feb. 2003, pp. 20-24.

Lin, X., et al., "Local Clustering 3-D Stacked CMOS Technology for Interconnect Loading Reduction", IEEE Transactions on electron Devices, vol. 53, No. 6, Jun. 2006, pp. 1405-1410.

He, T., et al., "Controllable Molecular Modulation of Conductivity in Silicon-Based Devices", J. Am. Chem. Soc. 2009, 131, 10023-10030.

Henley, F., "Engineered Substrates Using the Nanocleave Process", SemiconWest, TechXPOT Conference—Challenges in Device Scaling, Jul. 19, 2006, San Francisco.

Diamant, G., et al., "Integrated Circuits based on Nanoscale Vacuum Phototubes", Applied Physics Letters 92, 262903-1 to 262903-3 (2008).

Landesberger, C., et al., "Carrier techniques for thin wafer processing", CS MANTECH Conference, May 14- 17, 2007 Austin, Texas, pp. 33-36.

Shen, W., et al., "Mercury Droplet Micro switch for Re-configurable Circuit Interconnect", The 12th International Conference on Solid State Sensors, Actuators and Microsystems. Boston, Jun. 8-12, 2003, pp. 464-467.

Bangsaruntip, S., et al., "Gate-all-around Silicon Nanowire 25-Stage CMOS Ring Oscillators with Diameter Down to 3 nm", 2010 Symposium on VLSI Technology Digest of papers, pp. 21-22.

Borland, J.O., "Low Temperature Activation of Ion Implanted Dopants: A Review", International Workshop on Junction technology 2002, S7-3, Japan Society of Applied Physics, pp. 85-88.

(56) References Cited

OTHER PUBLICATIONS

Vengurlekar, A., et al., "Hydrogen Plasma Enhancement of Boron Activation in Shallow Junctions", Applied Physics Letters, vol. 85, No. 18, Nov. 1, 2004, pp. 4052-4054.
El-Maleh, A. H., et al., "Transistor-Level Defect Tolerant Digital System Design at the Nanoscale", Research Proposal Submitted to Internal Track Research Grant Programs, 2007. Internal Track Research Grant Programs.
Austin, T., et al., "Reliable Systems on Unreliable Fabrics", IEEE Design & Test of Computers, Jul./Aug. 2008, vol. 25, issue 4, pp. 322-332.
Borkar, S., "Designing Reliable Systems from Unreliable Components: The Challenges of Transistor Variability and Degradation", IEEE Micro, IEEE Computer Society, Nov.-Dec. 2005, pp. 10-16.
Zhu, S., et al., "N-Type Schottky Barrier Source/Drain MOSFET Using Ytterbium Silicide", IEEE Electron Device Letters, vol. 25, No. 8, Aug. 2004, pp. 565-567.
Zhang, Z., et al., "Sharp Reduction of Contact Resistivities by Effective Schottky Barrier Lowering With Silicides as Diffusion Sources," IEEE Electron Device Letters, vol. 31, No. 7, Jul. 2010, pp. 731-733.
Lee, R. T.P., et al., "Novel Epitaxial Nickel Aluminide-Silicide with Low Schottky-Barrier and Series Resistance for Enhanced Performance of Dopant-Segregated Source/Drain N-channel MuGFETs", 2007 Symposium on VLSI Technology Digest of Technical Papers, pp. 108-109.
Awano, M., et al., "Advanced DSS MOSFET Technology for Ultrahigh Performance Applications", 2008 Symposium on VLSI Technology Digest of Technical Papers, pp. 24-25.
Choi, S.-J., et al., "Performance Breakthrough in NOR Flash Memory with Dopant-Segregated Schottky-Barrier (DSSB) SONOS Devices", 2009 Symposium of VLSI Technology Digest, pp. 222-223.
Zhang, M., et al., "Schottky barrier height modulation using dopant segregation in Schottky-barrier SOI-MOSFETs", Proceeding of ESSDERC, Grenoble, France, 2005, pp. 457-460.
Larrieu, G., et al., "Arsenic-Segregated Rare-Earth Silicide Junctions: Reduction of Schottky Barrier and Integration in Metallic n-MOSFETs on SOI", IEEE Electron Device Letters, vol. 30, No. 12, Dec. 2009, pp. 1266-1268.
Ko, C.H., et al., "NiSi Schottky Barrier Process-Strained Si (SB-PSS) CMOS Technology for High Performance Applications", 2006 Symposium on VLSI Technology Digest of Technical Papers.
Kinoshita, A., et al., "Solution for High-Performance Schottky-Source/Drain MOSFETs: Schottky Barrier Height Engineering with Dopant Segregation Technique", 2004 Symposium on VLSI Technology Digest of Technical Papers, pp. 168-169.
Kinoshita, A., et al., "High-performance 50-nm-Gate-Length Schottky-Source/Drain MOSFETs with Dopant-Segregation Junctions", 2005 Symposium on VLSI Technology Digest of Technical Papers, pp. 158-159.
Kaneko, A., et al., "High-Performance FinFET with Dopant-Segregated Schottky Source/Drain", IEDM 2006.
Kinoshita, A., et al., "Ultra Low Voltage Operations in Bulk CMOS Logic Circuits with Dopant Segregated Schottky Source/Drain Transistors", IEDM 2006.
Kinoshita, A., et al., "Comprehensive Study on Injection Velocity Enhancement in Dopant-Segregated Schottky MOSFETs", IEDM 2006.
Choi, S.-J., et al., "High Speed Flash Memory and 1T-DRAM on Dopant Segregated Schottky Barrier (DSSB) FinFET SONOS Device for Multi-functional SoC Applications", 2008 IEDM, pp. 223-226.
Chin, Y.K., et al., "Excimer Laser-Annealed Dopant Segregated Schottky (ELA-DSS) Si Nanowire Gate-All-Around (GAA) pFET with Near Zero Effective Schottky Barrier Height (SBH)", IEDM 2009, pp. 935-938.
Agoura Technologies white paper, "Wire Grid Polarizers: a New High Contrast Polarizer Technology for Liquid Crystal Displays", 2008, pp. 1-12.
Unipixel Displays, Inc. white paper, "Time Multi-plexed Optical Shutter (TMOS) Displays", Jun. 2007, pp. 1-49.
Azevedo, I. L., et al., "The Transition to Solid-State Lighting", Proc. IEEE, vol. 97, No. 3, Mar. 2009, pp. 481-510.
Crawford, M.H., "LEDs for Solid-State Lighting: Performance Challenges and Recent Advances", IEEE Journal of Selected Topics in Quantum Electronics, vol. 15, No. 4, Jul./Aug. 2009, pp. 1028-1040.
Tong, Q.-Y., et al., "A "smarter-cut" approach to low temperature silicon layer transfer", Applied Physics Letters, vol. 72, No. 1, Jan. 5, 1998, pp. 49-51.
Tong, Q.-Y., et al., "Low Temperature Si Layer Splitting", Proceedings 1997 IEEE International SOI Conference, Oct. 1997, pp. 126-127.
Nguyen, P., et al., "Systematic study of the splitting kinetic of H/He co-implanted substrate", SOI Conference, 2003, pp. 132-134.
Ma, X., et al., "A high-quality SOI structure fabricated by low-temperature technology with B+/H+ co-implantation and plasma bonding", Semiconductor Science and Technology, vol. 21, 2006, pp. 959-963.
Yu, C.Y., et al., "Low-temperature fabrication and characterization of Ge-on-insulator structures", Applied Physics Letters, vol. 89, 101913-1 to 101913-2 (2006).
Li, Y. A., et al., "Surface Roughness of Hydrogen Ion Cut Low Temperature Bonded Thin Film Layers", Japan Journal of Applied Physics, vol. 39 (2000), Part 1, No. 1, pp. 275-276.
Hoechbauer, T., et al., "Comparison of thermally and mechanically induced Si layer transfer in hydrogen-implanted Si wafers", Nuclear Instruments and Methods in Physics Research B, vol. 216 (2004), pp. 257-263.
Aspar, B., et al., "Transfer of structured and patterned thin silicon films using the Smart-Cut process", Electronics Letters, Oct. 10, 1996, vol. 32, No. 21, pp. 1985-1986.
Agarwal, A., et al., "Efficient production of silicon-on-insulator films by co-implantation of He+ with H+" Applied Physics Letters, vol. 72, No. 9, Mar. 1998, pp. 1086-1088.
Cook III, G. O., et al., "Overview of transient liquid phase and partial transient liquid phase bonding," Journal of Material Science, vol. 46, 2011, pp. 5305-5323.
Moustris, G. P., et al., "Evolution of autonomous and semi-autonomous robotic surgical systems: a review of the literature," International Journal of Medical Robotics and Computer Assisted Surgery, Wiley Online Library, 2011, DOI: 10.10002/rcs.408.
Subbarao, M., et al., "Depth from Defocus: A Spatial Domain Approach," International Journal of Computer Vision, vol. 13, No. 3, pp. 271-294 (1994).
Subbarao, M., et al., "Focused Image Recovery from Two Defocused Images Recorded with Different Camera Settings," IEEE Transactions on Image Processing, vol. 4, No. 12, Decemeber 1995, pp. 1613-1628.
Guseynov, N. A., et al., "Ultrasonic Treatment Restores the Photoelectric Parameters of Silicon Solar Cells Degraded under the Action of 60Cobalt Gamma Radiation," Technical Physics Letters, vol. 33, No. 1, pp. 18-21 (2007).
Gawlik, G., et al., "GaAs on Si: towards a low-temperature "smart-cut" technology", Vacuum, vol. 70, pp. 103-107 (2003).
Weldon, M. K., et al., "Mechanism of Silicon Exfoliation Induced by Hydrogen/Helium Co-implantation," Applied Physics Letters, vol. 73, No. 25, pp. 3721-3723 (1998).
Miller, D.A.B., "Optical interconnects to electronic chips," Applied Optics, vol. 49, No. 25, Sep. 1, 2010, pp. F59-F70.
En, W. G., et al., "The Genesis Process: A New SOI wafer fabrication method", Proceedings 1998 IEEE International SOI Conference, Oct. 1998, pp. 163-164.
Uchikoga, S., et al., "Low temperature poly-Si TFT-LCD by excimer laser anneal," Thin Solid Films, vol. 383 (2001), pp. 19-24.
He, M., et al., "Large Polycrystalline Silicon Grains Prepared by Excimer Laser Crystallization of Sputtered Amorphous Silicon Film with Process Temperature at 100 C," Japanese Journal of Applied Physics, vol. 46, No. 3B, 2007, pp. 1245-1249.
Kim, S.D., et al., "Advanced source/drain engineering for box-shaped ultra shallow junction formation using laser annealing and

(56) References Cited

OTHER PUBLICATIONS pre-amorphization implantation in sub-100-nm SOI CMOS," IEEE Trans. Electron Devices, vol. 49, No. 10, pp. 1748-1754, Oct. 2002.

Ahn, J., et al., "High-quality MOSFET's with ultrathin LPCVD gate SiO2," IEEE Electron Device Lett., vol. 13, No. 4, pp. 186-188, Apr. 1992.

Yang, M., et al., "High Performance CMOS Fabricated on Hybrid Substrate with Different Crystal Orientation," Proceedings IEDM 2003.

Yin, H., et al., "Scalable 3-D finlike poly-Si TFT and its nonvolatile memory application," IEEE Trans. Electron Devices, vol. 55, No. 2, pp. 578-584, Feb. 2008.

Kawaguchi, N., et al., "Pulsed Green-Laser Annealing for Single-Crystalline Silicon Film Transferred onto Silicon wafer and Non-alkaline Glass by Hydrogen-Induced Exfoliation," Japanese Journal of Appl,ied Physics, vol. 46, No. 1, 2007, pp. 21-23.

Faynot, O. et al., "Planar Fully depleted SOI technology: A Powerful architecture for the 20nm node and beyond," Electron Devices Meeting (IEDM), 2010 IEEE International, vol. no., p. 3.2.1, 3.2.4, Dec. 6-8, 2010.

Khakifirooz, A., "ETSOI Technology for 20nm and Beyond", SOI Consortium Workshop: Fully Depleted SOI, Apr. 28, 2011, Hsinchu Taiwan.

Kim, I.-K., et al., "Advanced Integration Technology for a Highly Scalable SOI DRAM with SOC (Silicon-On-(Capacitors)", IEDM 1996, pp. 96-605-608, 22.5.4.

Lee, B.H., et al., "A Novel CMP Method for cost-effective Bonded SOI Wafer Fabrication," Proceedings 1995 EEE International SOI Conference, Oct. 1995, pp. 60-61.

Choi, Sung-Jin, et al., "Performance Breakthrough in NOR Flash Memory with Dopant-Segregated Schottky-Barrier (DSSB) SONOS Devices," paper 11B-3, 2009 Symposium on VLSI Technology, Digest of Technical Papers, pp. 222-223.

Chang, Wei, et al., "Drain-induced Schottky barrier source-side hot carriers and its application to program local bits of nanowire charge-trapping memories," Japanese Journal of Applied Physics 53, 094001 (2014) pp. 094001-1 to 094001-5.

Kim, J., et al.; "A stacked memory device on logic 3D technology for ultra-high-density data storage"; Nanotechnology 22 (2011) 254006 (7pp).

Hsieh, P-Y, et al., "Monolithic 3D BEOL FinFET switch arrays using location-controlled-grain technique in voltage regulator with better FOM than 2D regulators", IEDM paper 3.1, pp. IEDM19-46 to IEDM19-49.

Then, Han Wui, et al., "3D heterogeneous integration of high performance high-K metal gate GaN NMOS and Si PMOS transistors on 300mm high resistivity Si substrate for energy-efficient and compact power delivery, RF (5G and beyond) and SoC applications", IEDM 2019, paper 17.3, pp. IEDM19-402 to IEDM19-405.

Rachmady, W., et al., "300mm Heterogeneous 3D Integration of Record Performance Layer Transfer Germanium PMOS with Silicon NMOS for Low Power High Performance Logic Applications", IEDM 2019, paper 29.7, pp. IEDM19-697 to IEDM19-700.

\* cited by examiner

108 — { Preprocessed wafer }

Fig. 1B

109 — { Transfer layer }

108 — { Preprocessed wafer }

Fig. 1C

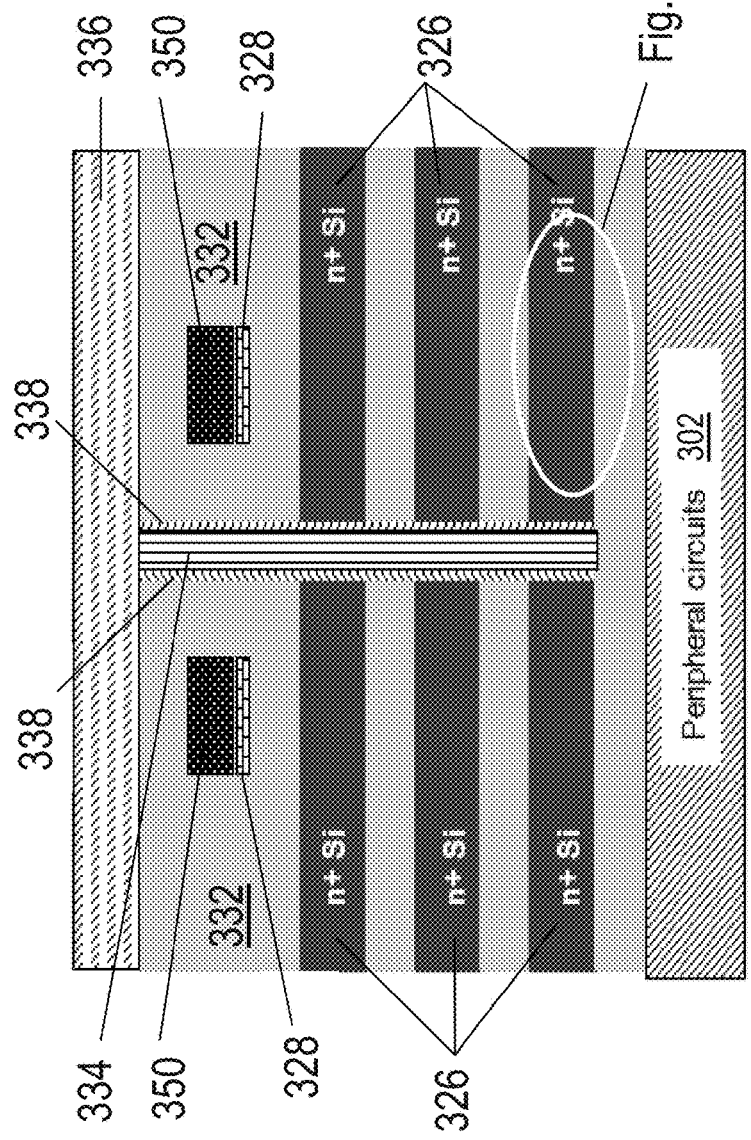
Fig. 3J1

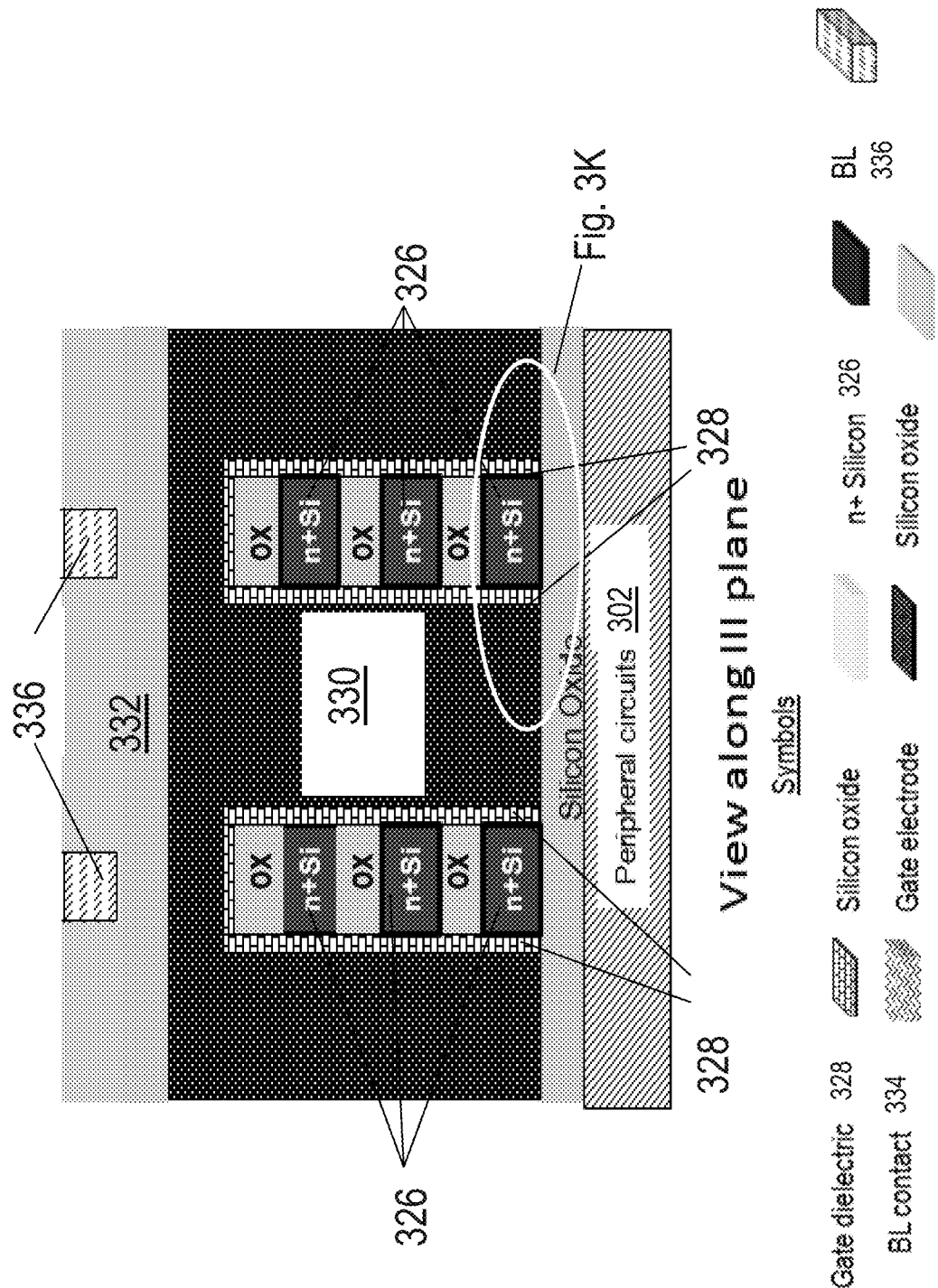
Fig. 3J2

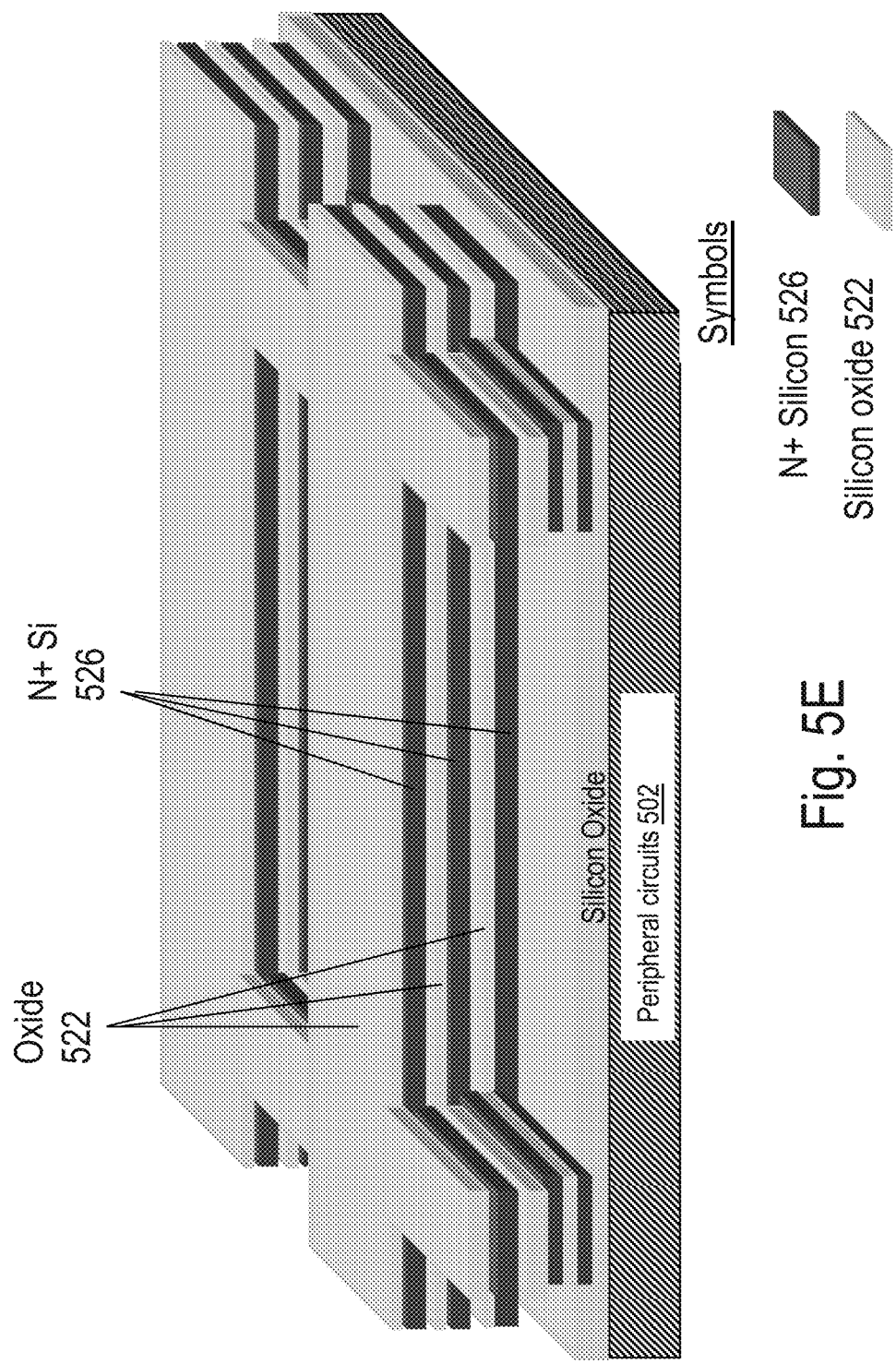

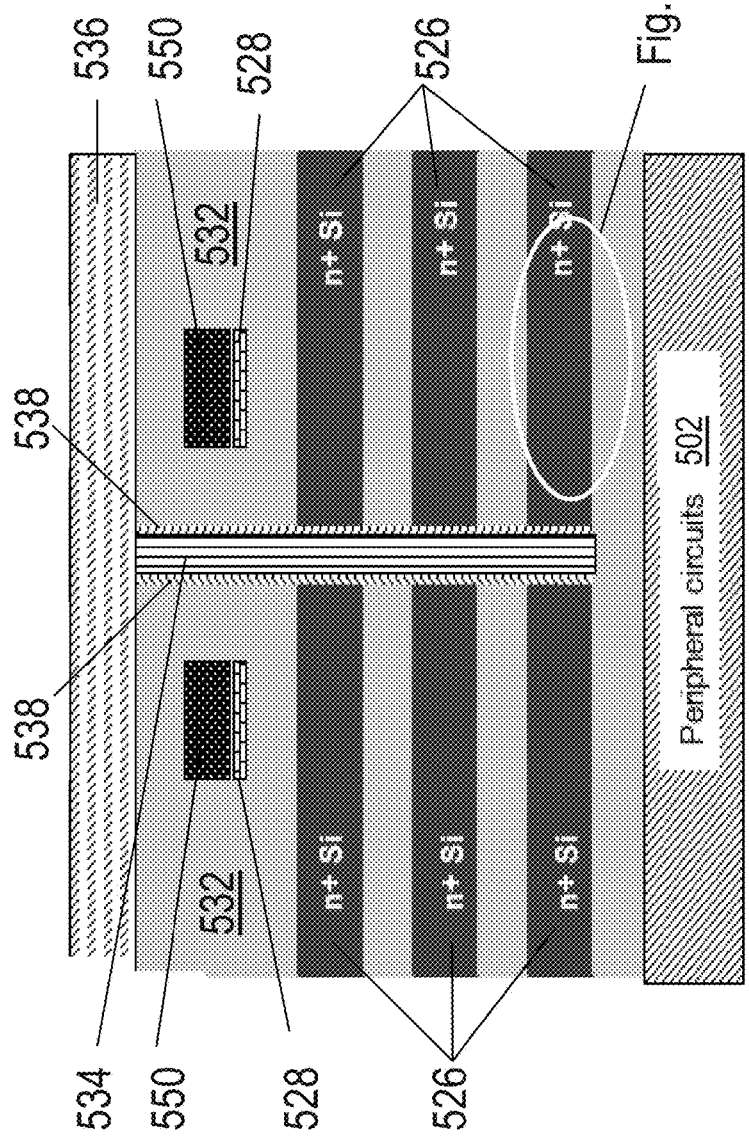
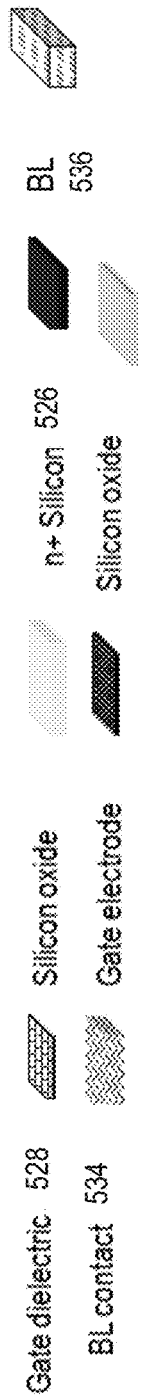
Fig. 5J1

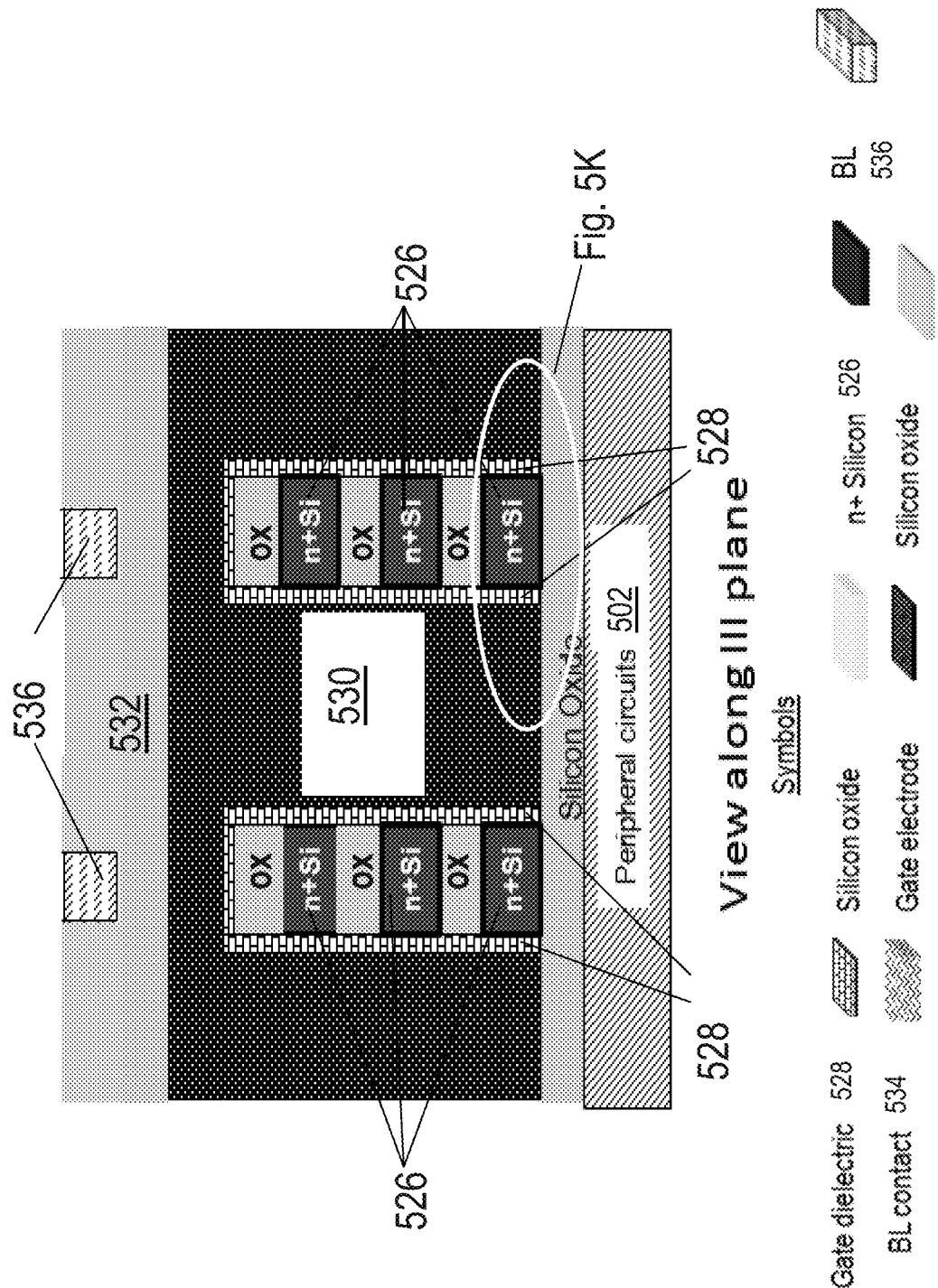

3D SEMICONDUCTOR MEMORY DEVICE AND STRUCTURE

CROSS-REFERENCE OF RELATED APPLICATION

This application is a continuation-in-part of U.S. patent application Ser. No. 15/460,230, filed on Mar. 16, 2017, which is a continuation-in-part of U.S. patent application Ser. No. 14/821,683, (now U.S. Pat. No. 9,613,844 issued on Apr. 4, 2017) filed on Aug. 7, 2015, which is a continuation-in-part of U.S. patent application Ser. No. 13/492,395, (now U.S. Pat. No. 9,136,153 issued on Sep. 15, 2015) filed on Jun. 8, 2012, which is a continuation of U.S. patent application Ser. No. 13/273,712 (now U.S. Pat. No. 8,273,610 issued on Sep. 25, 2012) filed Oct. 14, 2011, which is a continuation-in-part of U.S. patent application Ser. No. 13/016,313 (now U.S. Pat. No. 8,362,482 issued on Jan. 29, 2013) filed on Jan. 28, 2011, which is a continuation-in-part of U.S. patent application Ser. No. 12/970,602, filed on Dec. 16, 2010, which is a continuation-in-part of U.S. patent application Ser. No. 12/949,617, (now U.S. Pat. No. 8,754,533 issued on Jun. 17, 2014) filed on Nov. 18, 2010. The contents of the foregoing applications are incorporated herein by reference.

BACKGROUND OF THE INVENTION

1. Field of the Invention

This application relates to the general field of Integrated Circuit (IC) devices and fabrication methods, and more particularly to multilayer or Three Dimensional Integrated Circuit (3D IC) devices and fabrication methods.

2. Discussion of Background Art

Semiconductor manufacturing is known to improve device density in an exponential manner over time, but such improvements come with a price. The mask set cost required for each new process technology has also been increasing exponentially. While 20 years ago a mask set cost less than $20,000, it is now quite common to be charged more than $1 M for today's state of the art device mask set.

These changes represent an increasing challenge primarily to custom products, which tend to target smaller volume and less diverse markets therefore making the increased cost of product development very hard to accommodate.

Custom Integrated Circuits can be segmented into two groups. The first group includes devices that have all their layers custom made. The second group includes devices that have at least some generic layers used across different custom products. Well-known examples of the second kind may include Gate Arrays, which use generic layers for all layers up to a contact layer that couples the silicon devices to the metal conductors, and Field Programmable Gate Array (FPGA) devices where all the layers are generic. The generic layers in such devices may mostly be a repeating pattern structure, called a Master Slice, in an array form.

The logic array technology may be based on a generic fabric customized for a specific design during the customization stage. For an FPGA the customization may be done through programming by electrical signals. For Gate Arrays, which in their modern form are sometimes called Structured Application Specific Integrated Circuits (or Structured ASICs), the customization may be by at least one custom layer, which might be done with Direct Write eBeam or with a custom mask. As designs tend to be highly variable in the amount of logic and memory and type of input & output (I/O) each one may need, vendors of logic arrays create product families, each product having a different number of Master Slices covering a range of logic, memory size and I/O options. Yet, it is typically a challenge to come up with minimum set of Master Slices that can provide a good fit for the maximal number of designs because it may be quite costly to use a dedicated mask set for each product.

U.S. Pat. No. 4,733,288 issued to Sato in March 1988 ("Sato"), discloses a method "to provide a gate-array LSI chip which can be cut into a plurality of chips, each of the chips having a desired size and a desired number of gates in accordance with a circuit design." The references cited in Sato present a few alternative methods to utilize a generic structure for different sizes of custom devices.

The array structure may fit the objective of variable sizing. The difficulty to provide variable-sized array structure devices may result from the need of providing I/O cells and associated pads to connect the device to the package. To overcome this difficulty Sato suggests a method wherein I/O could be constructed from the transistors also used for the general logic gates. Anderson also suggested a similar approach. U.S. Pat. No. 5,217,916 issued to Anderson et al. on Jun. 8, 1993, discloses a borderless configurable gate array free of predefined boundaries using transistor gate cells, of the same type of cells used for logic, to serve the input and output function. Accordingly, the input and output functions may be placed to surround the logic array sized for the specific application. This method may place a potential limitation on the I/O cell to use the same type of transistors as used for the logic and; hence, may not allow the use of higher operating voltages for the I/O.

U.S. Pat. No. 7,105,871 issued to Or-Bach et al. on Sep. 12, 2006, discloses a semiconductor device that includes a borderless logic array and area I/Os. The logic array may comprise a repeating core, and at least one of the area I/Os may be a configurable I/O.

In the past it was reasonable to design an I/O cell that could be configured to the various needs of most customers. The ever increasing need of higher data transfer rate in and out of the device drove the development of special serial I/O circuits called SerDes (Serializer/Deserializer) transceivers. These circuits are complex and may lead to a far larger silicon area than conventional I/Os. Consequently, the variations may be combinations of various amounts of logic, various amounts and types of memories, and various amounts and types of I/O. This implies that even the use of the borderless logic array of the prior art may still lead to multiple expensive mask sets.

There are many techniques to construct 3D stacked integrated circuits or chips including:

Through-silicon via (TSV) technology: Multiple layers of transistors (with or without wiring levels) can be constructed separately. Following this, they can be bonded to each other and connected to each other with through-silicon vias (TSVs).

Monolithic 3D technology: With this approach, multiple layers of transistors and wires can be monolithically constructed. Some monolithic 3D approaches are described in U.S. Pat. Nos. 8,273,610, 8,298,875, 8,362,482, 8,378,715, 8,379,458, 8,450,804, 8,557,632, 8,574,929, 8,581,349, 8,642,416, 8,669,778, 8,674,470, 8,687,399, 8,742,476, 8,803,206, 8,836,073, 8,902,663, 8,994,404, 9,023,688, 9,029,173, 9,030,858, 9,117,749, 9,142,553, 9,219,005, 9,385,058, 9,406,670, 9,460,978, 9,509,313, 9,640,531, 9,691,760, 9,711,407, 9,721,927, 9,799,761, 9,871,034, 9,953,870, 9,953,994, 10,014,292, 10,014,318; and pending U.S. Patent Application Publications and applications, Ser. Nos. 14/642,724, 15/150,395, 15/173,686, 62/651,722; 62/681,249, 62/713,345, 62/770,751; and PCT Applications (and Publications): PCT/US2010/052093, PCT/US2011/042071 (WO2012/015550), PCT/US2016/52726 (WO2017053329), PCT/US2017/052359 (WO2018/071143), PCT/US2018/016759 (WO2018144957), and PCT/US2018/52332 (WO 2019/060798). The entire contents of the foregoing patents, publications, and applications are incorporated herein by reference.

Electro-Optics: There is also work done for integrated monolithic 3D including layers of different crystals, such as U.S. Pat. Nos. 8,283,215, 8,163,581, 8,753,913, 8,823,122, 9,197,804, 9,419,031 and 9,941,319. The entire contents of the foregoing patents, publications, and applications are incorporated herein by reference.

Additionally the 3D technology according to some embodiments of the invention may enable some very innovative IC alternatives with reduced development costs, increased yield, and other illustrative benefits.

SUMMARY

The invention may be directed to multilayer or Three Dimensional Integrated Circuit (3D IC) devices and fabrication methods.

In one aspect, a 3D semiconductor memory, the memory comprising: a first level comprising first memory cells, first transistors, and a first control line, wherein said first memory cells each comprise one of said first transistors; a second level comprising second memory cells, second transistors, and a second control line, wherein said second memory cells each comprise one of said second transistors, wherein said second level overlays said first level, wherein said second control line and said first control line have been processed following the same lithography step and accordingly are self-aligned, wherein said first control line is directly connected to each source or drain of at least five of said first transistors, and wherein said second control line is directly connected to each source or drain of at least five of said second transistors; and an oxide layer disposed between said first control line and said second control line.

In another aspect, a 3D semiconductor memory, the memory comprising: a first level comprising first memory cells, first transistors, and a first control line, wherein said first memory cells each comprise one of said first transistors; a second level comprising second memory cells, second transistors, and a second control line, wherein said second memory cells each comprise one of said second transistors, wherein said second level overlays said first level, wherein said second control line and said first control line have been processed following the same lithography step and accordingly are self-aligned, wherein said first control line is directly connected to each source or drain of at least five of said first transistors, wherein said second control line is directly connected to each source or drain of at least five of said second transistors, and wherein said second transistors each comprise a double gate.

In another aspect, a 3D semiconductor memory, the memory comprising: a first level comprising first memory cells, first transistors, and a first control line, wherein said first memory cells each comprise one of said first transistors; a second level comprising second memory cells, second transistors, and a second control line, wherein said second memory cells each comprise one of said second transistors, wherein said second level overlays said first level, wherein said second control line and said first control line have been processed following the same lithography step and accordingly are self-aligned, wherein said first control line is directly connected to each source or drain of at least five of said first transistors, wherein said second control line is directly connected to each source or drain of at least five of said second transistors, and wherein said second transistors comprise a poly-silicon transistor channel.

BRIEF DESCRIPTION OF THE DRAWINGS

Various embodiments of the invention will be understood and appreciated more fully from the following detailed description, taken in conjunction with the drawings in which:

FIGS. 1B-1I are exemplary drawing illustrations of the preprocessed wafers and layers and generalized layer transfer;

FIGS. 3A-3J, 3J1, 3J2, 3K are exemplary drawing illustrations of the formation of a resistive memory transistor;

FIGS. 5A-5J, 5J1, 5J2, 5K are exemplary drawing illustrations of the formation of a resistive memory transistor.

DETAILED DESCRIPTION

Figure 1:
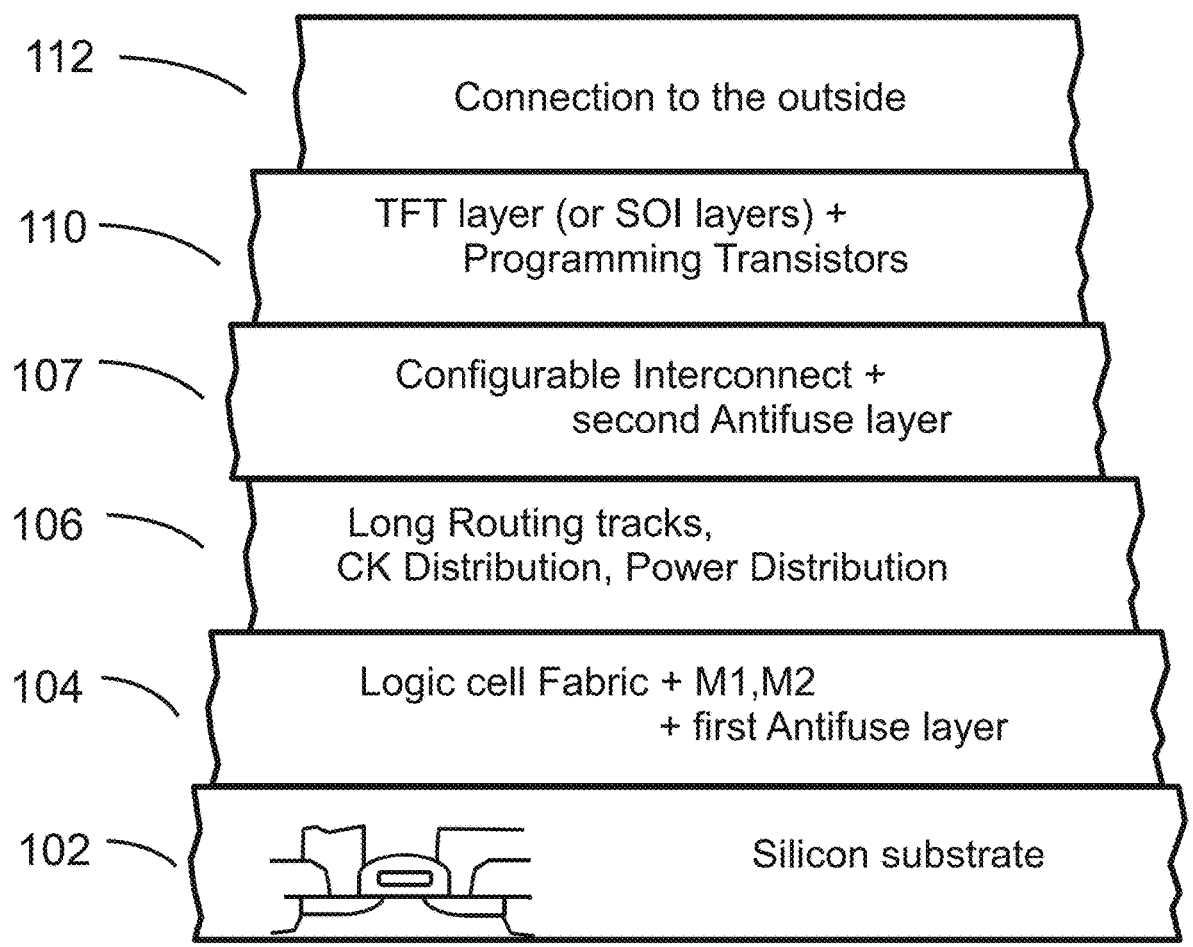
FIG. 1 is an exemplary drawing illustration of a programmable device layers structure.

Embodiments of the invention are described herein with reference to the drawing figures. Persons of ordinary skill in the art will appreciate that the description and figures illustrate rather than limit the invention and that in general the figures are not drawn to scale for clarity of presentation. Such skilled persons will also realize that many more embodiments are possible by applying the inventive principles contained herein and that such embodiments fall within the scope of the invention which is not to be limited except by the appended claims.

Some drawing figures may describe process flows for building devices. These process flows, which may be a sequence of steps for building a device, may have many structures, numerals and labels that may be common between two or more adjacent steps. In such cases, some labels, numerals and structures used for a certain step's figure may have been described in the previous steps' figures.

Some embodiments of the invention may provide a new method for semiconductor device fabrication that may be highly desirable for custom products. Some embodiments of the invention may suggest the use of a re-programmable antifuse in conjunction with 'Through Silicon Via' to construct a new type of configurable logic, or as usually called, FPGA devices. Some embodiments of the invention may provide a solution to the challenge of high mask-set cost and low flexibility that exists in the current common methods of semiconductor fabrication. An additional illustrated advantage of some embodiments of the present invention may be that it could reduce the high cost of manufacturing the many different mask sets needed in order to provide a commercially viable logic family with a range of products each with a different set of master slices. Some embodiments of the invention may improve upon the prior art in many respects, including, for example, the structuring of the semiconductor device and methods related to the fabrication of semiconductor devices.

Some embodiments of the invention may reflect the motivation to save on the cost of masks with respect to the investment that would otherwise have been necessary to put in place a commercially viable set of master slices. Some embodiments of the invention may also provide the ability to incorporate various types of memory blocks in the configurable device. Some embodiments of the invention may provide a method to construct a configurable device with the desired amount of logic, memory, I/Os, and analog functions.

In addition, some embodiments of the invention may allow the use of repeating logic tiles that provide a continuous terrain of logic. Some embodiments of the invention may use a modular approach to construct various configurable systems with Through-Silicon-Via (TSV). Once a standard size and location of TSV has been defined one could build various configurable logic dies, configurable memory dies, configurable I/O dies and configurable analog dies which could be connected together to construct various configurable systems. In fact, these embodiments of the invention may allow mixing and matching among configurable dies, fixed function dies, and dies manufactured in different processes.

Some embodiments of the invention may provide additional illustrated benefits by making use of special type of transistors placed above or below the antifuse configurable interconnect circuits to allow for a far better use of the silicon area. In general an FPGA device that utilizes antifuses to configure the device function may include the electronic circuits to program the antifuses. The programming circuits may be used primarily to configure the device and may be mostly an overhead once the device is configured. The programming voltage used to program the antifuse may typically be significantly higher than the voltage used for the operating circuits of the device. The design of the antifuse structure may be designed such that an unused antifuse may not accidentally get fused. Accordingly, the incorporation of the antifuse programming in the silicon substrate may entail special attention for a resulting higher voltage, and additional silicon area may, accordingly, be allocated.

Unlike the operating transistors designed to operate as fast as possible and to enable fast system performance, the programming circuits could operate relatively slowly. Accordingly using a thin film transistor for the programming circuits could fit very well with the function and may reduce the needed silicon area.

The programming circuits may, therefore, be constructed with thin film transistors, which may be fabricated after the fabrication of the operating circuitry, on top of the configurable interconnection layers that incorporate and use the antifuses. An additional illustrated advantage of such embodiments of the invention may be the ability to reduce cost of the high volume production. One may only need to use mask-defined links instead of the antifuses and their programming circuits. One custom via mask may be used, and this may save steps associated with the fabrication of the antifuse layers, the thin film transistors, and/or the associated connection layers of the programming circuitry.

In accordance with an embodiment of the invention an Integrated Circuit device may thus be provided, including a plurality of antifuse configurable interconnect circuits and a plurality of transistors to configure at least one of said antifuses; wherein said transistors are fabricated after said antifuse.

Further provided in accordance with an embodiment of the invention may provide an Integrated Circuit device including: a plurality of antifuse configurable interconnect circuits and plurality of transistors to configure at least one of said antifuses; wherein said transistors are placed over said antifuse.

Still further in accordance with an embodiment of the illustrated invention of the Integrated Circuit device may include second antifuse configurable logic cells and a plurality of second transistors to configure said second antifuses wherein these second transistors may be fabricated before said second antifuses.

Still further in accordance with an embodiment of the illustrated invention the Integrated Circuit device may also include second antifuse configurable logic cells and a plurality of second transistors to configure said second antifuses wherein said second transistors may be placed underneath said second antifuses.

Further provided in accordance with an embodiment of the illustrated invention may be an Integrated Circuit device including: first antifuse layer, at least two metal layers over it and a second antifuse layer overlaying the two metal layers.

In accordance with an embodiment of the invention a configurable logic device may be presented, including: antifuse configurable look up table logic interconnected by antifuse configurable interconnect.

In accordance with an embodiment of the illustrated invention a configurable logic device may also be provided, including: a plurality of configurable look up table logic, a plurality of configurable programmable logic array (PLA) logic, and a plurality of antifuse configurable interconnect.

In accordance with an embodiment of the invention a configurable logic device may also be provided, including: a plurality of configurable look up table logic and a plurality of configurable drive cells wherein the drive cells may be configured by plurality of antifuses.

In accordance with an embodiment of the illustrated invention, a configurable logic device may additionally be provided, including: configurable logic cells interconnected by a plurality of antifuse configurable interconnect circuits wherein at least one of the antifuse configurable interconnect circuits may be configured as part of a non volatile memory.

Further in accordance with an embodiment of the invention, the configurable logic device may include at least one antifuse configurable interconnect circuit, which may also be configurable to a PLA function.

In accordance with an alternative embodiment of the invention, an integrated circuit system may also be provided, including a configurable logic die and an I/O die wherein the configurable logic die may be connected to the I/O die by the use of Through-Silicon-Via.

Further in accordance with an embodiment of the invention, the integrated circuit system may include; a configurable logic die and a memory die wherein the configurable logic die and the memory die may be connected by the use of Through-Silicon-Via.

Still further in accordance with an embodiment of the invention the integrated circuit system may include a first configurable logic die and second configurable logic die wherein the first configurable logic die and the second configurable logic die may be connected by the use of Through-Silicon-Via.

Moreover in accordance with an embodiment of the invention, the integrated circuit system may include an I/O die that may be fabricated utilizing a different process than the process utilized to fabricate the configurable logic die.

Further in accordance with an embodiment of the invention, the integrated circuit system may include at least two logic dies connected by the use of Through-Silicon-Via and wherein some of the Through-Silicon-Vias may be utilized to carry the system bus signal.

Moreover in accordance with an embodiment of the invention, the integrated circuit system may include at least one configurable logic device.

Further in accordance with an embodiment of the invention, the integrated circuit system may include, an antifuse configurable logic die and programmer die which may be connected by the use of Through-Silicon-Via.

Additionally there is a growing need to reduce the impact of inter-chip interconnects. In fact, interconnects may be now dominating IC performance and power. One solution to shorten interconnect may be to use a 3D IC. Currently, the only known way for general logic 3D IC is to integrate finished device one on top of the other by utilizing Through-Silicon-Vias as now called TSVs. The problem with TSVs may be that their large size, usually a few microns each, may severely limit the number of connections that can be made. Some embodiments of the invention may provide multiple alternatives to constructing a 3D IC wherein many connections may be made less than one micron in size, thus enabling the use of 3D IC technology for most device applications.

Additionally some embodiments of the invention may offer new device alternatives by utilizing the proposed 3D IC technology.

Unlike prior art, various embodiments of the present invention suggest constructing the programming transistors not in the base silicon diffusion layer but rather above or below the antifuse configurable interconnect circuits. The programming voltage used to program the antifuse may be typically significantly higher than the voltage used for the operational circuits of the device. This may be part of the design of the antifuse structure so that the antifuse may not become accidentally activated. In addition, extra attention, design effort, and silicon resources might be needed to make sure that the programming phase may not damage the operating circuits. Accordingly the incorporation of the antifuse programming transistors in the silicon substrate may need attention and extra silicon area.

Unlike the operational transistors designed to operate as fast as possible and so to enable fast system performance, the programming circuits could operate relatively slowly. Accordingly, a thin film transistor for the programming circuits could provide the function and could reduce the silicon area.

Alternatively other type of transistors, such as Vacuum FET, bipolar, etc., could be used for the programming circuits and may be placed not in the base silicon but rather above or below the antifuse configurable interconnect.

Yet in another alternative the programming transistors and the programming circuits could be fabricated on SOI wafers which may then be bonded to the configurable logic wafer and connected to it by the use of through-silicon-via (TSV), or through layer via (TLV). An illustrated advantage of using an SOI wafer for the antifuse programming function may be that the high voltage transistors that could be built on it are very efficient and could be used for the programming circuitry including support functions such as the programming controller function. Yet as an additional variation, the programming circuits could be fabricated by an older process on SOI wafers to further reduce cost. Moreover, the programming circuits could be fabricated by a different process technology than the logic wafer process technology. Furthermore, the wafer fab that the programing circuits may be fabricated at may be different than the wafer fab that the logic circuits are fabricated at and located anywhere in the world.

A common objective may be to reduce cost for high volume production without redesign and with minimal additional mask cost. The use of thin-film-transistors, for the programming transistors, may enable a relatively simple and direct volume cost reduction. Instead of embedding antifuses in the isolation layer a custom mask could be used to define vias on substantially all the locations that used to have their respective antifuse activated. Accordingly the same connection between the strips that used to be programmed may now be connected by fixed vias. This may allow saving the cost associated with the fabrication of the antifuse programming layers and their programming circuits. It should be noted that there might be differences between the antifuse resistance and the mask defined via resistance. A conventional way to handle it may be by providing the simulation models for both options so the designer could validate that the design may work properly in both cases.

An additional objective for having the programming circuits above the antifuse layer may be to achieve better circuit density. Many connections may be needed to connect the programming transistors to their respective metal strips. If those connections are going upward they could reduce the circuit overhead by not blocking interconnection routes on the connection layers underneath.

FIG. 1 is a drawing illustration of a programmable device layers structure according to an alternative embodiment of the invention. In this alternative embodiment, there are two layers including antifuses. The first may be designated to configure the logic terrain and, in some cases, may also configure the logic clock distribution. The first antifuse layer could also be used to manage some of the power distribution to save power by not providing power to unused circuits. This layer could also be used to connect some of the long routing tracks and/or connections to the inputs and outputs of the logic cells.

The device fabrication of the example shown in FIG. 1 may start with the semiconductor substrate, such as monocrystalline silicon substrate 102, comprising the transistors used for the logic cells and also the first antifuse layer programming transistors. Thereafter, logic fabric/first antifuse layer 104 may be constructed, which may include multiple layers, such as Metal 1, dielectric, Metal 2, and sometimes Metal 3. These layers may be used to construct the logic cells and often I/O and other analog cells. In this alternative embodiment of the invention, a plurality of first antifuses may be incorporated in the isolation layer between metal 1 and metal 2 or in the isolation layer between metal 2 and metal 3 and the corresponding programming transistors could be embedded in the silicon substrate 102 being underneath the first antifuses. The first antifuses could be used to program logic cells and to connect individual cells to construct larger logic functions. The first antifuses could also be used to configure the logic clock distribution. The first antifuse layer could also be used to manage some of the power distribution to save power by not providing power to unused circuits. This layer could also be used to connect some of the long routing tracks and/or one or more connections to the inputs and outputs of the cells.

Interconnection layer 106 could include multiple layers of long interconnection tracks for power distribution and clock networks, or a portion thereof, in addition to structures already fabricated in the first few layers, for example, logic fabric/first antifuse layer 104.

Second antifuse layer 107 could include many layers, including the antifuse configurable interconnection fabric. It might be called the short interconnection fabric, too. If metal 6 and metal 7 are used for the strips of this configurable interconnection fabric then the second antifuse may be embedded in the dielectric layer between metal 6 and metal 7.

The programming transistors and the other parts of the programming circuit could be fabricated afterward and be on top of the configurable interconnection fabric programming transistors 110. The programming element could be a thin film transistor or other alternatives for over oxide transistors as was mentioned previously. In such case the antifuse programming transistors may be placed over the antifuse layer, which may thereby enable the configurable interconnect in second antifuse layer 107 or logic fabric/first antifuse layer 104. It should be noted that in some cases it might be useful to construct part of the control logic for the second antifuse programming circuits, in the base layers such as silicon substrate 102 and logic fabric/first antifuse layer 104.

The final step may include constructing the connection to the outside 112. The connection could be pads for wire bonding, soldering balls for flip chip, optical, or other connection structures such as those connection structures for TSV.

In another alternative embodiment of the invention the antifuse programmable interconnect structure could be designed for multiple use. The same structure could be used as a part of the interconnection fabric, or as a part of the PLA logic cell, or as part of a Read Only Memory (ROM) function. In an FPGA product it might be desirable to have an element that could be used for multiple purposes. Having resources that could be used for multiple functions could increase the utility of the FPGA device.

Figure 1A:
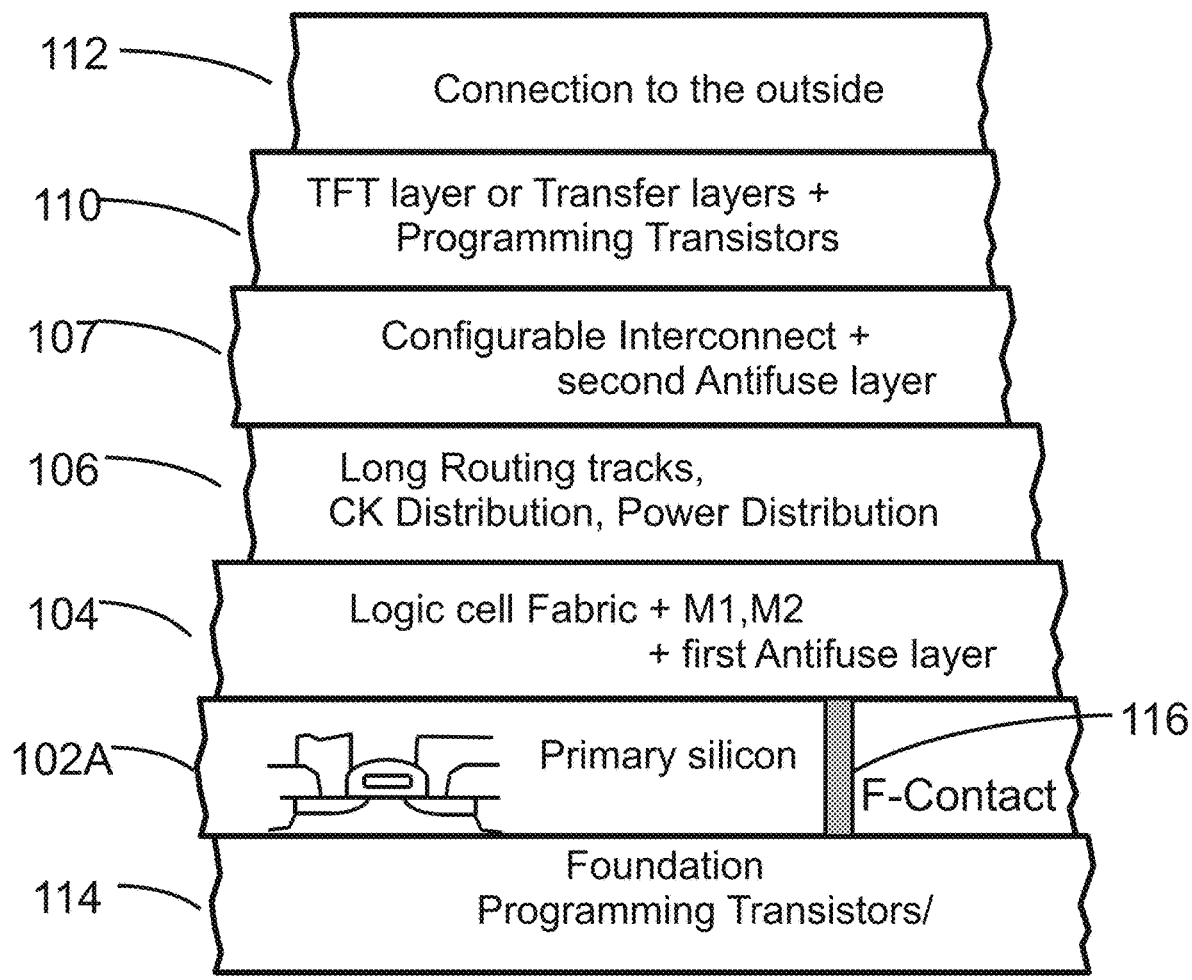
FIG. 1A is an exemplary drawing illustration of a programmable device layers structure.

FIG. 1A is a drawing illustration of a programmable device layers structure according to another alternative embodiment of the invention. In this alternative embodiment, there may be an additional circuit of Foundation layer 114 connected by through silicon via connections 116 to the fabric/first antifuse layer 104 logic or antifuses. This underlying device of circuit of Foundation layer 114 may provide the programming transistor for the logic fabric/first antifuse layer 104. In this way, the programmable device substrate diffusion, such as primary silicon layer 102A, may not be prone to the cost penalty of the programming transistors for the logic fabric/first antifuse layer 104. Accordingly the programming connection of the logic fabric/first antifuse layer 104 may be directed downward to connect to the underlying programming device of Foundation layer 114 while the programming connection to the second antifuse layer 107 may be directed upward to connect to the programming circuit programming transistors 110. This could provide less congestion of the circuit internal interconnection routes.

FIG. 1A is a cut illustration of a programmable device, with two antifuse layers. The programming transistors for the first logic fabric/first antifuse layer 104 could be prefabricated on Foundation layer 114, and then, utilizing "smart-cut", a single crystal, or mono-crystalline, transferred silicon layer 204 may be transferred on which the primary programmable logic of primary silicon layer 102A may be fabricated with advanced logic transistors and other circuits. Then multi-metal layers are fabricated including a lower layer of antifuses in logic fabric/first antifuse layer 104, interconnection layer 106 and second antifuse layer 107 with its configurable interconnects. For the second antifuse layer 107 the programming transistors 110 could be fabricated also utilizing a second "smart-cut" layer transfer.

The term layer transfer in the use herein may be defined as the technological process or method that enables the transfer of very fine layers of crystalline material onto a mechanical support, wherein the mechanical support may be another layer or substrate of crystalline material. For example, the "SmartCut" process, also used herein as the term 'ion-cut' process, together with wafer bonding technology, may enable a "Layer Transfer" whereby a thin layer of a single or mono-crystalline silicon wafer may be transferred from one wafer or substrate to another wafer or substrate. Other specific layer transfer processes may be described or referenced herein.

The terms monocrystalline or mono-crystalline in the use herein of, for example, monocrystalline or mono-crystalline layer, material, or silicon, may be defined as "a single crystal body of crystalline material that contains no large-angle boundaries or twin boundaries as in ASTM F1241, also called monocrystal" and "an arrangement of atoms in a solid that has perfect periodicity (that is, no defects)" as in the SEMATECH dictionary. The terms single crystal and monocrystal are equivalent in the SEMATECH dictionary. The term single crystal in the use herein of, for example, single crystal silicon layer, single crystal layer, may be equivalently defined as monocrystalline.

The term via in the use herein may be defined as "an opening in the dielectric layer(s) through which a riser passes, or in which the walls are made conductive; an area that provides an electrical pathway [connection path] from one metal layer to the metal layer above or below," as in the SEMATECH dictionary. The term through silicon via (TSV) in the use herein may be defined as an opening in a silicon layer(s) through which an electrically conductive riser passes, and in which the walls are made isolative from the silicon layer; a riser that provides an electrical pathway [connection path] from one metal layer to the metal layer above or below. The term through layer via (TLV) in the use herein may be defined as an opening in a layer transferred layer(s) through which an electrically conductive riser passes, wherein the riser may pass through at least one isolating region, for example, a shallow trench isolation (STI) region in the transferred layer, may typically have a riser diameter of less than 200 nm, a riser that provides an electrical pathway [connection path] from one metal layer to the metal layer above or below. In some cases, a TLV may additionally pass thru an electrically conductive layer, and the walls may be made isolative from the conductive layer.

The reference 108 in subsequent figures can be any one of a vast number of combinations of possible preprocessed wafers or layers containing many combinations of transfer layers that fall within the scope of the invention. The term "preprocessed wafer or layer" may be generic and reference number 108 when used in a drawing figure to illustrate an embodiment of the present invention may represent many different preprocessed wafer or layer types including but not limited to underlying prefabricated layers, a lower layer interconnect wiring, a base layer, a substrate layer, a processed house wafer, an acceptor wafer, a logic house wafer, an acceptor wafer house, an acceptor substrate, target wafer, preprocessed circuitry, a preprocessed circuitry acceptor wafer, a base wafer layer, a lower layer, an underlying main wafer, a foundation layer, an attic layer, or a house wafer.

FIG. 1B is a drawing illustration of a generalized preprocessed wafer or layer 108. The wafer or layer 108 may have preprocessed circuitry, such as, for example, logic circuitry, microprocessors, MEMS, circuitry comprising transistors of various types, and other types of digital or analog circuitry including, but not limited to, the various embodiments described herein. Preprocessed wafer or layer 108 may have preprocessed metal interconnects and may include copper or aluminum. The metal layer or layers of interconnect may be constructed of lower (less than about 400° C.) thermal damage resistant metals such as, for example, copper or aluminum, or may be constructed with refractory metals such as tungsten to provide high temperature utility at greater than about 400° C. The preprocessed metal interconnects may be designed and prepared for layer transfer and electrical coupling from preprocessed wafer or layer 108 to the layer or layers to be transferred.

FIG. 1C is a drawing illustration of a generalized transfer layer 109 prior to being attached to preprocessed wafer or layer 108. Transfer layer 109 may be attached to a carrier wafer or substrate during layer transfer. Preprocessed wafer or layer 108 may be called a target wafer, acceptor substrate, or acceptor wafer. The acceptor wafer may have acceptor wafer metal connect pads or strips designed and prepared for electrical coupling to transfer layer 109. Transfer layer 109 may be attached to a carrier wafer or substrate during layer transfer. Transfer layer 109 may have metal interconnects designed and prepared for layer transfer and electrical coupling to preprocessed wafer or layer 108. The metal interconnects now on transfer layer 109 may include copper or aluminum. Electrical coupling from transferred layer 109 to preprocessed wafer or layer 108 may utilize through layer vias (TLVs) as the connection path. Transfer layer 109 may be comprised of single crystal silicon, or mono-crystalline silicon, or doped mono-crystalline layer or layers, or other semiconductor, metal, and insulator materials, layers; or multiple regions of single crystal silicon, or mono-crystalline silicon, or doped mono-crystalline silicon, or other semiconductor, metal, or insulator materials.

Figure 1D:
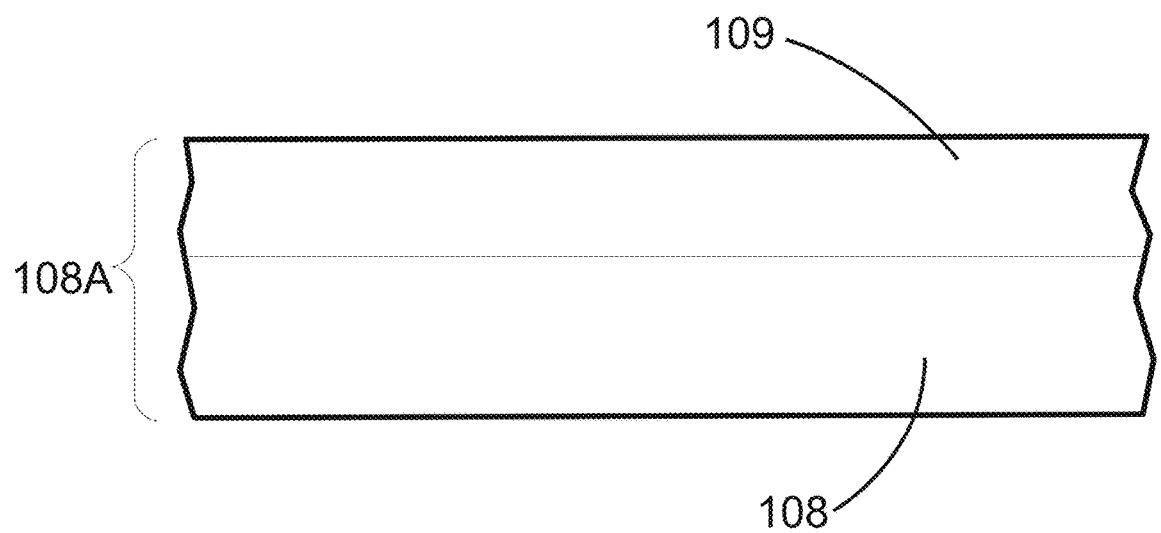

FIG. 1D is a drawing illustration of a preprocessed wafer or layer 108A created by the layer transfer of transfer layer 109 on top of preprocessed wafer or layer 108. The top of preprocessed wafer or layer 108A may be further processed with metal interconnects designed and prepared for layer transfer and electrical coupling from preprocessed wafer or layer 108A to the next layer or layers to be transferred.

Figure 1E:
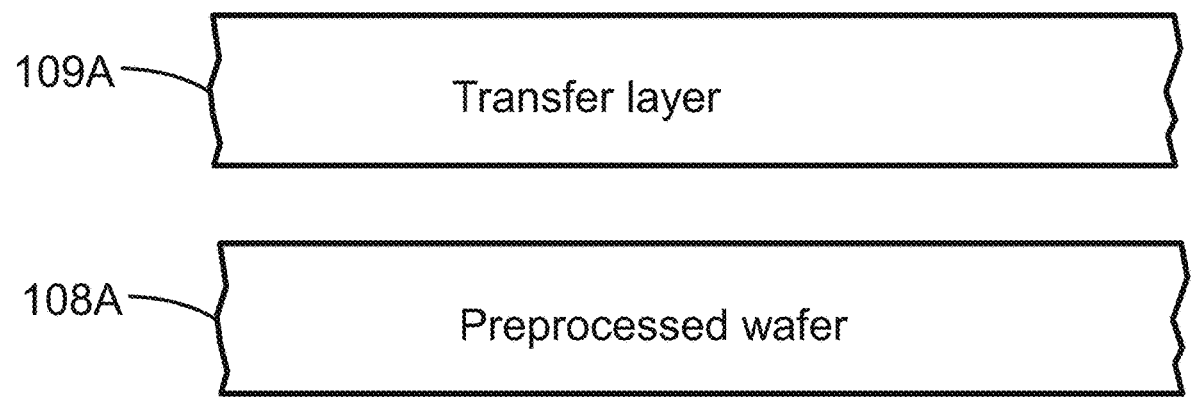

FIG. 1E is a drawing illustration of a generalized transfer layer 109A prior to being attached to preprocessed wafer or layer 108A. Transfer layer 109A may be attached to a carrier wafer or substrate during layer transfer. Transfer layer 109A may have metal interconnects designed and prepared for layer transfer and electrical coupling to preprocessed wafer or layer 108A.

Figure 1F:
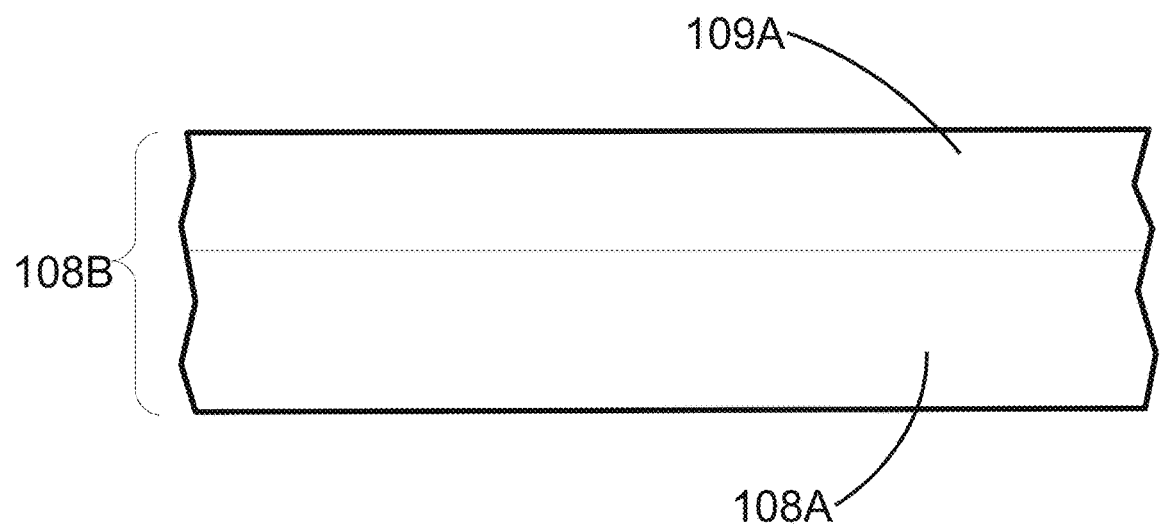

FIG. 1F is a drawing illustration of a preprocessed wafer or layer 108B created by the layer transfer of transfer layer 109A on top of preprocessed wafer or layer 108A. The top of preprocessed wafer or layer 108B may be further processed with metal interconnects designed and prepared for layer transfer and electrical coupling from preprocessed wafer or layer 108B to the next layer or layers to be transferred.

Figure 1G:
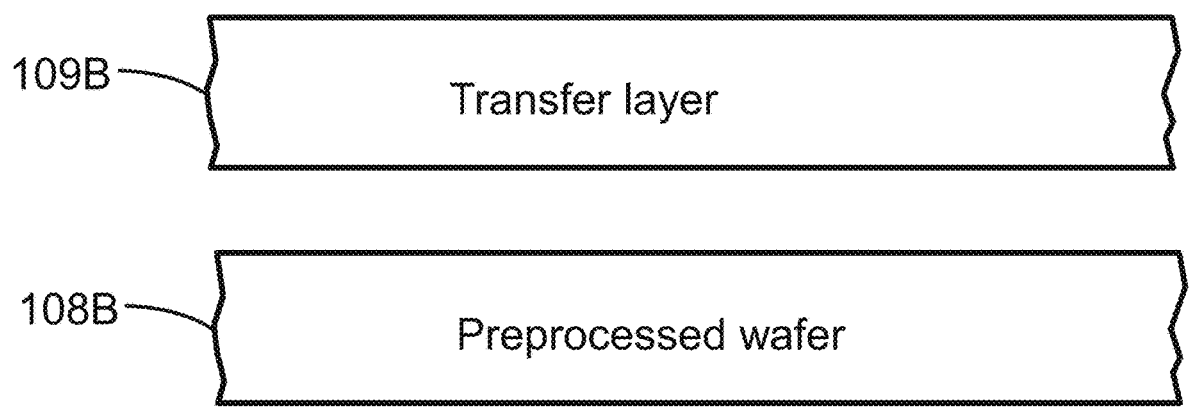

FIG. 1G is a drawing illustration of a generalized transfer layer 109B prior to being attached to preprocessed wafer or layer 108B. Transfer layer 109B may be attached to a carrier wafer or substrate during layer transfer. Transfer layer 109B may have metal interconnects designed and prepared for layer transfer and electrical coupling to preprocessed wafer or layer 108B.

Figure 1H:
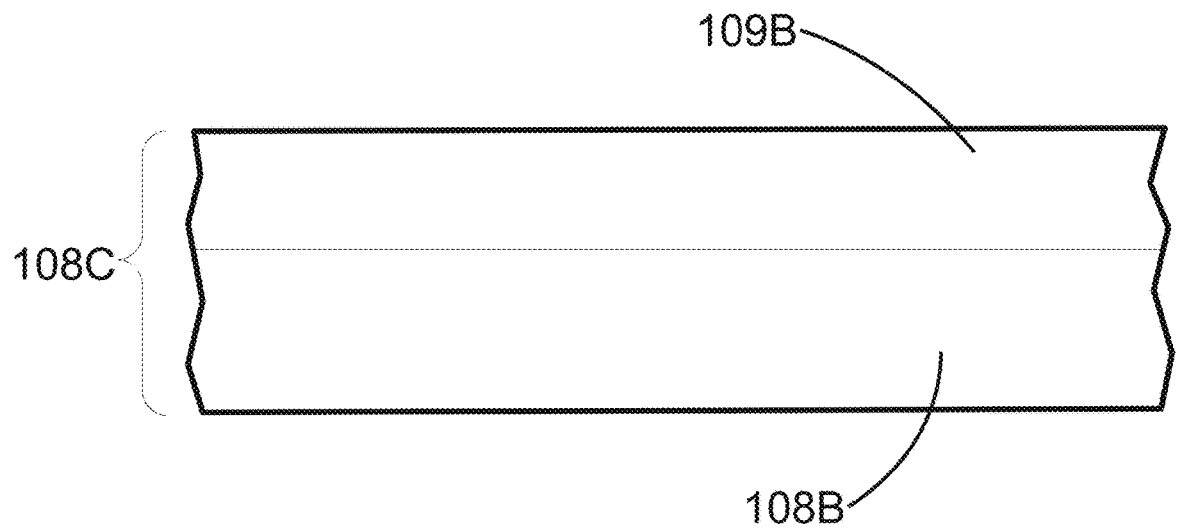

FIG. 1H is a drawing illustration of preprocessed wafer or layer 108C created by the layer transfer of transfer layer 109B on top of preprocessed wafer or layer 108B. The top of preprocessed wafer or layer 108C may be further processed with metal interconnect designed and prepared for layer transfer and electrical coupling from preprocessed wafer or layer 108C to the next layer or layers to be transferred.

Figure 1I:
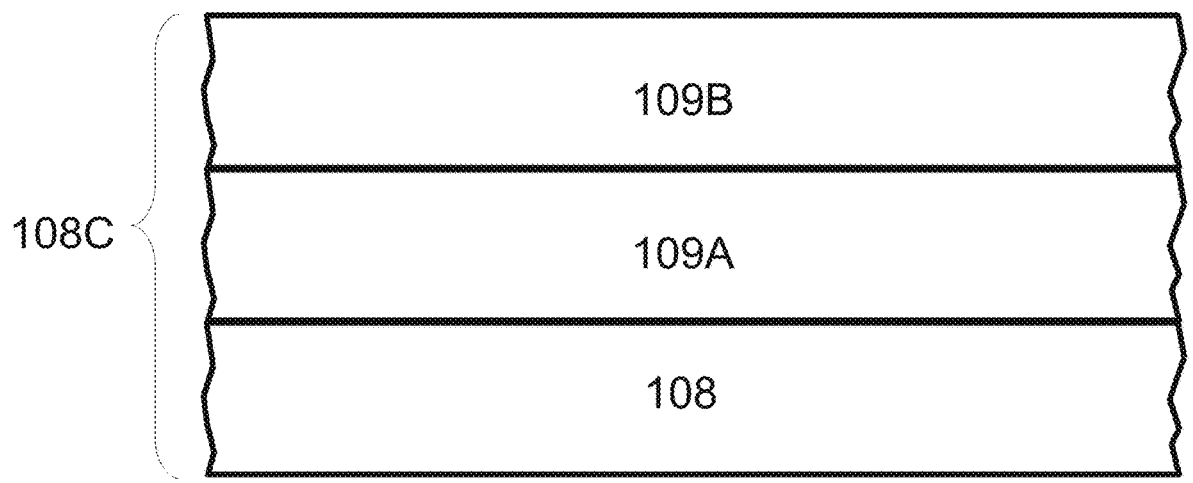

FIG. 1I is a drawing illustration of preprocessed wafer or layer 108C, a 3D IC stack, which may comprise transferred layers 109A and 109B on top of the original preprocessed wafer or layer 108. Transferred layers 109A and 109B and the original preprocessed wafer or layer 108 may include transistors of one or more types in one or more layers, metallization such as, for example, copper or aluminum in one or more layers, interconnections to and between layers above and below, and interconnections within the layer. The transistors may be of various types that may be different from layer to layer or within the same layer. The transistors may be in various organized patterns. The transistors may be in various pattern repeats or bands. The transistors may be in multiple layers involved in the transfer layer. The transistors may be junction-less transistors or recessed channel array transistors. Transferred layers 109A and 109B and the original preprocessed wafer or layer 108 may further comprise semiconductor devices such as resistors and capacitors and inductors, one or more programmable interconnects, memory structures and devices, sensors, radio frequency devices, or optical interconnect with associated transceivers. Transferred layers 109A and 109B and the original preprocessed wafer or layer 108 may further include isolation layers, such as, for example, silicon and/or carbon containing oxides and/or low-k dielectrics and/or polymers, which may facilitate oxide to oxide wafer or substrate bonding and may electrically isolate, for example, one layer, such as transferred layer 109A, from another layer, such as preprocessed wafer or layer 108. The terms carrier wafer or carrier substrate may also be called holder wafer or holder substrate. The terms carrier wafer or substrate used herein may be a wafer, for example, a monocrystalline silicon wafer, or a substrate, for example, a glass substrate, used to hold, flip, or move, for example, other wafers, layers, or substrates, for further processing. The attachment of the carrier wafer or substrate to the carried wafer, layer, or substrate may be permanent or temporary.

This layer transfer process can be repeated many times, thereby creating preprocessed wafers comprising many different transferred layers which, when combined, can then become preprocessed wafers or layers for future transfers. This layer transfer process may be sufficiently flexible that preprocessed wafers and transfer layers, if properly prepared, can be flipped over and processed on either side with further transfers in either direction as a matter of design choice.

The thinner the transferred layer, the smaller the through layer via (TLV) diameter obtainable, due to the potential limitations of manufacturable via aspect ratios. Thus, the transferred layer may be, for example, less than about 2 microns thick, less than about 1 micron thick, less than about 0.4 microns thick, less than about 200 nm thick, or less than about 100 nm thick. The TLV diameter may be less than about 400 nm, less than about 200 nm, less than about 80 nm, less than about 40 nm, or less than about 20 nm. The thickness of the layer or layers transferred according to some embodiments of the present invention may be designed as such to match and enable the best obtainable lithographic resolution capability of the manufacturing process employed to create the through layer vias or any other structures on the transferred layer or layers.

In many of the embodiments of the invention, the layer or layers transferred may be of a crystalline material, for example, mono-crystalline silicon, and after layer transfer, further processing, such as, for example, plasma/RIE or wet etching, may be done on the layer or layers that may create islands or mesas of the transferred layer or layers of crystalline material, for example, mono-crystalline silicon, the crystal orientation of which has not changed. Thus, a mono-crystalline layer or layers of a certain specific crystal orientation may be layer transferred and then processed whereby the resultant islands or mesas of mono-crystalline silicon have the same crystal specific orientation as the layer or layers before the processing. After this processing, the resultant islands or mesas of crystalline material, for example, mono-crystalline silicon, may be still referred to herein as a layer, for example, mono-crystalline layer, layer of mono-crystalline silicon, and so on.

Persons of ordinary skill in the art will appreciate that the illustrations in FIGS. 1 through 1I are exemplary only and are not drawn to scale. Such skilled persons will further appreciate that many variations may be possible such as, for example, the preprocessed wafer or layer 108 may act as a base or substrate layer in a wafer transfer flow, or as a preprocessed or partially preprocessed circuitry acceptor wafer in a wafer transfer process flow. Moreover, layer transfer techniques, such as 'ion-cut' that may form a layer transfer demarcation plane by ion implantation of hydrogen molecules or atoms, or any other layer transfer technique described herein or utilized in industry, may be utilized in the generalized FIG. 1 flows and applied throughout herein. Furthermore, metal interconnect strips may be formed on the acceptor wafer and/or transferred layer to assist the electrical coupling of circuitry between the two layers, and may utilize TLVs. Many other modifications within the scope of the illustrated embodiments of the invention described herein will suggest themselves to such skilled persons after reading this specification. Thus the invention is to be limited only by the appended claims.

A technology for such underlying circuitry may be to use the "SmartCut" process. The "SmartCut" process is a well understood technology used for fabrication of SOI wafers. The "SmartCut" process, together with wafer bonding technology, may enable a "Layer Transfer" whereby a thin layer of a single or mono-crystalline silicon wafer may be transferred from one wafer to another wafer. The "Layer Transfer" could be done at less than about 400° C. and the resultant transferred layer could be even less than about 100 nm thick. The transferred layer thickness may typically be about 100 nm, and may be a thin as about 5 nm in currently demonstrated fully depleted SOI (FDSOI) wafer manufacturing by Soitec. In most applications described herein in this invention the transferred layer thickness may be less than about 400 nm and may be less than about 200 nm for logic applications. The process with some variations and under different names may be commercially available by two companies, namely, Soitec (Crolles, France) and SiGen—Silicon Genesis Corporation (San Jose, CA). A room temperature wafer bonding process utilizing ion-beam preparation of the wafer surfaces in a vacuum has been recently demonstrated by Mitsubishi Heavy Industries Ltd., Tokyo, Japan. This process may allow for room temperature layer transfer.

Alternatively, other technology may also be used. For example, other technologies may be utilized for layer transfer as described in, for example, IBM's layer transfer method shown at IEDM 2005 by A. W. Topol, et. al. The IBM's layer transfer method employs a SOI technology and utilizes glass handle wafers. The donor circuit may be high-temperature processed on an SOI wafer, temporarily bonded to a borosilicate glass handle wafer, backside thinned by chemical mechanical polishing of the silicon and then the Buried Oxide (BOX) is selectively etched off. The now thinned donor wafer may be subsequently aligned and low-temperature oxide-to-oxide bonded to the acceptor wafer topside. A low temperature release of the glass handle wafer from the thinned donor wafer may be performed, and then through bond via connections may be made. Additionally, epitaxial liftoff (ELO) technology as shown by P. Demeester, et. al, of IMEC in Semiconductor Science Technology 1993 may be utilized for layer transfer. ELO may make use of the selective removal of a very thin sacrificial layer between the substrate and the layer structure to be transferred. The to-be-transferred layer of GaAs or silicon may be adhesively 'rolled' up on a cylinder or removed from the substrate by utilizing a flexible carrier, such as, for example, black wax, to bow up the to-be-transferred layer structure when the selective etch, such as, for example, diluted Hydrofluoric (HF) Acid, may etch the exposed release layer, such as, for example, silicon oxide in SOI or AlAs. After liftoff, the transferred layer may then be aligned and bonded to the acceptor substrate or wafer. The manufacturability of the ELO process for multilayer layer transfer use was recently improved by J. Yoon, et. al., of the University of Illinois at Urbana-Champaign as described in Nature May 20, 2010. Canon developed a layer transfer technology called ELTRAN—Epitaxial Layer TRANsfer from porous silicon. ELTRAN may be utilized. The Electrochemical Society Meeting abstract No. 438 from year 2000 and the JSAP International July 2001 paper show a seed wafer being anodized in an HF/ethanol solution to create pores in the top layer of silicon, the pores may be treated with a low temperature oxidation and then high temperature hydrogen annealed to seal the pores. Epitaxial silicon may then be deposited on top of the porous silicon and then oxidized to form the SOI BOX. The seed wafer may be bonded to a handle wafer and the seed wafer may be split off by high pressure water directed at the porous silicon layer. The porous silicon may then be selectively etched off leaving a uniform silicon layer.

Figure 2:
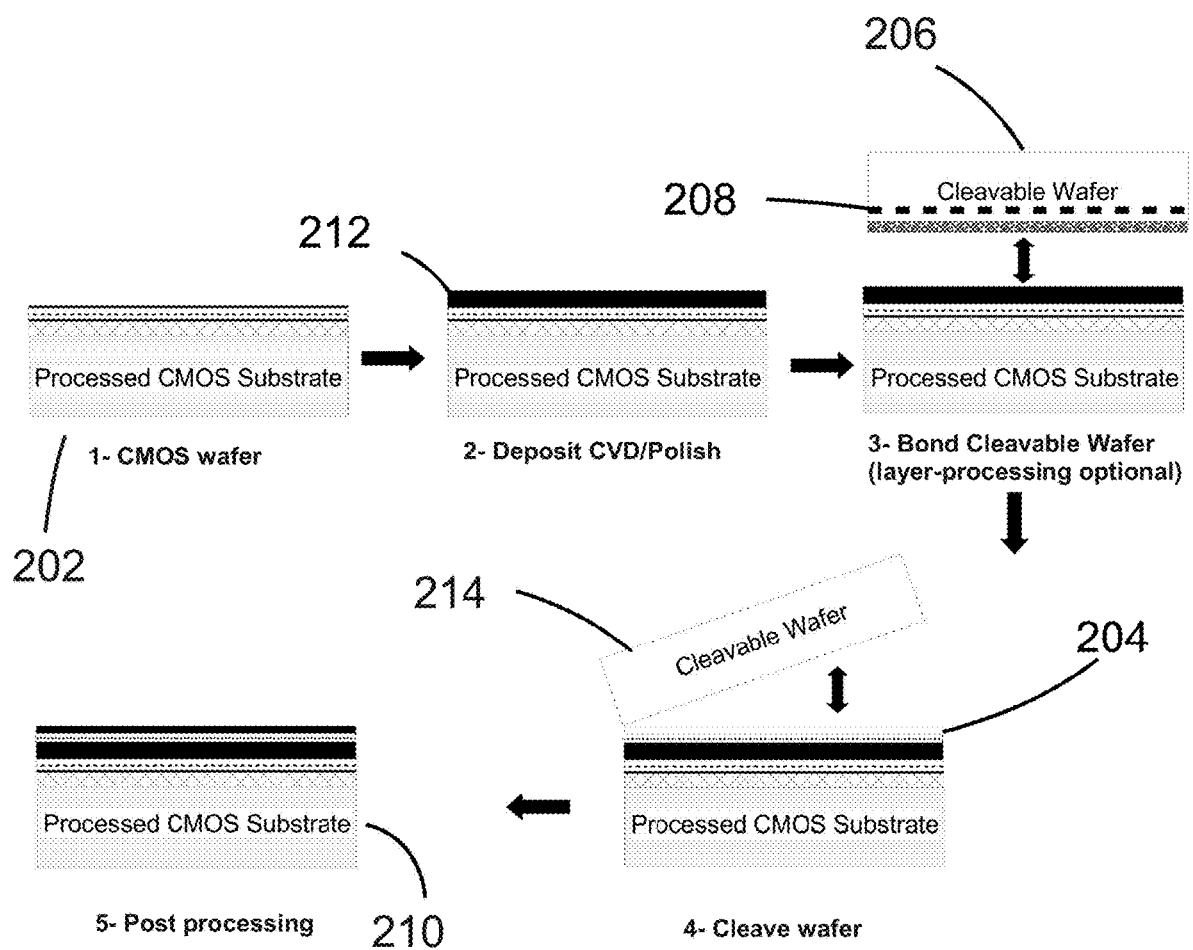
FIG. 2 is an exemplary drawing illustration of a layer transfer process flow.

FIG. 2 is a drawing illustration of a layer transfer process flow. In another illustrative embodiment of the invention, "Layer-Transfer" may be used for construction of the underlying circuitry of Foundation layer 114. Wafer 202 may include a monocrystalline silicon wafer that was processed to construct the underlying circuitry. The wafer 202 could be of the most advanced process or more likely a few generations behind. It could include the programming circuits of Foundation layer 114 and other useful structures and may be a preprocessed CMOS silicon wafer, or a partially processed CMOS, or other prepared silicon or semiconductor substrate. Wafer 202 may also be called an acceptor substrate or a target wafer. An oxide layer 212 may then be deposited on top of the wafer 202 and thereafter may be polished for better planarization and surface preparation. A donor wafer 206 may then be brought in to be bonded to wafer 202. The surfaces of both donor wafer 206 and wafer 202 may be pre-processed for low temperature bonding by various surface treatments, such as an RCA pre-clean that may comprise dilute ammonium hydroxide or hydrochloric acid, and may include plasma surface preparations to lower the bonding energy and enhance the wafer to wafer bond strength. The donor wafer 206 may be pre-prepared for "SmartCut" by an ion implant of an atomic species, such as H+ ions, at the desired depth to prepare the SmartCut line 208. Smart-Cut line 208 may also be called a layer transfer demarcation plane, shown as a dashed line. The SmartCut line 208 or layer transfer demarcation plane may be formed before or after other processing on the donor wafer 206. Donor wafer 206 may be bonded to wafer 202 by bringing the donor wafer 206 surface in physical contact with the wafer 202 surface, and then applying mechanical force and/or thermal annealing to strengthen the oxide to oxide bond. Alignment of the donor wafer 206 with the wafer 202 may be performed immediately prior to the wafer bonding Acceptable bond strengths may be obtained with bonding thermal cycles that do not exceed about 400° C. After bonding the two wafers a SmartCut step may be performed to cleave and remove the top portion 214 of the donor wafer 206 along the SmartCut line 208. The cleaving may be accomplished by various applications of energy to the SmartCut line 208, or layer transfer demarcation plane, such as a mechanical strike by a knife or jet of liquid or jet of air, or by local laser heating, by application of ultrasonic or megasonic energy, or other suitable methods. The result may be a 3D wafer 210 which may include wafer 202 with a transferred silicon layer 204 of mono-crystalline silicon, or multiple layers of materials. Transferred silicon layer 204 may be polished chemically and mechanically to provide a suitable surface for further processing. Transferred silicon layer 204 could be quite thin at the range of about 50-200 nm. The described flow may be called "layer transfer". Layer transfer may be commonly utilized in the fabrication of SOI—Silicon On Insulator—wafers. For SOI wafers the upper surface may be oxidized so that after "layer transfer" a buried oxide—BOX—may provide isolation between the top thin mono-crystalline silicon layer and the bulk of the wafer. The use of an implanted atomic species, such as Hydrogen or Helium or a combination, to create a cleaving plane as described above may be referred to in this document as "SmartCut" or "ion-cut" and may be generally the illustrated layer transfer method.

Persons of ordinary skill in the art will appreciate that the illustrations in FIG. 2 are exemplary only and are not drawn to scale. Such skilled persons will further appreciate that many variations may be possible such as, for example, a heavily doped (greater than 1e20 atoms/cm3) boron layer or silicon germanium (SiGe) layer may be utilized as an etch stop either within the ion-cut process flow, wherein the layer transfer demarcation plane may be placed within the etch stop layer or into the substrate material below, or the etch stop layers may be utilized without an implant cleave process and the donor wafer may be, for example, etched away until the etch stop layer is reached. Such skilled persons will further appreciate that the oxide layer within an SOI or GeOI donor wafer may serve as the etch stop layer, and hence one edge of the oxide layer may function as a layer transfer demarcation plane. Moreover, the dose and energy of the implanted specie or species may be uniform across the surface area of the wafer or may have a deliberate variation, including, for example, a higher dose of hydrogen at the edges of a monocrystalline silicon wafer to promote cleaving. Many other modifications within the scope of the illustrated embodiments of the invention will suggest themselves to such skilled persons after reading this specification. Thus the invention is to be limited only by the appended claims.

Now that a "layer transfer" process may be used to bond a thin mono-crystalline silicon layer transferred silicon layer 204 on top of the preprocessed wafer 202, a standard process could ensue to construct the rest of the desired circuits as illustrated in FIG. 1A, starting with primary silicon layer 102A on the transferred silicon layer 204. The lithography step may use alignment marks on wafer 202 so the following circuits of primary silicon layer 102A and logic fabric/first antifuse layer 104 and so forth could be properly connected to the underlying circuits of Foundation layer 114. An aspect that should be accounted for is the high temperature that may be needed for the processing of circuits of primary silicon layer 102A. The pre-processed circuits on wafer 202 may need to withstand this high temperature associated with the activation of the semiconductor transistors of primary silicon layer 102A fabricated on the transferred silicon layer 204. Those circuits on wafer 202 may include transistors and local interconnects of poly-crystalline silicon (polysilicon or poly) and some other type of interconnection that could withstand high temperature such as tungsten. A processed wafer that can withstand subsequent processing of transistors on top at high temperatures may be a called the "Foundation" or a foundation wafer, layer or circuitry. An illustrated advantage of using layer transfer for the construction of the underlying circuits may include having the transferred silicon layer 204 be very thin which may enable the through silicon via connections 116, or through layer vias (TLVs), to have low aspect ratios and be more like normal contacts, which could be made very small and with minimum area penalty. The thin transferred layer may also allow conventional direct through-layer alignment techniques to be performed, thus increasing the density of through silicon via connections 116.

There may be a few alternative methods to construct the top transistors precisely aligned to the underlying pre-fabricated layers such as pre-processed wafer or layer 108, utilizing "SmartCut" layer transfer and not exceeding the temperature limit, typically about 400° C., of the underlying pre-fabricated structure, which may include low melting temperature metals or other construction materials such as, for example, aluminum or copper. As the layer transfer may be less than about 200 nm thick, then the transistors defined on it could be aligned precisely to the top metal layer of the pre-processed wafer or layer 108 as may be needed and those transistors may have state of the art layer to layer misalignment capability, for example, less than about 40 nm misalignment or less than about 4 nm misalignment, as well as through layer via, or layer to layer metal connection, diameters of less than about 50 nm, or even less than about 20 nm. The thinner the transferred layer, the smaller the through layer via diameter obtainable, due to the potential limitations of manufacturable via aspect ratios. The transferred layer may be, for example, less than about 2 microns thick, less than about 1 micron thick, less than about 0.4 microns thick, less than about 200 nm thick, or less than about 100 nm thick.

The term alignment mark in the use herein may be defined as "an image selectively placed within or outside an array for either testing or aligning, or both [ASTM F127-84], also called alignment key and alignment target," as in the SEMATECH dictionary. The alignment mark may, for example, be within a layer, wafer, or substrate of material processing or to be processed, and/or may be on a photomask or photoresist image, or may be a calculated position within, for example, a lithographic wafer stepper's software or memory.

Novel monolithic 3D memory technologies utilizing material resistance changes may be constructed in a similar manner. There may be many types of resistance-based memories including phase change memory, Metal Oxide memory, resistive RAM (RRAM), memristors, solid-electrolyte memory, ferroelectric RAM, MRAM, etc. Background information on these resistive-memory types may be given in "Overview of candidate device technologies for storage-class memory," IBM Journal of Research and Development, vol.52, no.4.5, pp.449-464, July 2008 by Burr, G. W., et. al. The contents of this document are incorporated in this specification by reference.

As illustrated in FIGS. 3A to 3K, a resistance-based zero additional masking steps per memory layer 3D memory may be constructed that is suitable for 3D IC manufacturing. This 3D memory may utilize junction-less transistors and may have a resistance-based memory element in series with a select or access transistor.

Figure 3A:
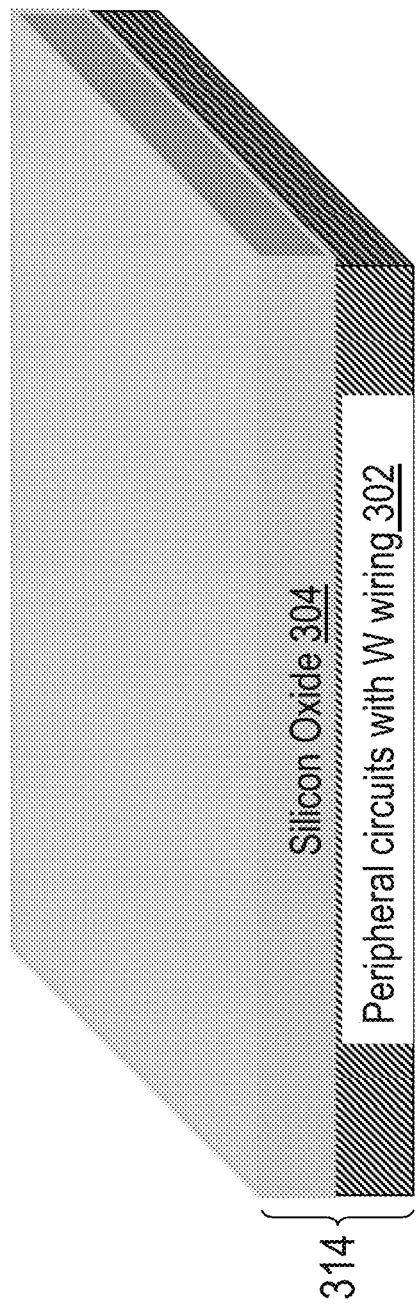

As illustrated in FIG. 3A, a silicon substrate with peripheral circuitry 302 may be constructed with high temperature (greater than about 400° C.) resistant wiring, such as, for example, Tungsten. The peripheral circuitry substrate 302 may include memory control circuits as well as circuitry for other purposes and of various types, such as, for example, analog, digital, RF, or memory. The peripheral circuitry substrate 302 may include peripheral circuits that can withstand an additional rapid-thermal-anneal (RTA) and still remain operational and retain good performance. For this purpose, the peripheral circuits may be formed such that they have had a weak RTA or no RTA for activating dopants. The top surface of the peripheral circuitry substrate 302 may be prepared for oxide wafer bonding with a deposition of a silicon oxide layer 304, thus forming acceptor wafer 314.

Figure 3B:
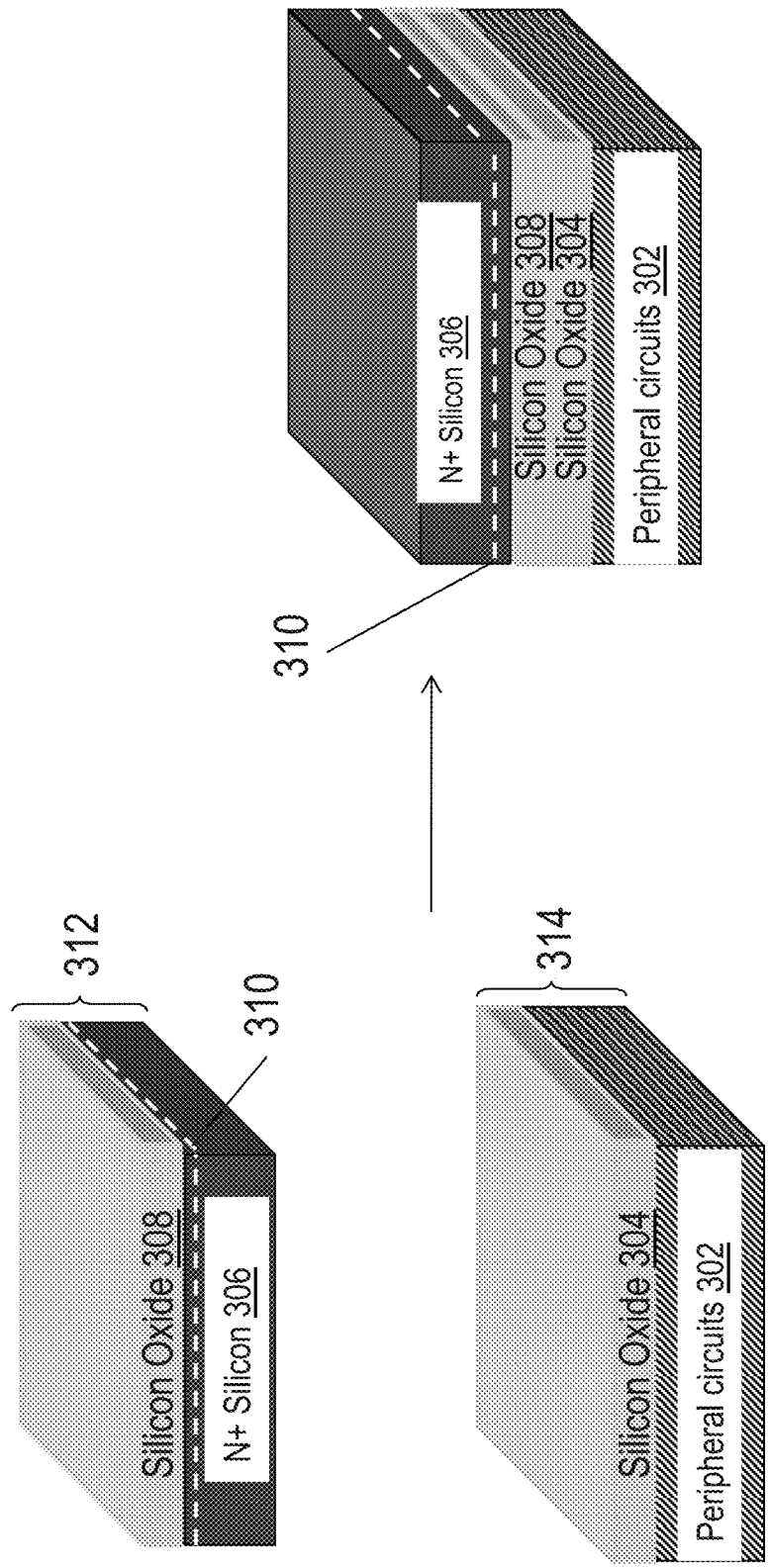

As illustrated in FIG. 3B, a mono-crystalline silicon donor wafer 312 may be, for example, processed to include a wafer sized layer of N+ doping (not shown) which may have a different dopant concentration than the N+ substrate 306. The N+ doping layer may be formed by ion implantation and thermal anneal. A screen oxide layer 308 may be grown or deposited prior to the implant to protect the silicon from implant contamination and to provide an oxide surface for later wafer to wafer bonding. A layer transfer demarcation plane 310 (shown as a dashed line) may be formed in donor wafer 312 within the N+ substrate 306 or the N+ doping layer (not shown) by hydrogen implantation or other methods as previously described. Both the donor wafer 312 and acceptor wafer 314 may be prepared for wafer bonding as previously described and then bonded at the surfaces of oxide layer 304 and oxide layer 308, at a low temperature (less than about 400° C.) suitable for lowest stresses, or a moderate temperature (less than about 900° C.).

Figure 3C:
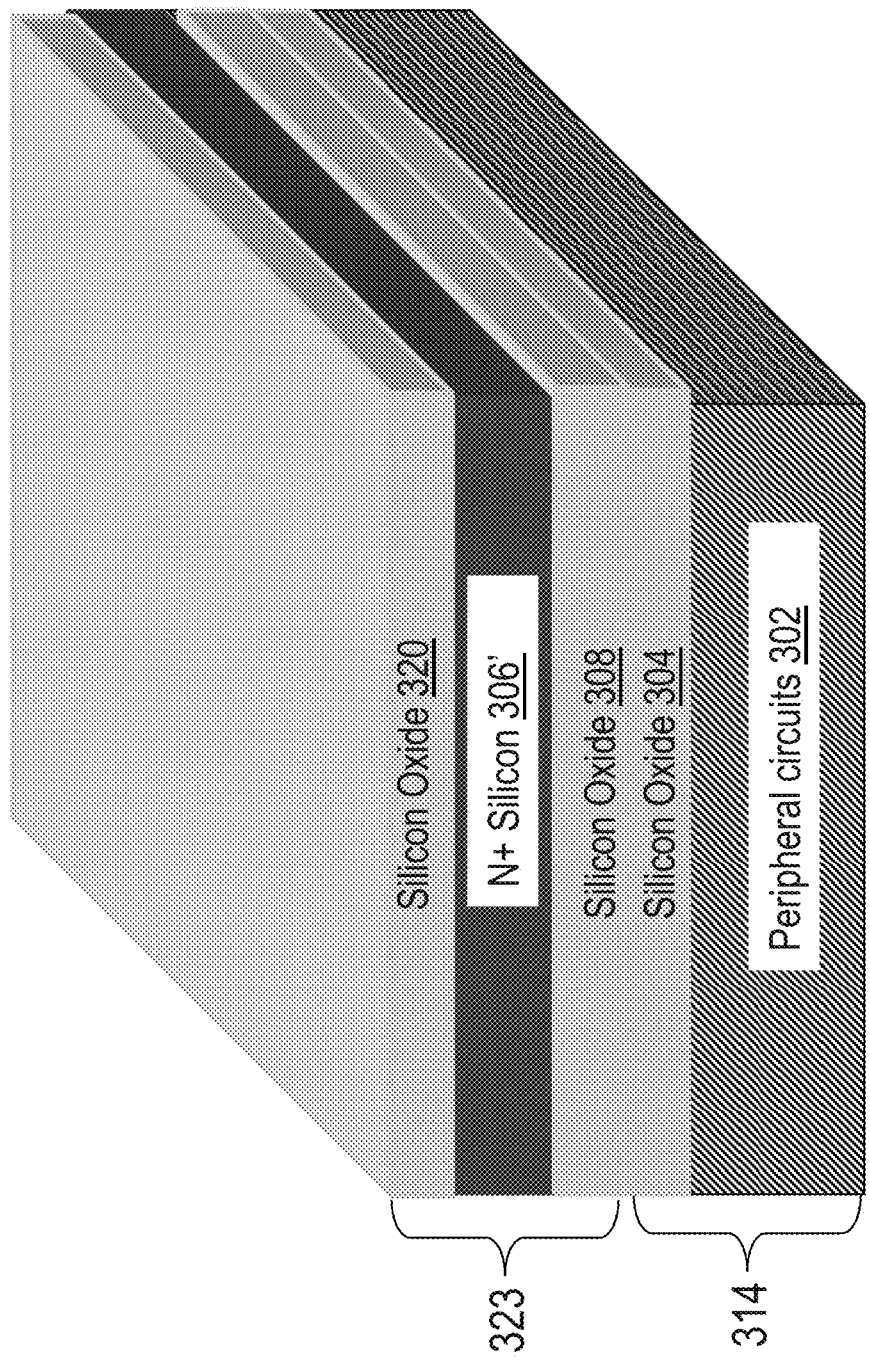

As illustrated in FIG. 3C, the portion of the N+ layer (not shown) and the N+ wafer substrate 306 that are above the layer transfer demarcation plane 310 may be removed by cleaving and polishing, or other processes as previously described, such as, for example, ion-cut or other methods, thus forming the remaining mono-crystalline silicon N+ layer 306'. Remaining N+ layer 306' and oxide layer 308 may have been layer transferred to acceptor wafer 314. The top surface of N+ layer 306' may be chemically or mechanically polished smooth and flat. Now transistors or portions of transistors may be formed and aligned to the acceptor wafer 314 alignment marks (not shown). Oxide layer 320 may be deposited to prepare the surface for later oxide to oxide bonding, leading to the formation of the first Si/SiO2 layer 323 that includes silicon oxide layer 320, N+ silicon layer 306', and oxide layer 308.

Figure 3D:
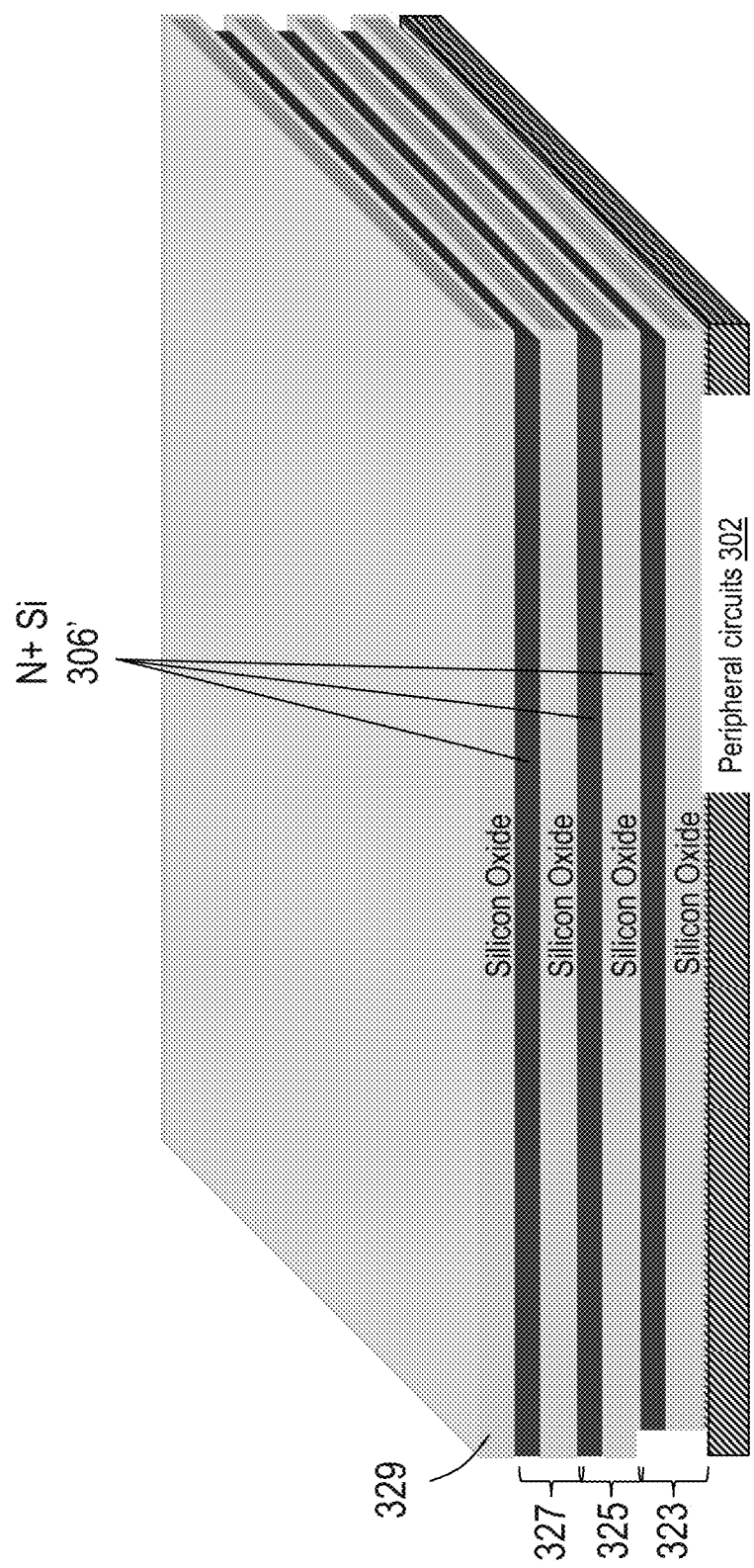

As illustrated in FIG. 3D, additional Si/SiO2 layers, such as, for example, second Si/SiO2 layer 325 and third Si/SiO2 layer 327, may each be formed as described in FIGS. 3A to 3C. Oxide layer 329 may be deposited to electrically isolate the top N+ silicon layer.

Figure 3E:
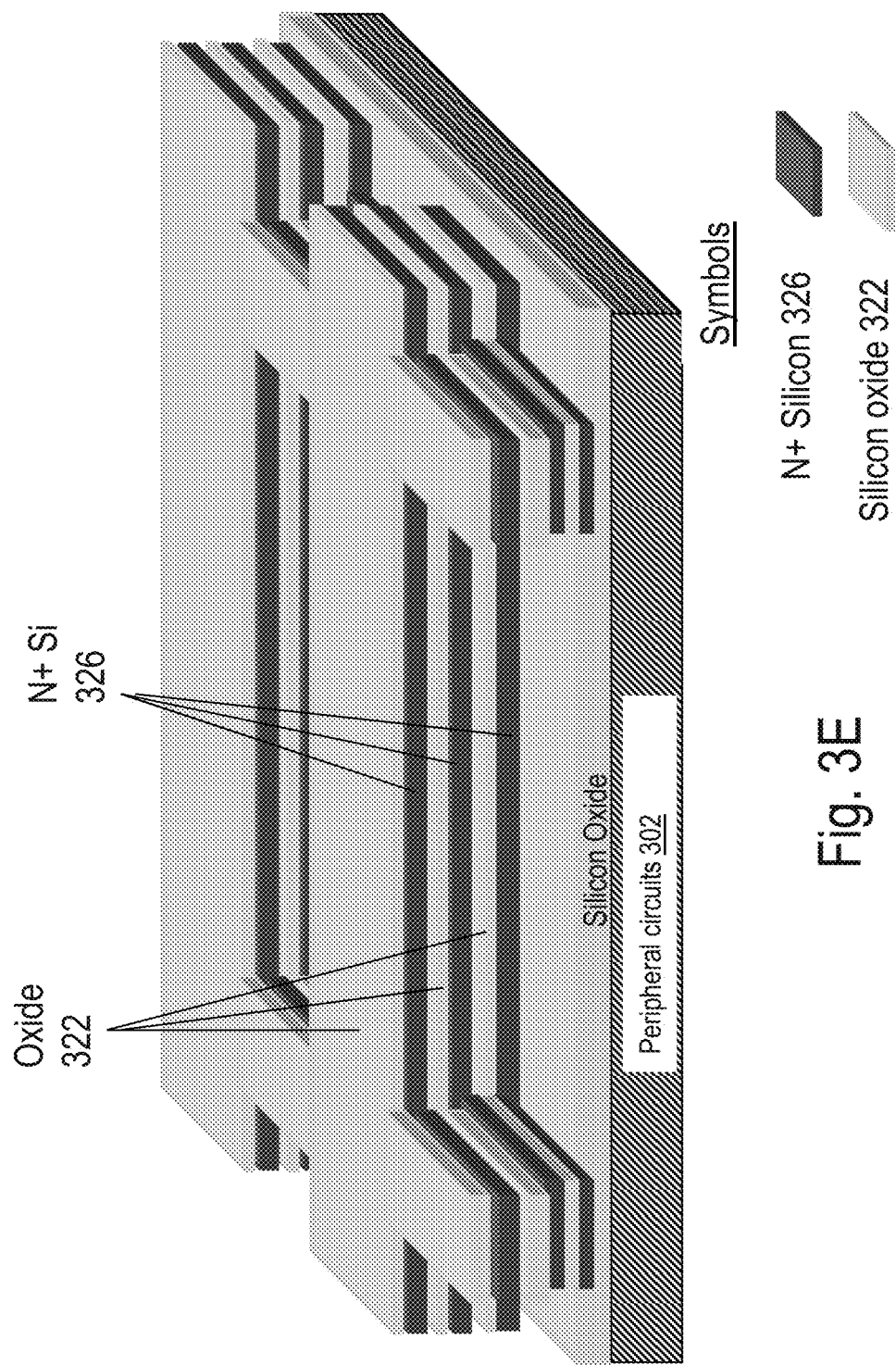

As illustrated in FIG. 3E, oxide layer 329, third Si/SiO2 layer 327, second Si/SiO2 layer 325 and first Si/SiO2 layer 323 may be lithographically defined and plasma/RIE etched to form a portion of the memory cell structure, which may now include regions of N+ silicon 326 and oxide 322. Thus, these transistor elements or portions may have been defined by a common lithography step, which also may be described as a single lithography step, same lithography step, or one lithography step.

Figure 3F:
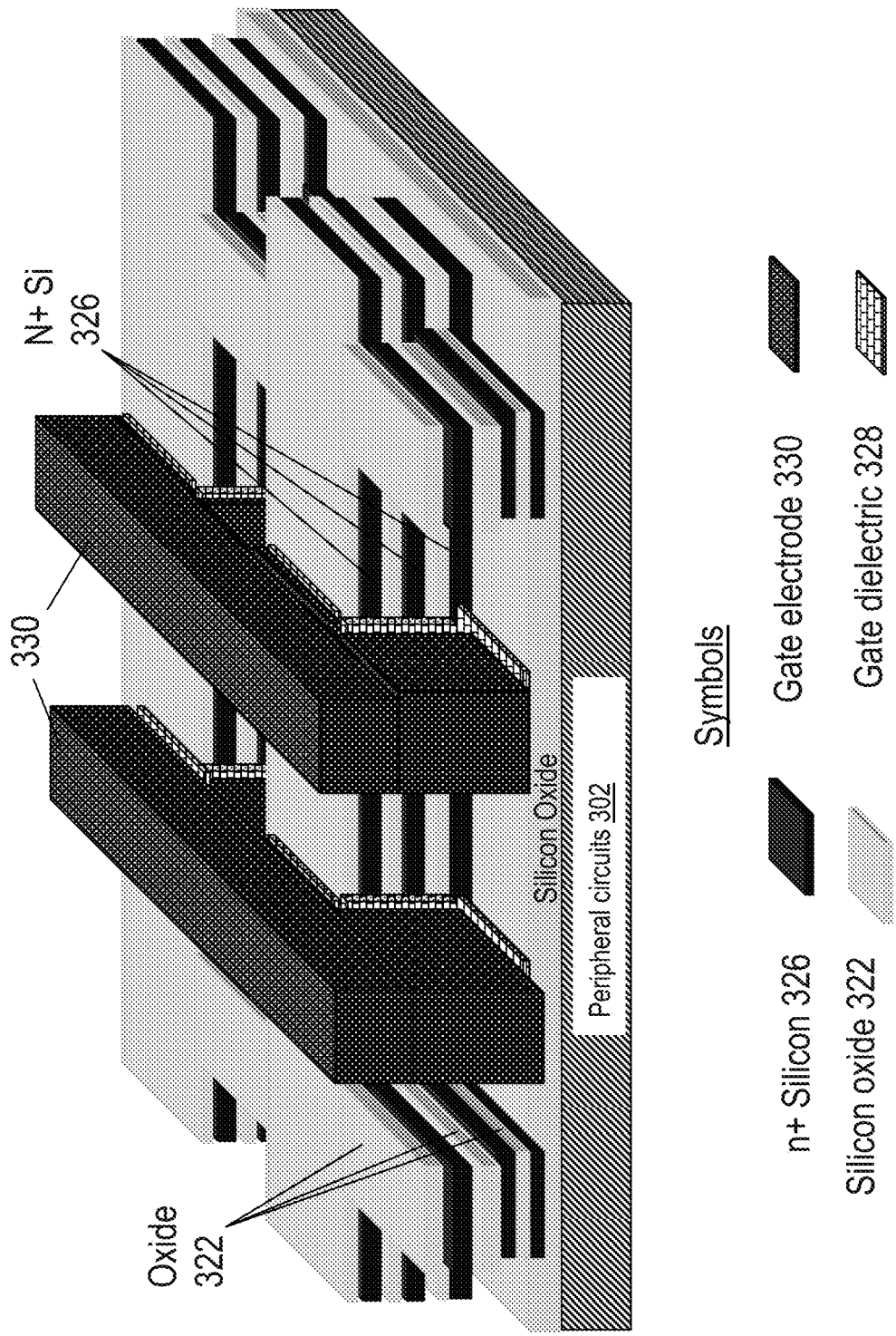

As illustrated in FIG. 3F, a gate dielectric and gate electrode material may be deposited, planarized with a chemical mechanical polish (CMP), and may then be lithographically defined and plasma/RIE etched to form gate dielectric regions 328 which may either be self-aligned to and covered by gate electrodes 330 (shown), or cover the entire N+ silicon 326 and oxide 322 multi-layer structure. The gate stack including gate electrode 330 and gate dielectric 328 may be formed with a gate dielectric, such as, for example, thermal oxide, and a gate electrode material, such as, for example, poly-crystalline silicon. Alternatively, the gate dielectric may be an atomic layer deposited (ALD) material that may be paired with a work function specific gate metal according to industry standard high k metal gate process schemes described previously. Moreover, the gate dielectric may be formed with a rapid thermal oxidation (RTO), a low temperature oxide deposition or low temperature microwave plasma oxidation of the silicon surfaces and then a gate electrode such as, for example, tungsten or aluminum may be deposited.

Figure 3G:
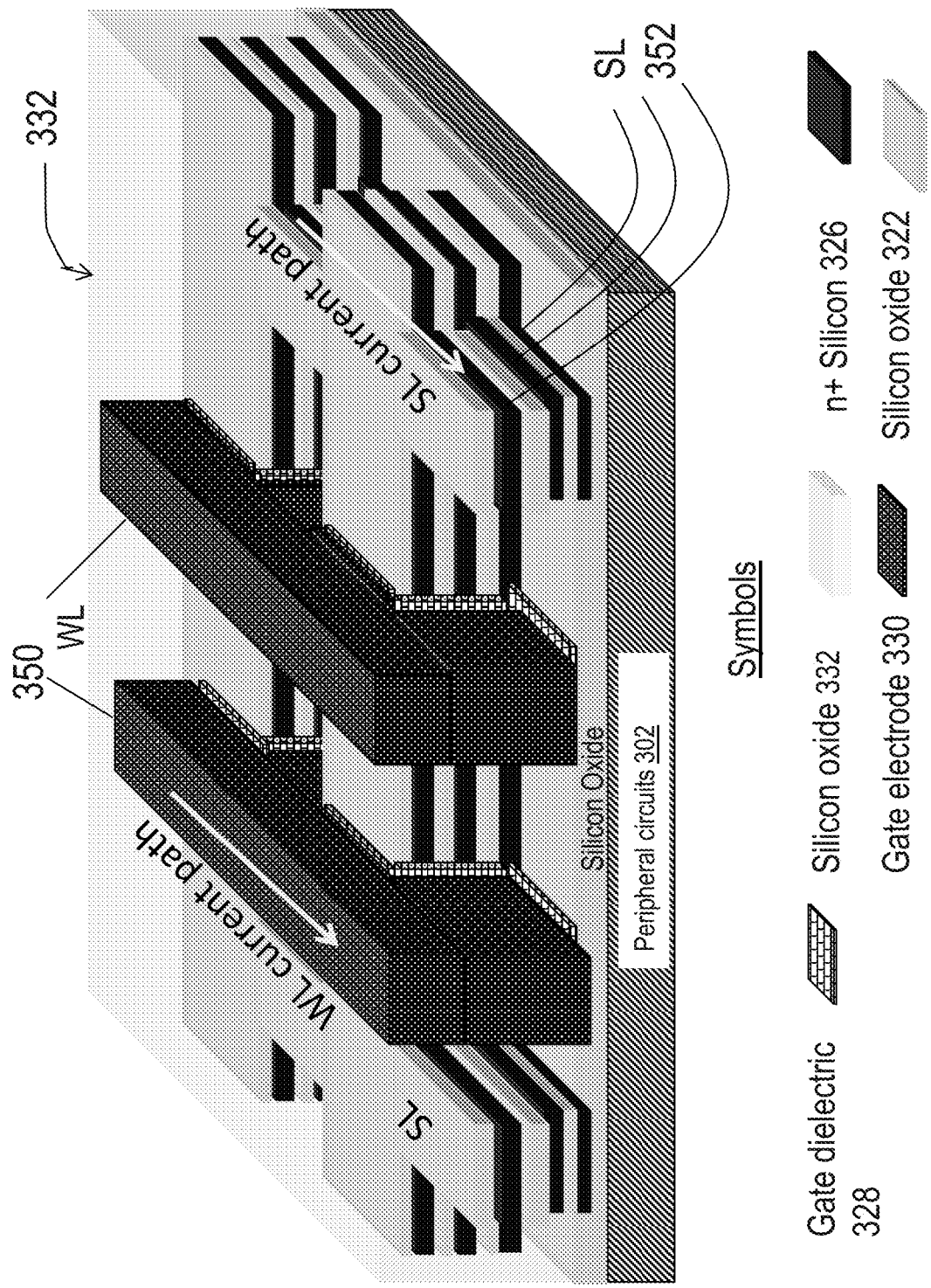

As illustrated in FIG. 3G, the entire structure may be covered with a gap fill oxide 332, which may be planarized with chemical mechanical polishing. The oxide 332 is shown transparent in the figure for clarity in illustration. Also shown are word-line regions (WL) 350, coupled with and composed of gate electrodes 330, and source-line regions (SL) 352, composed of N+ silicon regions 326.

Figure 3H:
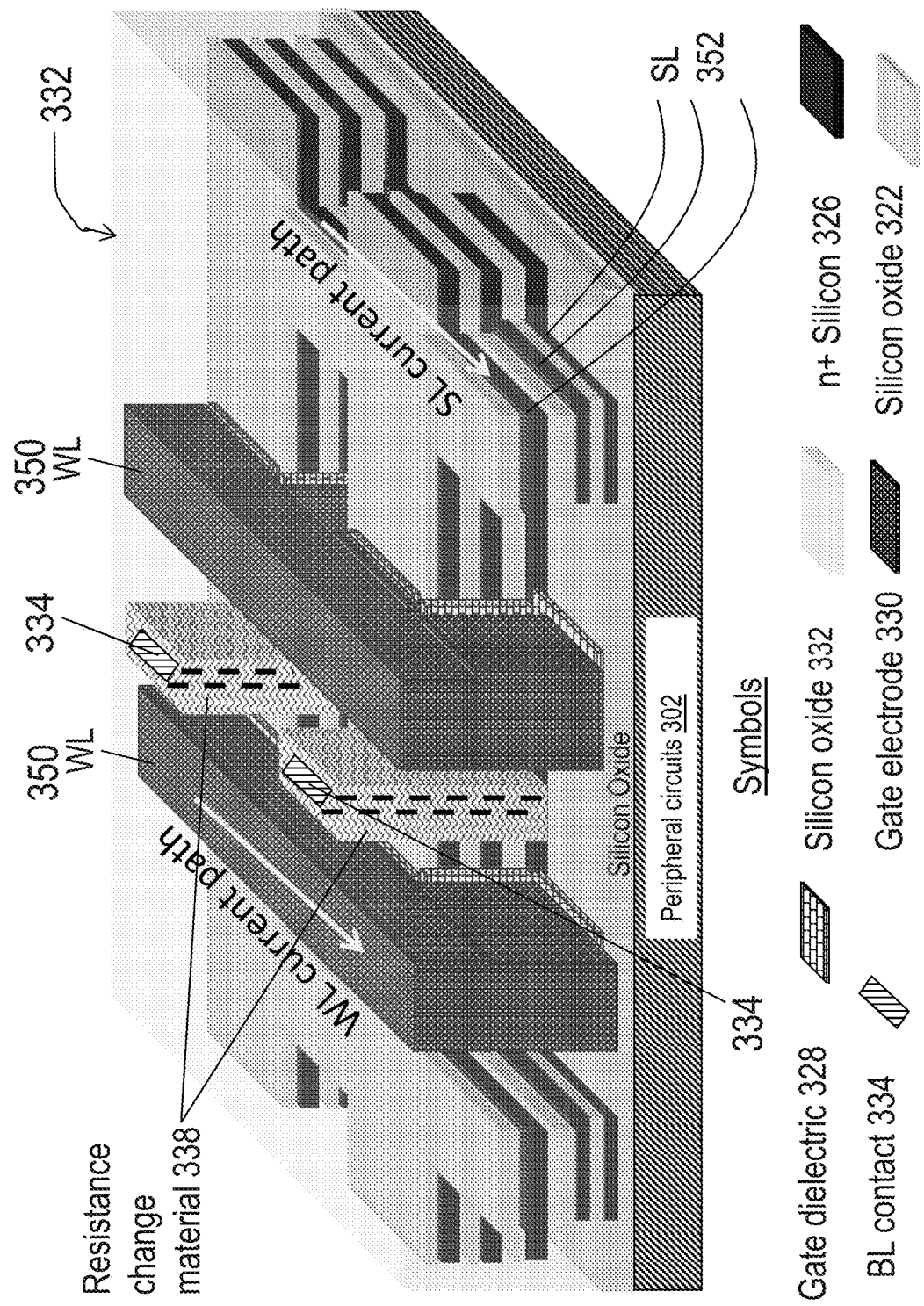

As illustrated in FIG. 3H, bit-line (BL) contacts 334 may be lithographically defined, etched along with plasma/RIE through oxide 332, the three N+ silicon regions 326, and associated oxide vertical isolation regions to connect all memory layers vertically. BL contacts 334 may then be processed by a photoresist removal. Resistive change material 338, such as, for example, hafnium oxide, may then be deposited, for example, with atomic layer deposition (ALD). The electrode for the resistance change memory element may then be deposited by ALD to form the electrode/BL contact 334. The excess deposited material may be polished to planarity at or below the top of oxide 332. Each BL contact 334 with resistive change material 338 may be shared among substantially all layers of memory, shown as three layers of memory in FIG. 3H.

Figure 3I:
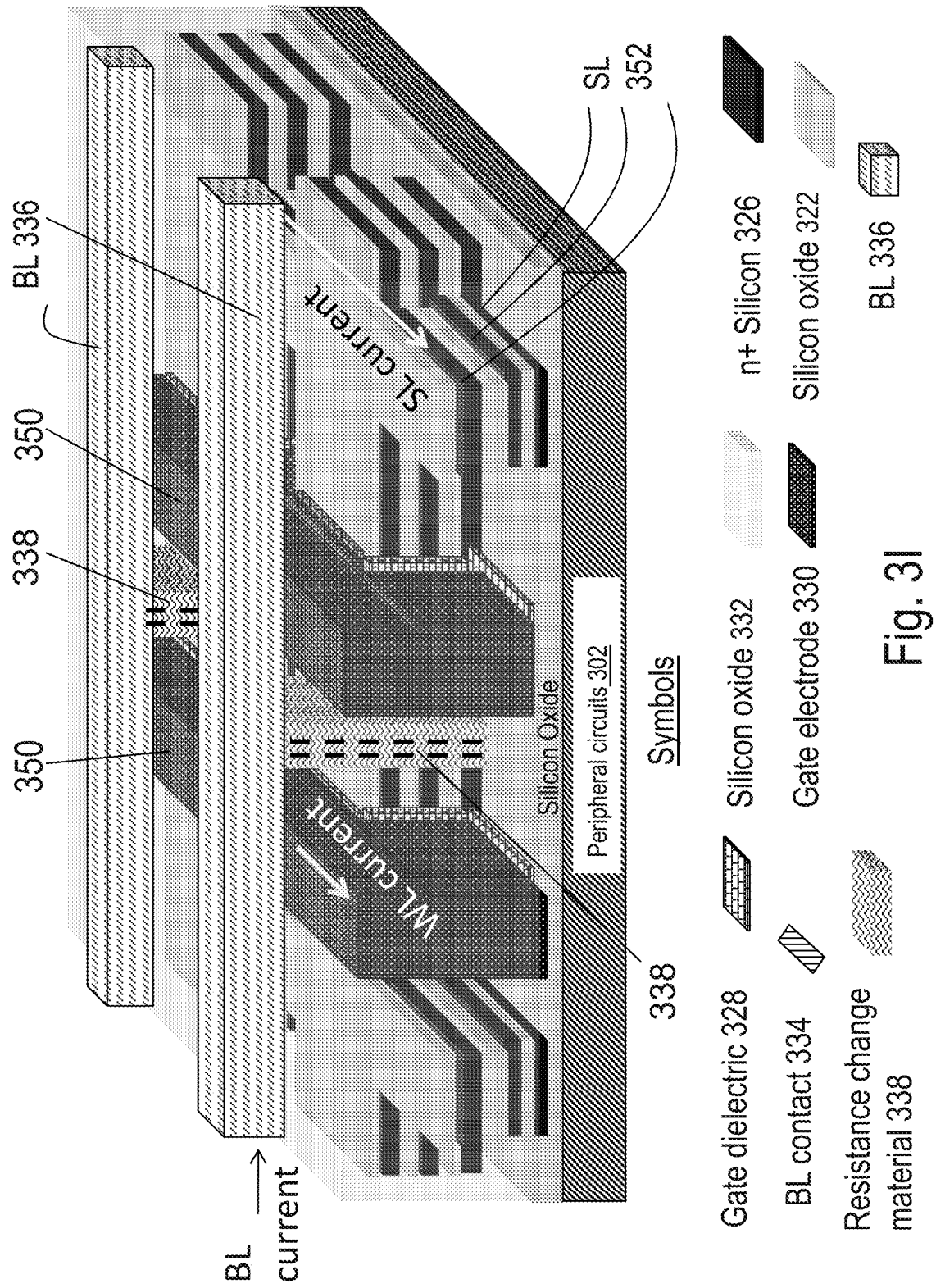

As illustrated in FIG. 3I, BL metal lines 336 may be formed and may connect to the associated BL contacts 334 with resistive change material 338. Contacts and associated metal interconnect lines (not shown) may be formed for the WL and SL at the memory array edges. A through layer via (not shown) may be formed to electrically couple the BL, SL, and WL metallization to the acceptor wafer 314 peripheral circuitry via an acceptor wafer metal connect pad (not shown).

Figure 3J:
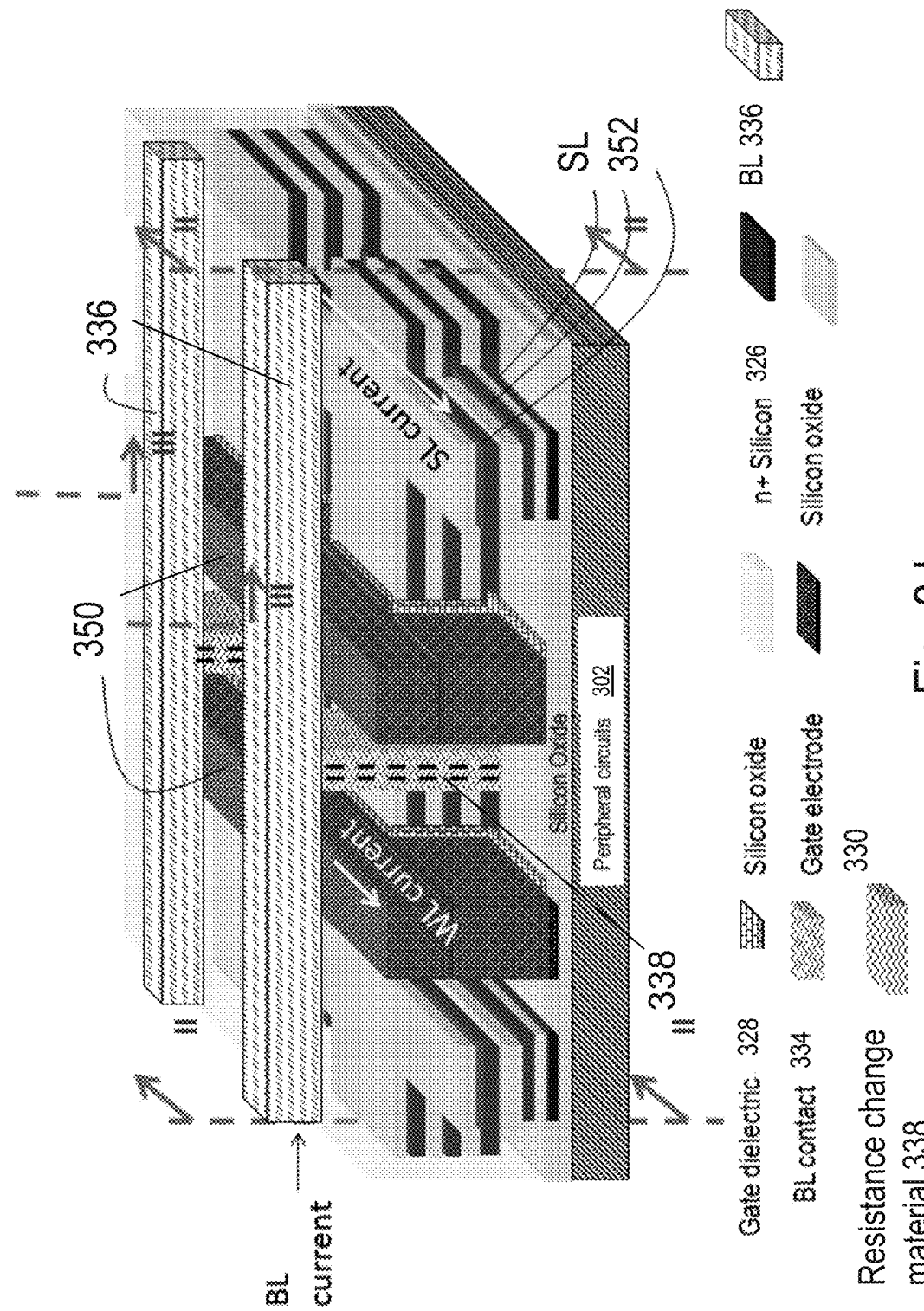

FIG. 3J1 shows a cross sectional cut II of FIG. 3J, while FIG. 3J2 shows a cross-sectional cut III of FIG. 3J. FIG. 3J1 shows BL metal line 336, oxide 332, BL contact/electrode 334, resistive change material 338, WL regions 350, gate dielectric 328, N+ silicon regions 326, and peripheral circuitry substrate 302. The BL contact/electrode 334 may couple to one side of the three levels of resistive change material 338. The other side of the resistive change material 338 may be coupled to N+ regions 326. FIG. 3J2 shows BL metal lines 336, oxide 332, gate electrode 330, gate dielectric 328, N+ silicon regions 326, interlayer oxide region ('ox'), and peripheral circuitry substrate 302. The gate electrode 330 may be common to substantially all six N+ silicon regions 326 and may form six two-sided gated junction-less transistors as memory select transistors.

Figure 3K:
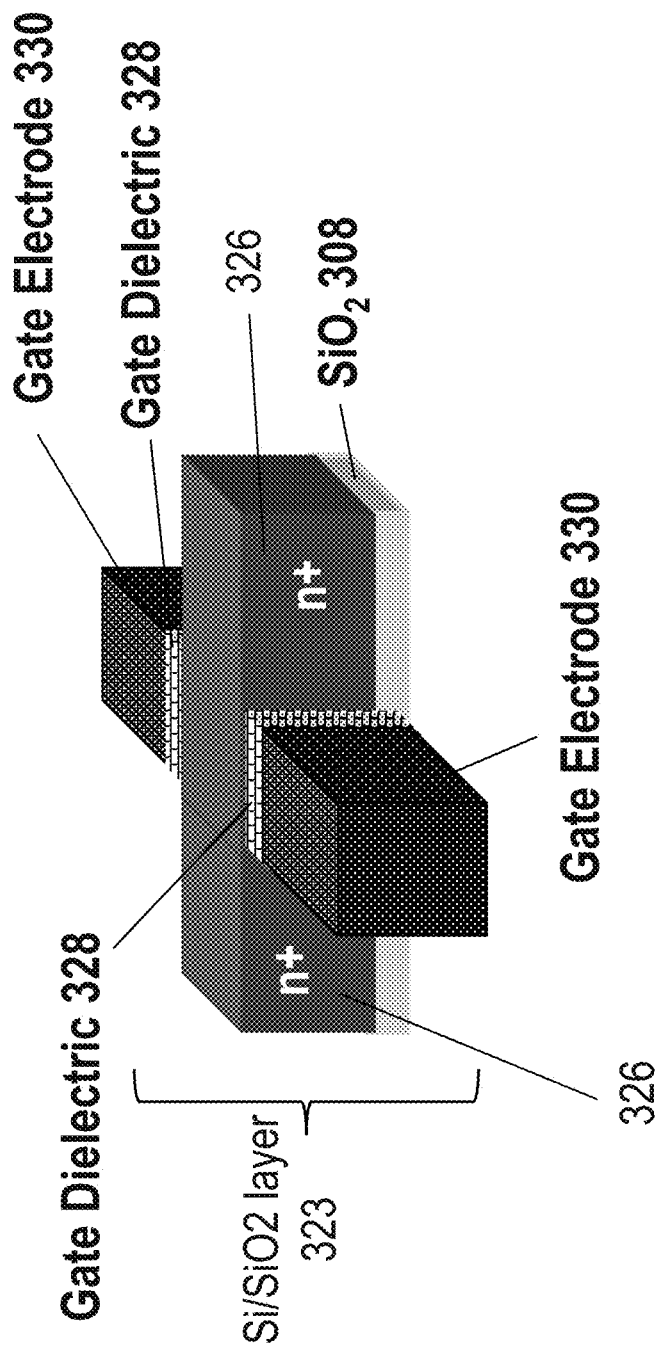

As illustrated in FIG. 3K, a single exemplary two-sided gate junction-less transistor on the first Si/SiO2 layer 323 may include N+ silicon region 326 (functioning as the source, drain, and transistor channel), and two gate electrodes 330 with associated gate dielectrics 328. The transistor may be electrically isolated from beneath by oxide layer 308.

This flow may enable the formation of a resistance-based multi-layer or 3D memory array with zero additional masking steps per memory layer, which may utilize junction-less transistors and may have a resistance-based memory element in series with a select transistor, and may be constructed by layer transfers of wafer sized doped mono-crystalline silicon layers, and this 3D memory array may be connected to an underlying multi-metal layer semiconductor device.

Persons of ordinary skill in the art will appreciate that the illustrations in FIGS. 3A through 3K are exemplary only and are not drawn to scale. Such skilled persons will further appreciate that many variations may be possible such as, for example, the transistors may be of another type such as RCATs. Additionally, doping of each N+ layer may be slightly different to compensate for interconnect resistances. Moreover, the stacked memory layer may be connected to a periphery circuit that may be above the memory stack. Further, each gate of the double gate 3D resistance based memory can be independently controlled for better control of the memory cell. Many other modifications within the scope of the illustrated embodiments of the invention will suggest themselves to such skilled persons after reading this specification. Thus the invention is to be limited only by the appended claims.

As illustrated in FIGS. 4A to 4G, a charge trap based 3D memory with zero additional masking steps per memory layer 3D memory may be constructed that may be suitable for 3D IC manufacturing. This 3D memory may utilize NAND strings of charge trap junction-less transistors with junction-less select transistors constructed in mono-crystalline silicon.

Figure 4A:
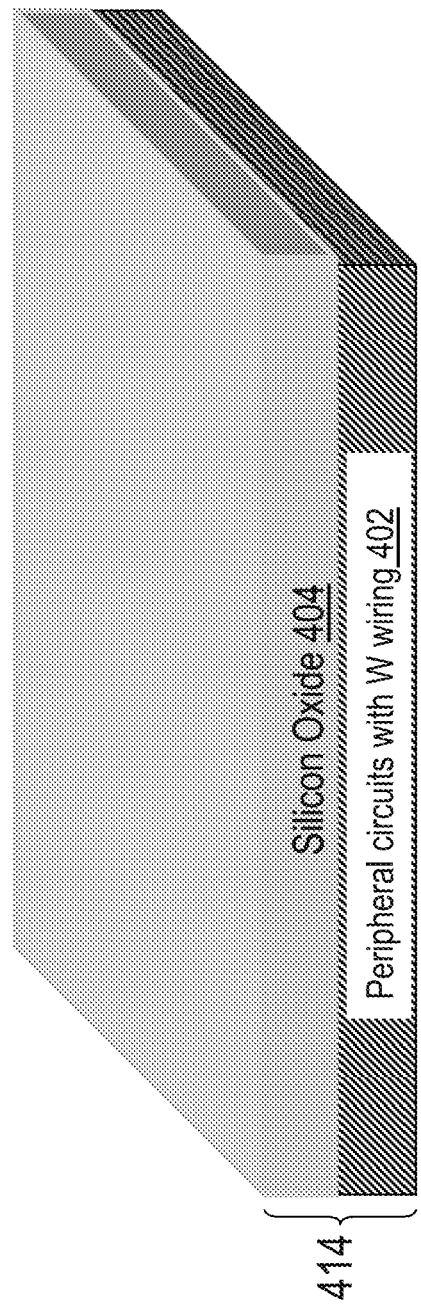
FIGS. 4A-4G are exemplary drawing illustrations of the formation of a charge trap memory transistor.

As illustrated in FIG. 4A, a silicon substrate with peripheral circuitry 402 may be constructed with high temperature (e.g., greater than about 400° C.) resistant wiring, such as, for example, Tungsten. The peripheral circuitry substrate 402 may include memory control circuits as well as circuitry for other purposes and of various types, such as, for example, analog, digital, RF, or memory. The peripheral circuitry substrate 402 may include peripheral circuits that can withstand an additional rapid-thermal-anneal (RTA) or flash anneal and still remain operational and retain good performance. For this purpose, the peripheral circuits may be formed such that they have been subject to a weak RTA or no RTA for activating dopants. The top surface of the peripheral circuitry substrate 402 may be prepared for oxide wafer bonding with a deposition of a silicon oxide layer 404, thus forming acceptor substrate 414.

Figure 4B:
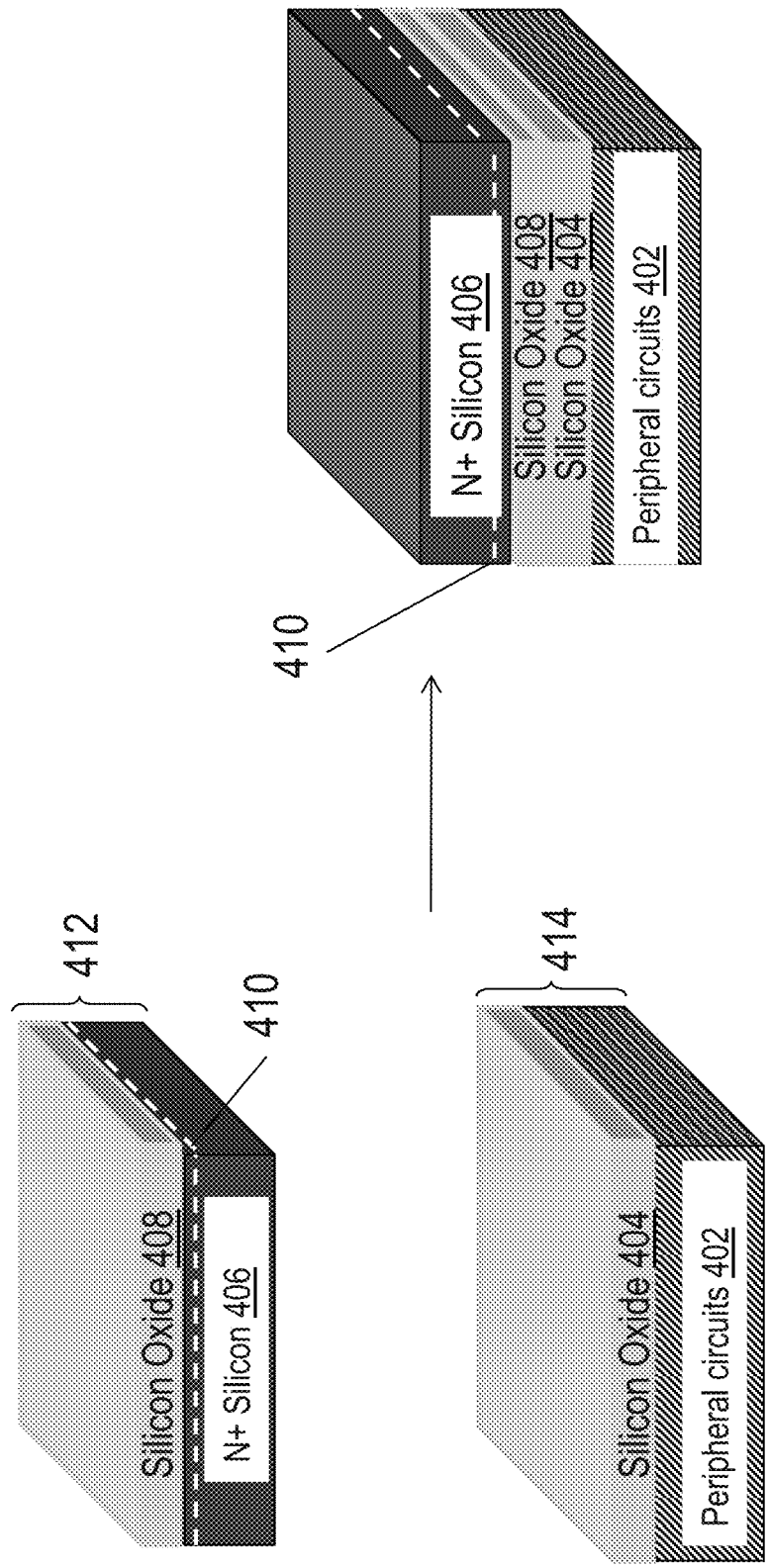

As illustrated in FIG. 4B, a mono-crystalline silicon donor wafer 412 may be processed to include a wafer sized layer of N+ doping (not shown) which may have a different dopant concentration than the N+ substrate 406. The N+ doping layer may be formed by ion implantation and thermal anneal A screen oxide layer 408 may be grown or deposited prior to the implant to protect the silicon from implant contamination and to provide an oxide surface for later wafer to wafer bonding. A layer transfer demarcation plane 410 (shown as a dashed line) may be formed in donor wafer 412 within the N+ substrate 406 or the N+ doping layer (not shown) by hydrogen implantation or other methods as previously described. Both the donor wafer 412 and acceptor substrate 414 may be prepared for wafer bonding as previously described and then bonded at the surfaces of oxide layer 404 and oxide layer 408, at a low temperature (e.g., less than about 400° C. suitable for lowest stresses), or a moderate temperature (e.g., less than about 900° C.).

Figure 4C:
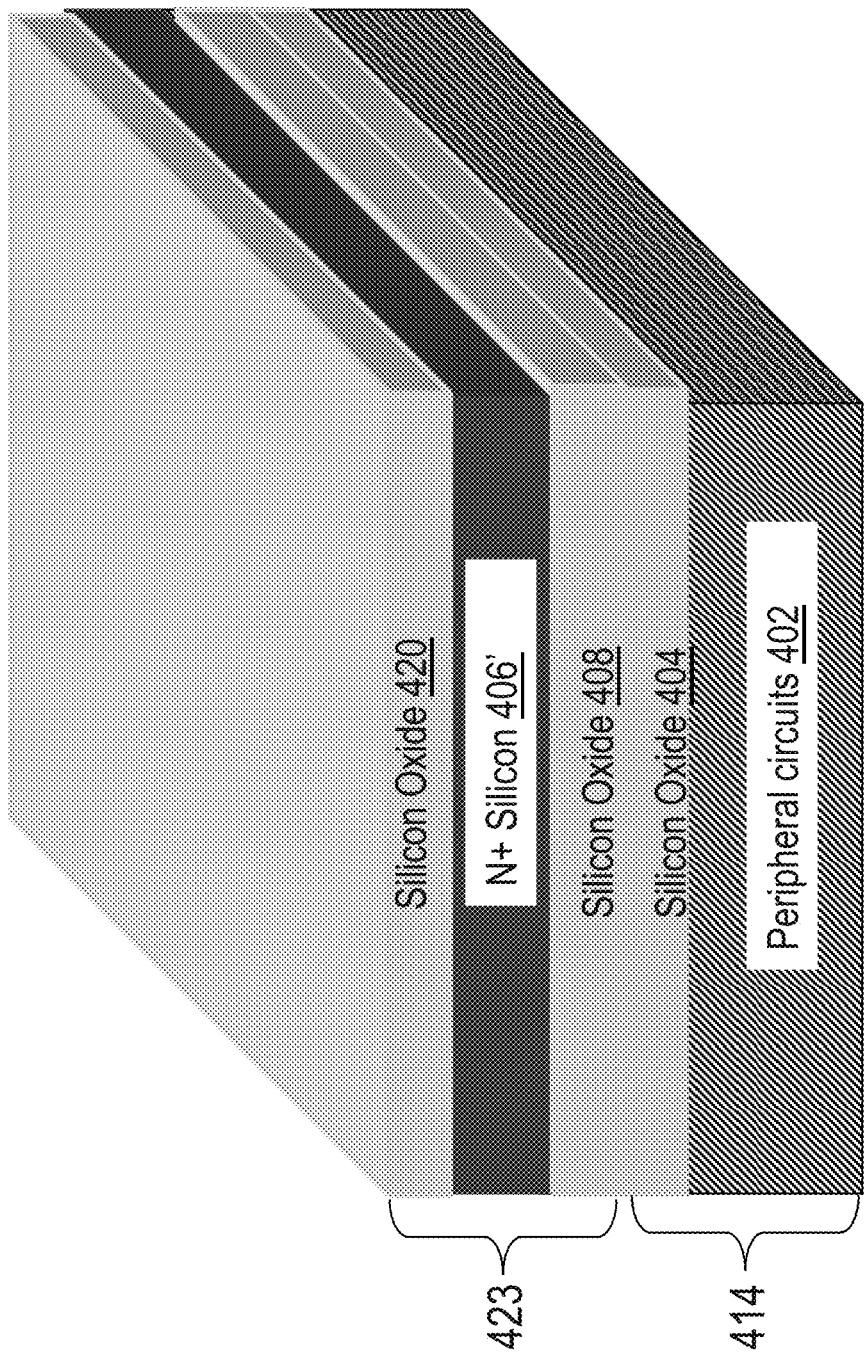

As illustrated in FIG. 4C, the portion of the N+ layer (not shown) and the N+ wafer substrate 406 that may be above the layer transfer demarcation plane 410 may be removed by cleaving and polishing, or other processes as previously described, such as ion-cut or other methods, thus forming the remaining mono-crystalline silicon N+ layer 406'. Remaining N+ layer 406' and oxide layer 408 may have been layer transferred to acceptor substrate 414. The top surface of N+ layer 406' may be chemically or mechanically polished smooth and flat. Oxide layer 420 may be deposited to prepare the surface for later oxide to oxide bonding. This bonding may now form the first Si/SiO2 layer 423 including silicon oxide layer 420, N+ silicon layer 406', and oxide layer 408.

Figure 4D:
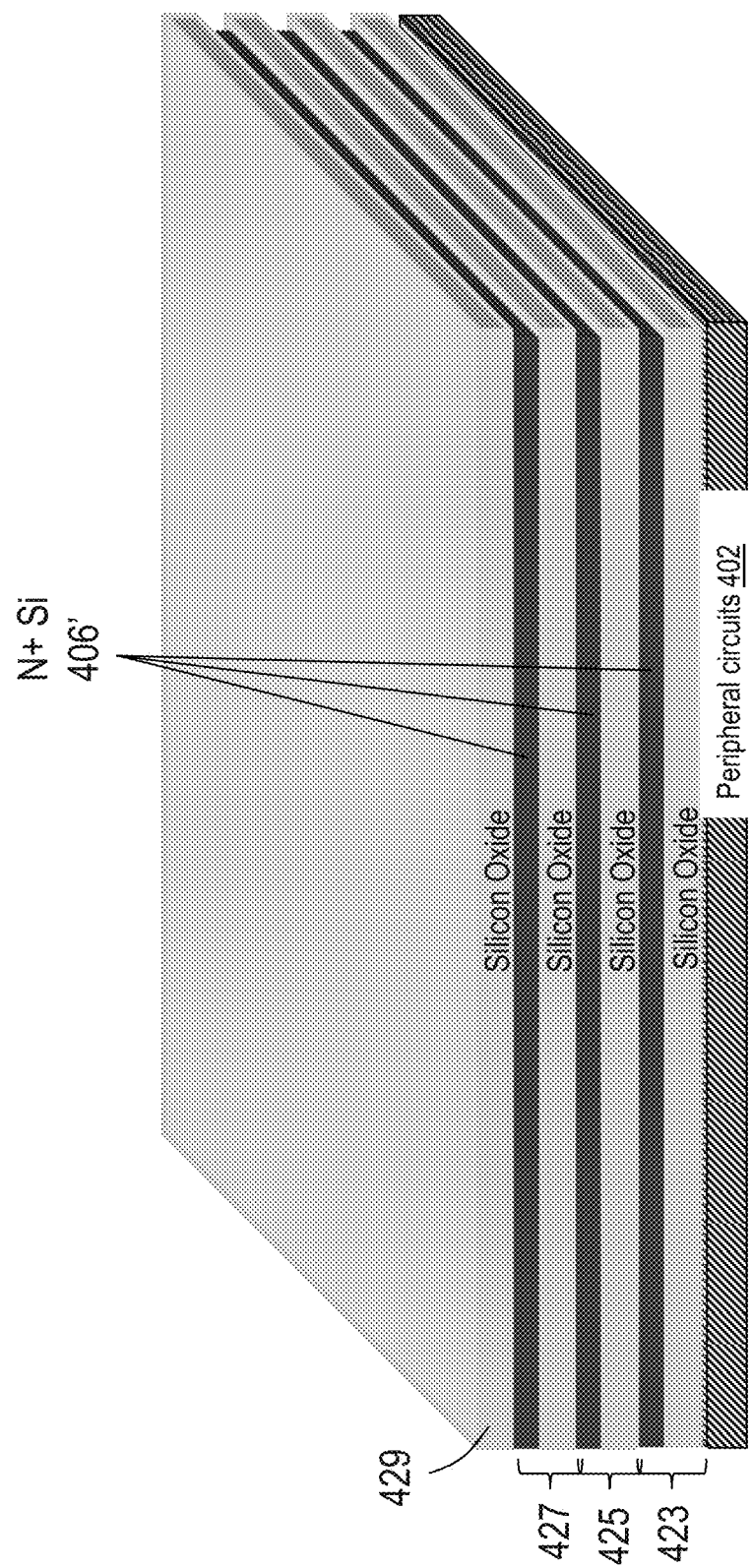

As illustrated in FIG. 4D, additional Si/SiO2 layers, such as, for example, second Si/SiO2 layer 425 and third Si/SiO2 layer 427, may each be formed as described in FIGS. 4A to 4C. Oxide layer 429 may be deposited to electrically isolate the top N+ silicon layer.

Figure 4E:
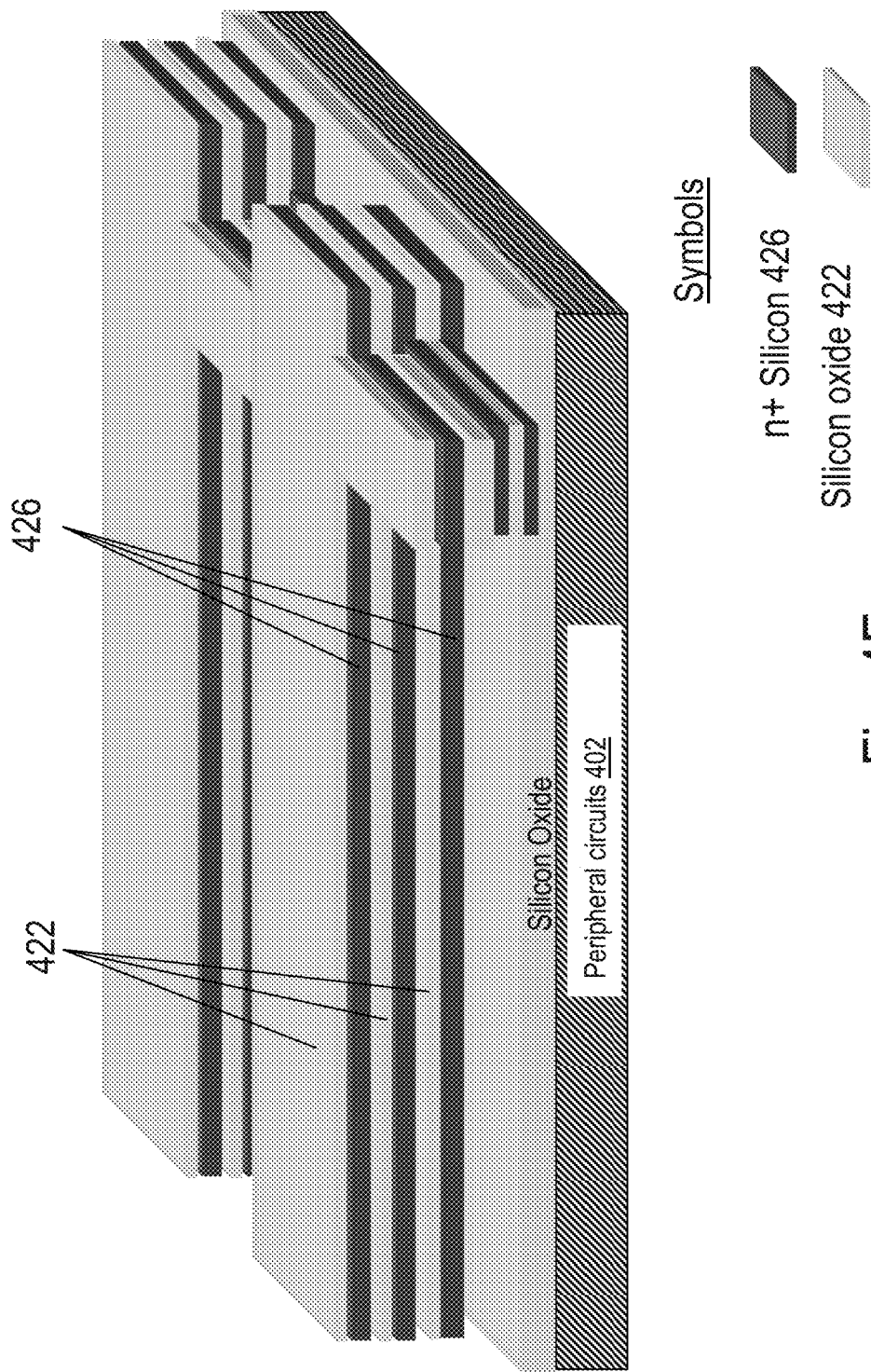

As illustrated in FIG. 4E, oxide layer 429, third Si/SiO2 layer 427, second Si/SiO2 layer 425 and first Si/SiO2 layer 423 may be lithographically defined and plasma/RIE etched to form a portion of the memory cell structure, which may now include regions of N+ silicon 426 and oxide 422. Thus, these transistor elements or portions may have been defined by a common lithography step, which also may be described as a single lithography step, same lithography step, or one lithography step.

Figure 4F:
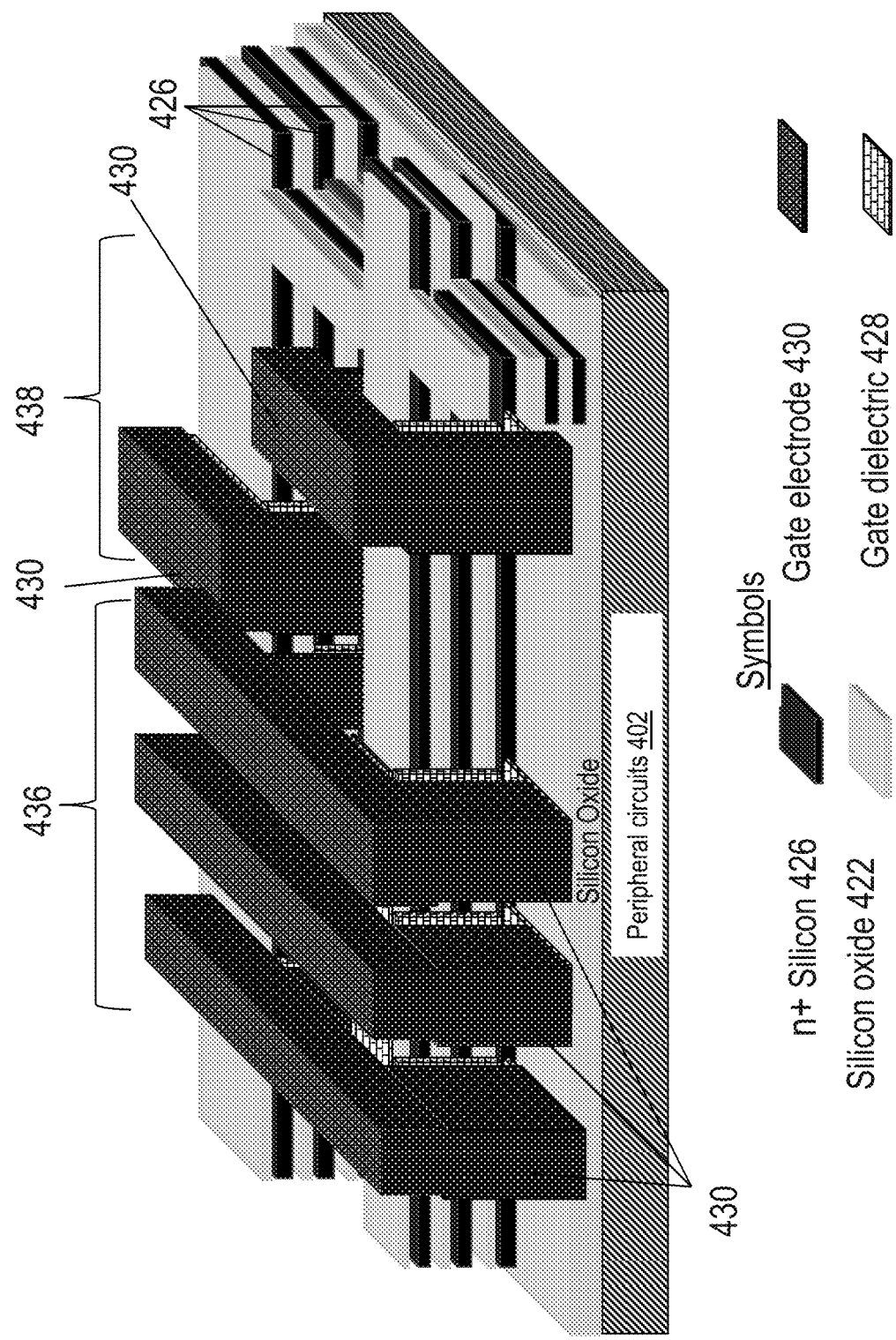

As illustrated in FIG. 4F, a gate stack may be formed with growth or deposition of a charge trap gate dielectric layer, such as thermal oxide and silicon nitride layers (ONO: Oxide-Nitride-Oxide), and a gate metal electrode layer, such as doped or undoped poly-crystalline silicon. The gate metal electrode layer may then be planarized with chemical mechanical polishing. Alternatively, the charge trap gate dielectric layer may include silicon or III-V nano-crystals encased in an oxide. The select transistor area 438 may include a non-charge trap dielectric. The gate metal electrode regions 430 and gate dielectric regions 428 of both the NAND string area 436 and select transistor area 438 may be lithographically defined and plasma/RIE etched.

Figure 4G:
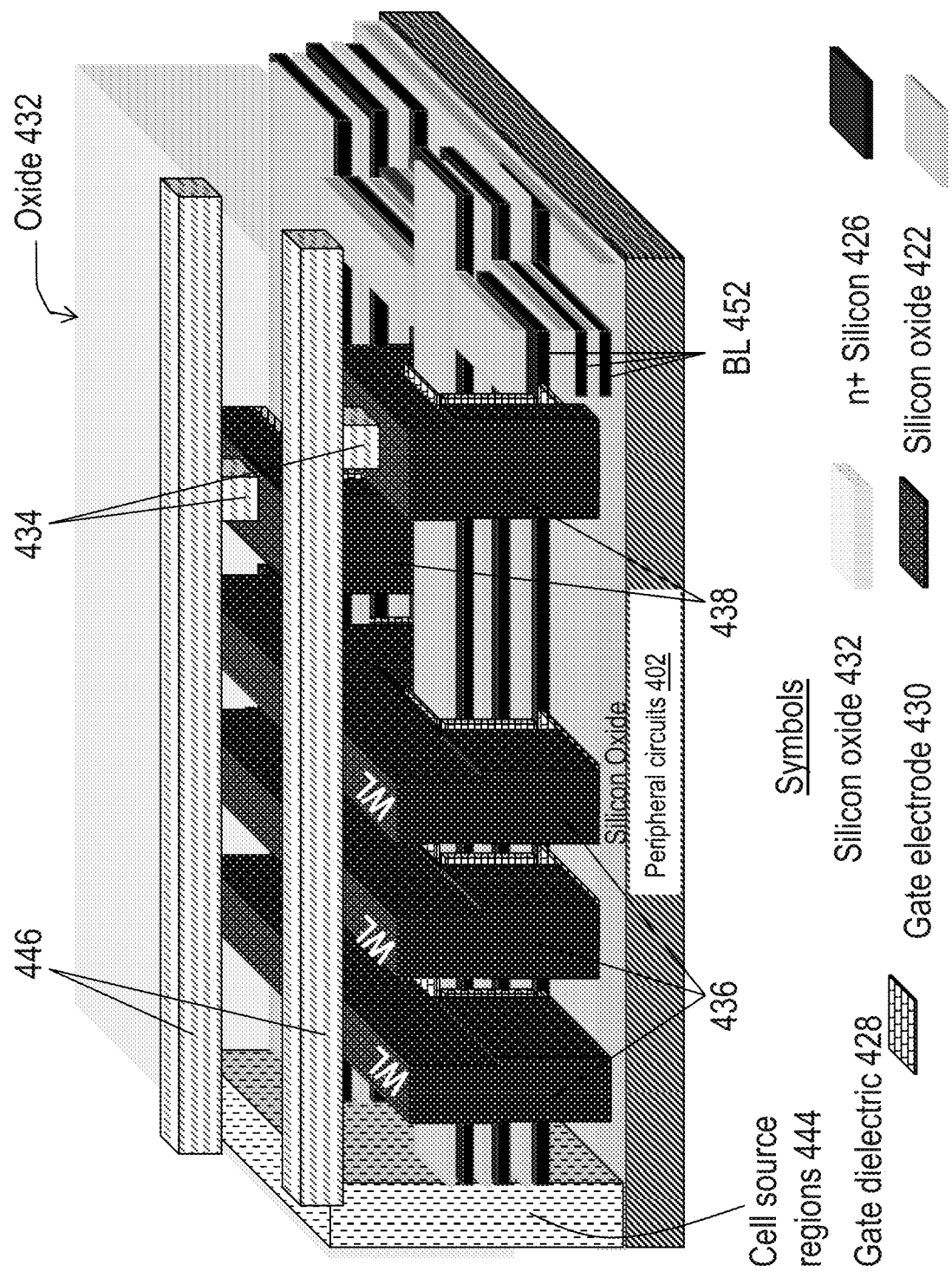

As illustrated in FIG. 4G, the entire structure may be covered with a gap fill oxide 432, which may be planarized with chemical mechanical polishing. The gap fill oxide 432 is shown transparent in the figure for clarity in illustration. Select metal lines 446 may be formed and connected to the associated select gate contacts 434. Contacts and associated metal interconnect lines (not shown) may be formed for the WL and SL at the memory array edges. Word-line regions (WL) 436, gate metal electrode regions 430, and bit-line regions (BL) 452 including indicated N+ silicon regions 426, are shown. Source regions 444 may be formed by a trench contact etch and filled to couple to the N+ silicon regions on the source end of the NAND string 436. A through layer via (not shown) may be formed to electrically couple the BL, SL, and WL metallization to the acceptor substrate 414 peripheral circuitry via an acceptor wafer metal connect pad (not shown).

This flow may enable the formation of a charge trap based 3D memory with zero additional masking steps per memory layer constructed by layer transfers of wafer sized doped layers of mono-crystalline silicon and this 3D memory may be connected to an underlying multi-metal layer semiconductor device.

Persons of ordinary skill in the art will appreciate that the illustrations in FIGS. 4A through 4G are exemplary only and are not drawn to scale. Such skilled persons will further appreciate that many variations may be possible such as, for example, BL or SL contacts may be constructed in a staircase manner as described previously and in the incorporated documents. Moreover, the stacked memory layer may be connected to a periphery circuit that may be above the memory stack. Additionally, each tier of memory could be configured with a slightly different donor wafer N+ layer doping profile. Further, the memory could be organized in a different manner, such as BL and SL interchanged, or where buried wiring for the memory array may be below the memory layers but above the periphery. Additional types of 3D charge trap memories may be constructed by layer transfer of mono-crystalline silicon; for example, those found in "A Highly Scalable 8-Layer 3D Vertical-Gate (VG) TFT NAND Flash Using Junction-Free Buried Channel BE-SONOS Device," Symposium on VLSI Technology, 2010 by Hang-Ting Lue, et al., and "Multi-layered Vertical Gate NAND Flash overcoming stacking limit for terabit density storage", Symposium on VLSI Technology, 2009 by W. Kim, S. Choi, et al. Many other modifications within the scope of the illustrated embodiments of the invention will suggest themselves to such skilled persons after reading this specification. Thus the invention is to be limited only by the appended claims.

The monolithic 3D integration concepts described in this patent application can lead to novel embodiments of poly-crystalline silicon based memory architectures. While the following concepts in FIGS. 5 and 6 are explained by using resistive memory architectures as an example, it will be clear to one skilled in the art that similar concepts can be applied to the NAND flash, charge trap, and DRAM memory architectures and process flows described previously in this patent application.

As illustrated in FIGS. 5A to 5K, a resistance-based 3D memory with zero additional masking steps per memory layer may be constructed with methods that may be suitable for 3D IC manufacturing. This 3D memory may utilize poly-crystalline silicon junction-less transistors that may have either a positive or a negative threshold voltage and may have a resistance-based memory element in series with a select or access transistor.

Figure 5A:
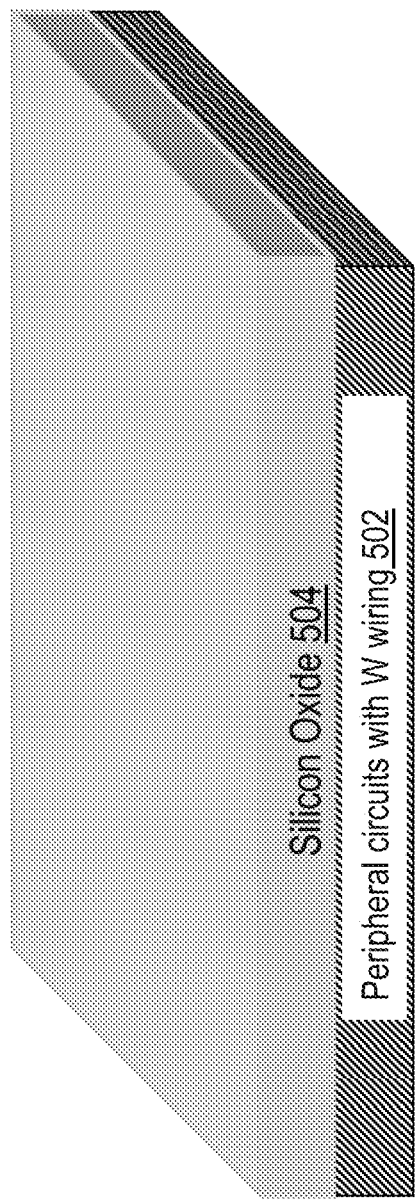

As illustrated in FIG. 5A, a silicon substrate with peripheral circuitry 502 may be constructed with high temperature (greater than about 400° C.) resistant wiring, such as, for example, Tungsten. The peripheral circuits substrate 502 may include memory control circuits as well as circuitry for other purposes and of various types, such as, for example, analog, digital, RF, or memory. The peripheral circuits substrate 502 may include peripheral circuits that can withstand an additional rapid-thermal-anneal (RTA) or flash anneal and may still remain operational and retain good performance. For this purpose, the peripheral circuits may be formed such that they have been subject to a partial or weak RTA or no RTA for activating dopants. Silicon oxide layer 504 may be deposited on the top surface of the peripheral circuitry substrate.

Figure 5B:
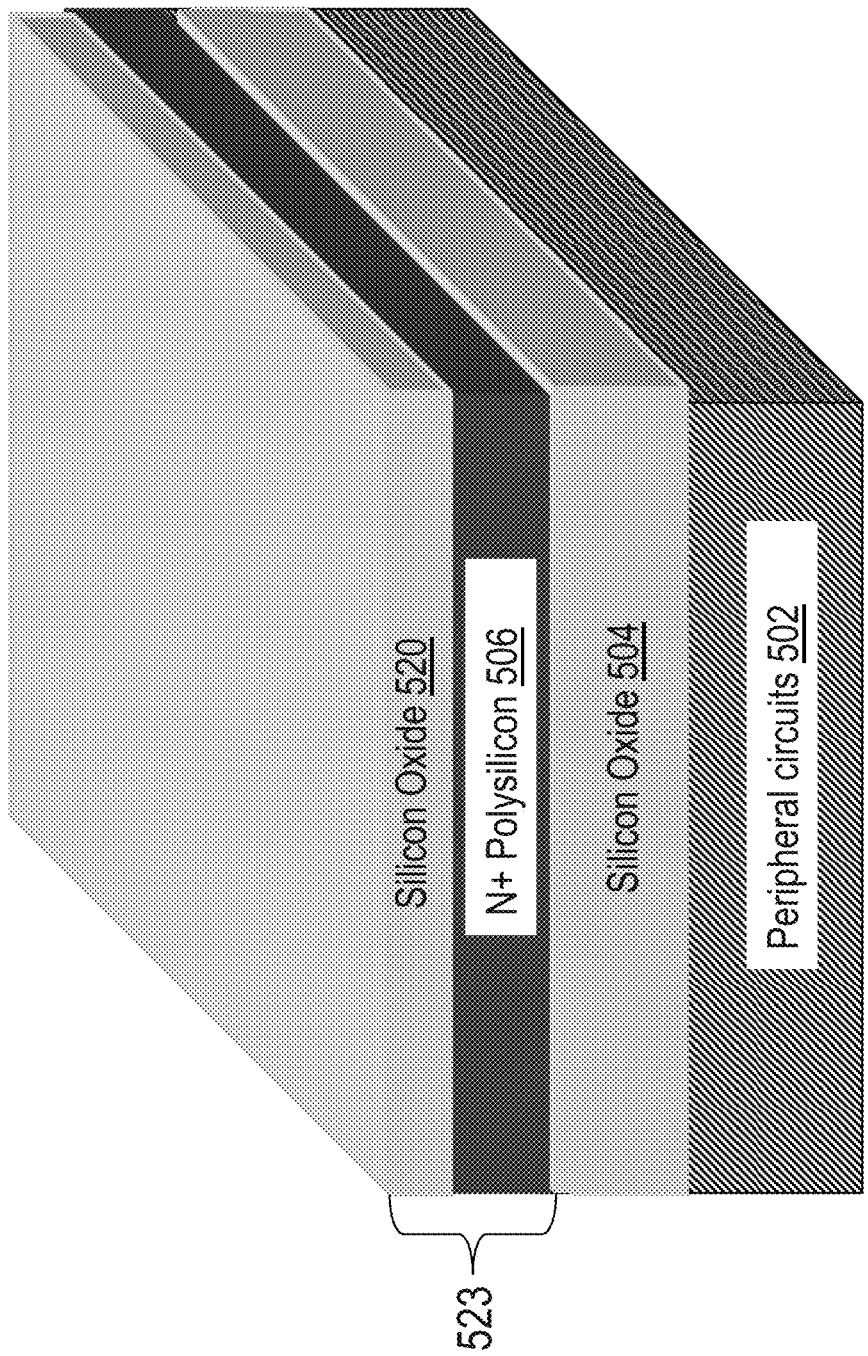

As illustrated in FIG. 5B, a layer of N+ doped poly-crystalline or amorphous silicon 506 may be deposited. The amorphous silicon or poly-crystalline silicon layer 506 may be deposited using a chemical vapor deposition process, such as LPCVD or PECVD, or other process methods, and may be deposited doped with N+ dopants, such as Arsenic or Phosphorous, or may be deposited un-doped and subsequently doped with, such as, ion implantation or PLAD (PLasma Assisted Doping) techniques. Silicon Oxide 520 may then be deposited or grown. This oxide may now form the first Si/SiO2 layer 523 which may include N+ doped poly-crystalline or amorphous silicon layer 506 and silicon oxide layer 520.

Figure 5C:
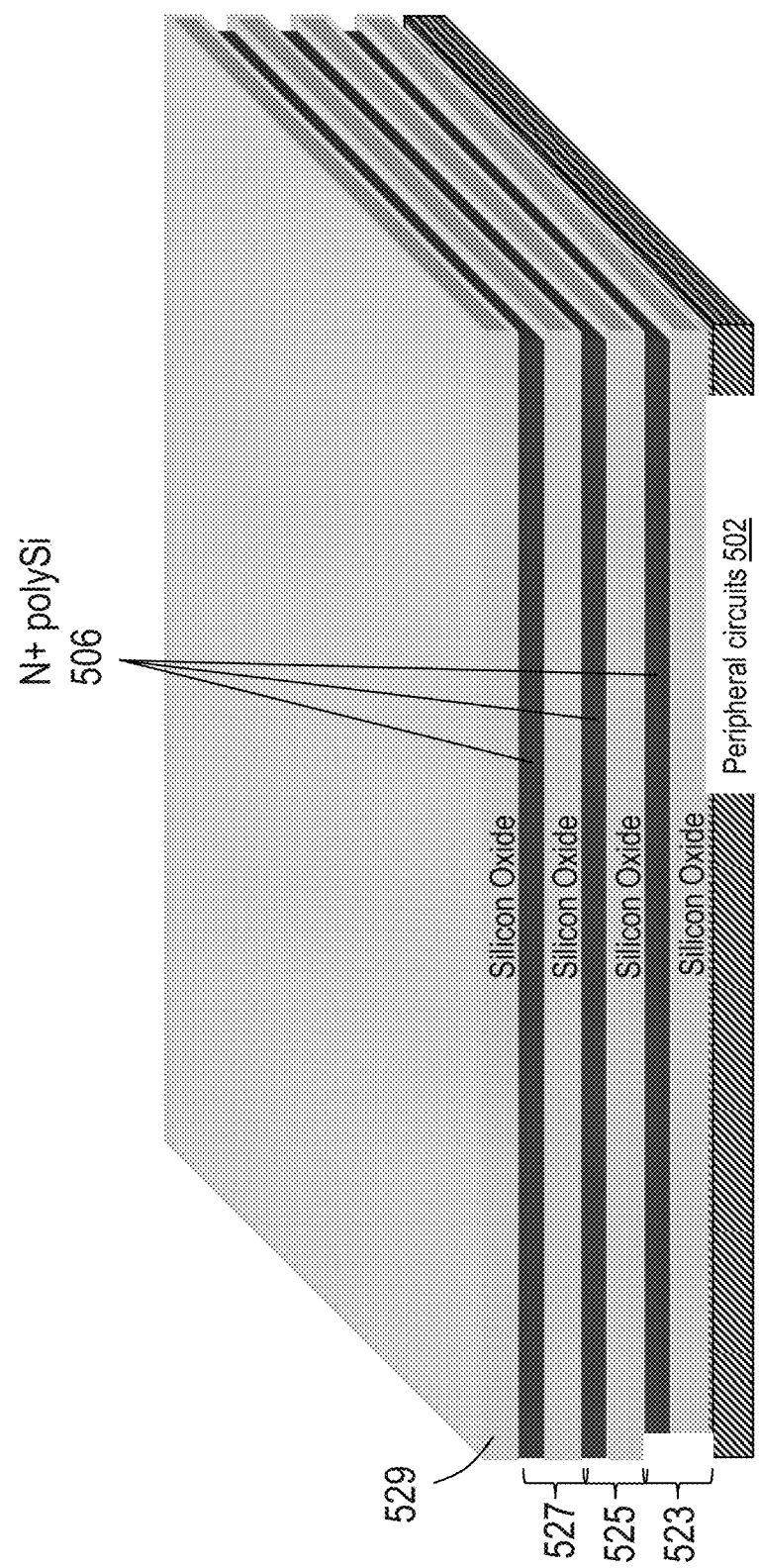

As illustrated in FIG. 5C, additional Si/SiO2 layers, such as, for example, second Si/SiO2 layer 525 and third Si/SiO2 layer 527, may each be formed as described in FIG. 5B. Oxide layer 529 may be deposited to electrically isolate the top N+ doped poly-crystalline or amorphous silicon layer.

Figure 5D:
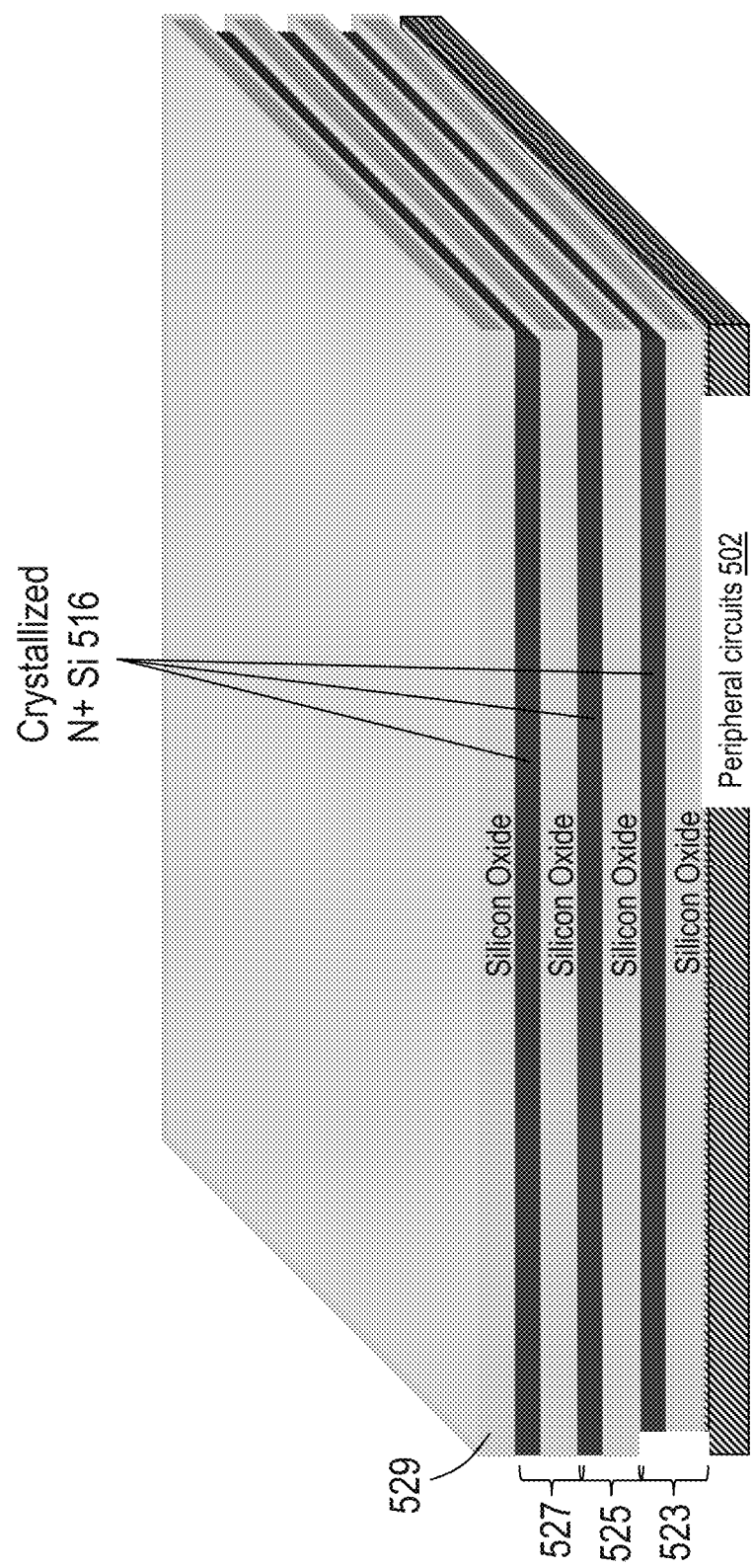

As illustrated in FIG. 5D, a Rapid Thermal Anneal (RTA) or flash anneal may be conducted to crystallize the N+ doped poly-crystalline silicon or amorphous silicon layers 506 of first Si/SiO2 layer 523, second Si/SiO2 layer 525, and third Si/SiO2 layer 527, forming crystallized N+ silicon layers 516. Temperatures during this RTA may be as high as about 800° C. Alternatively, an optical anneal, such as, for example, a laser anneal, could be performed alone or in combination with the RTA or other annealing processes.

As illustrated in FIG. 5E, oxide layer 529, third Si/SiO2 layer 527, second Si/SiO2 layer 525 and first Si/SiO2 layer 523 may be lithographically defined and plasma/RIE etched to form a portion of the memory cell structure, which may now include multiple layers of regions of crystallized N+ silicon 526 (previously crystallized N+ silicon layers 516) and oxide 522. Thus, these transistor elements or portions may have been defined by a common lithography step, which also may be described as a single lithography step, same lithography step, or one lithography step.

Figure 5F:
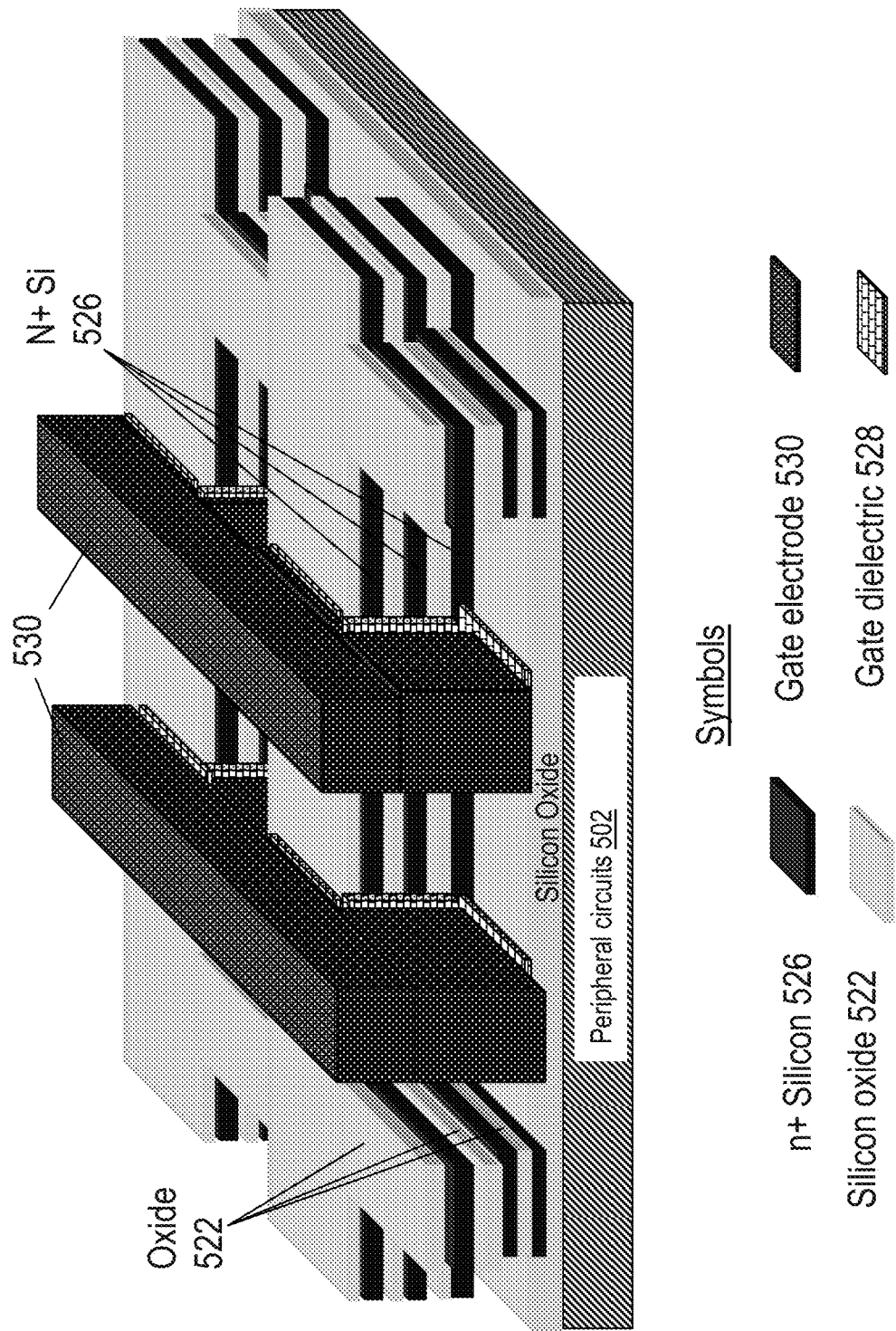

As illustrated in FIG. 5F, a gate dielectric and gate electrode material may be deposited, planarized with a chemical mechanical polish (CMP), and then lithographically defined and plasma/RIE etched to form gate dielectric regions 528 which may either be self-aligned to and covered by gate electrodes 530 (shown), or cover the entire crystallized N+ silicon regions 526 and oxide regions 522 multi-layer structure. The gate stack including gate electrode 530 and gate dielectric regions 528 may be formed with a gate dielectric, such as thermal oxide, and a gate electrode material, such as poly-crystalline silicon. Alternatively, the gate dielectric may be an atomic layer deposited (ALD) material that may be paired with a work function specific gate metal according to industry standard high k metal gate process schemes described previously. Furthermore, the gate dielectric may be formed with a rapid thermal oxidation (RTO), a low temperature oxide deposition or low temperature microwave plasma oxidation of the silicon surfaces and then a gate electrode such as tungsten or aluminum may be deposited.

Figure 5G:
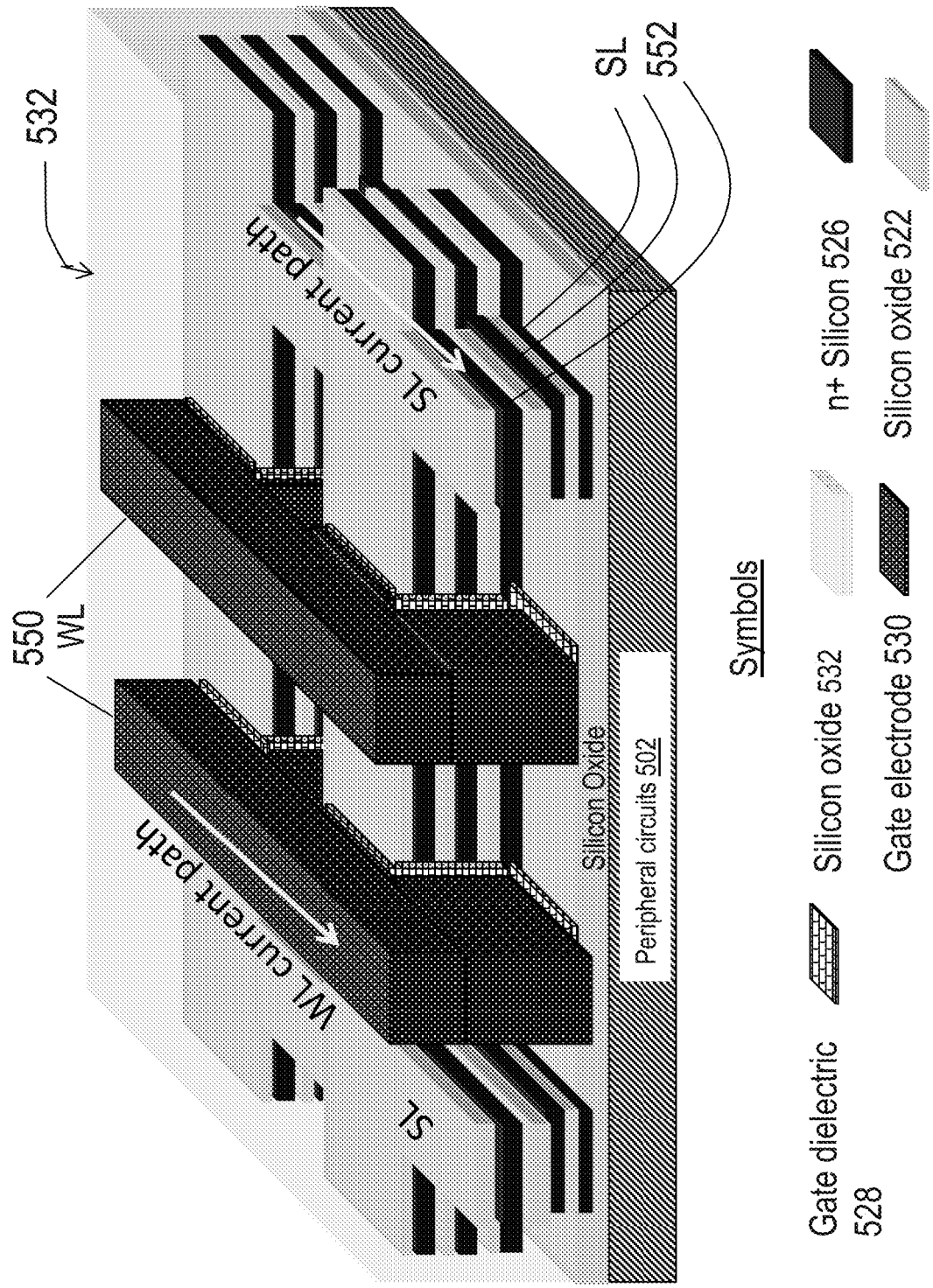

As illustrated in FIG. 5G, the entire structure may be covered with a gap fill oxide 532, which may be planarized with chemical mechanical polishing. The oxide 532 is shown transparently in the figure for clarity in illustration. Also shown are word-line regions (WL) 550, which may be coupled with and include gate electrodes 530, and source-line regions (SL) 552, including crystallized N+ silicon regions 526.

Figure 5H:
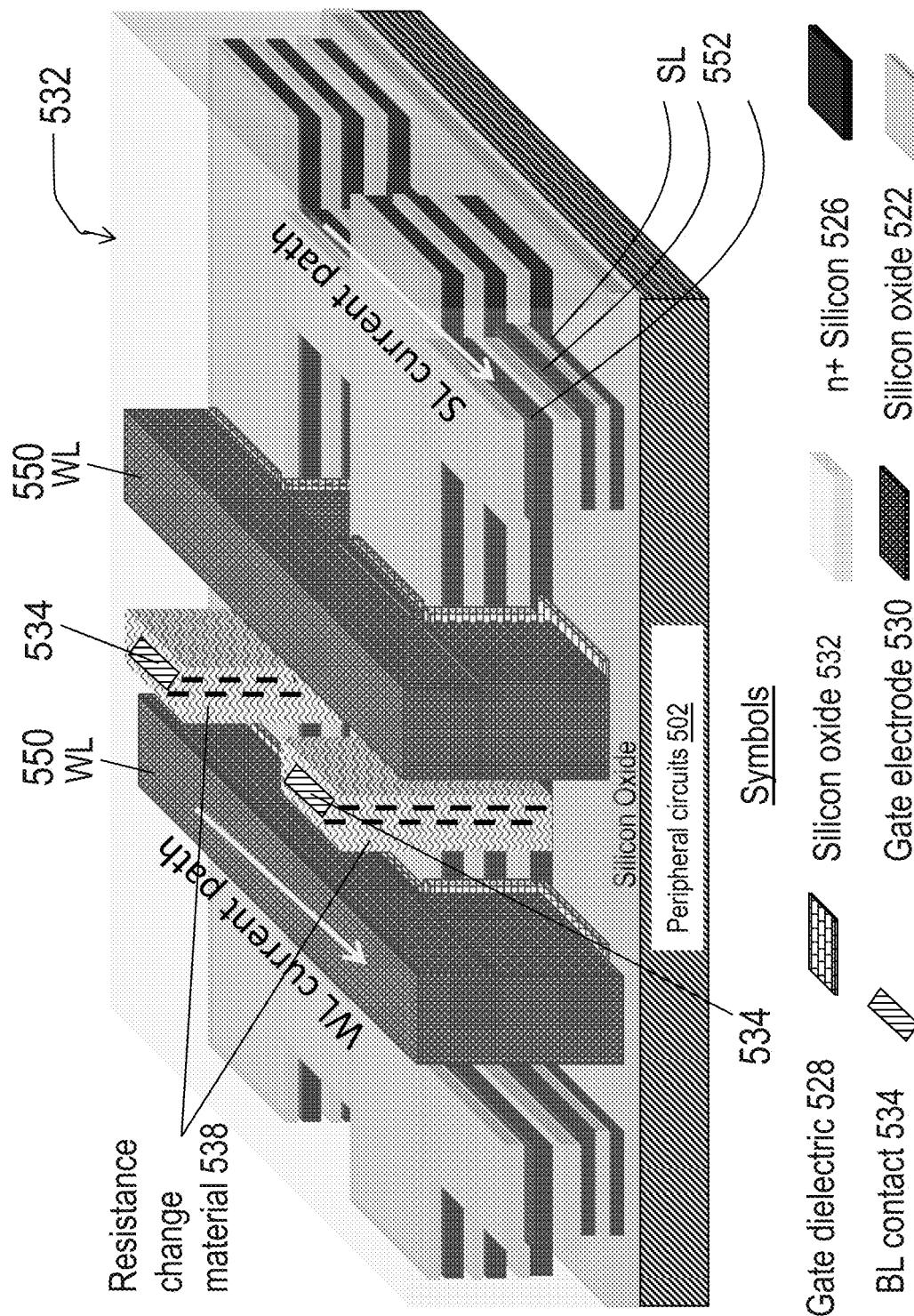

As illustrated in FIG. 5H, bit-line (BL) contacts 534 may be lithographically defined, etched with plasma/RIE through oxide 532, the three crystallized N+ silicon regions 526, and associated oxide vertical isolation regions, to connect substantially all memory layers vertically, and then photoresist may be removed. Resistance change material 538, such as, for example, hafnium oxides or titanium oxides, may then be deposited, for example, with atomic layer deposition (ALD). The electrode for the resistance change memory element may then be deposited by ALD to form the electrode/BL contact 534. The excess deposited material may be polished to planarity at or below the top of oxide 532. Each BL contact 534 with resistive change material 538 may be shared among substantially all layers of memory, shown as three layers of memory in FIG. 5H.

Figure 5I:
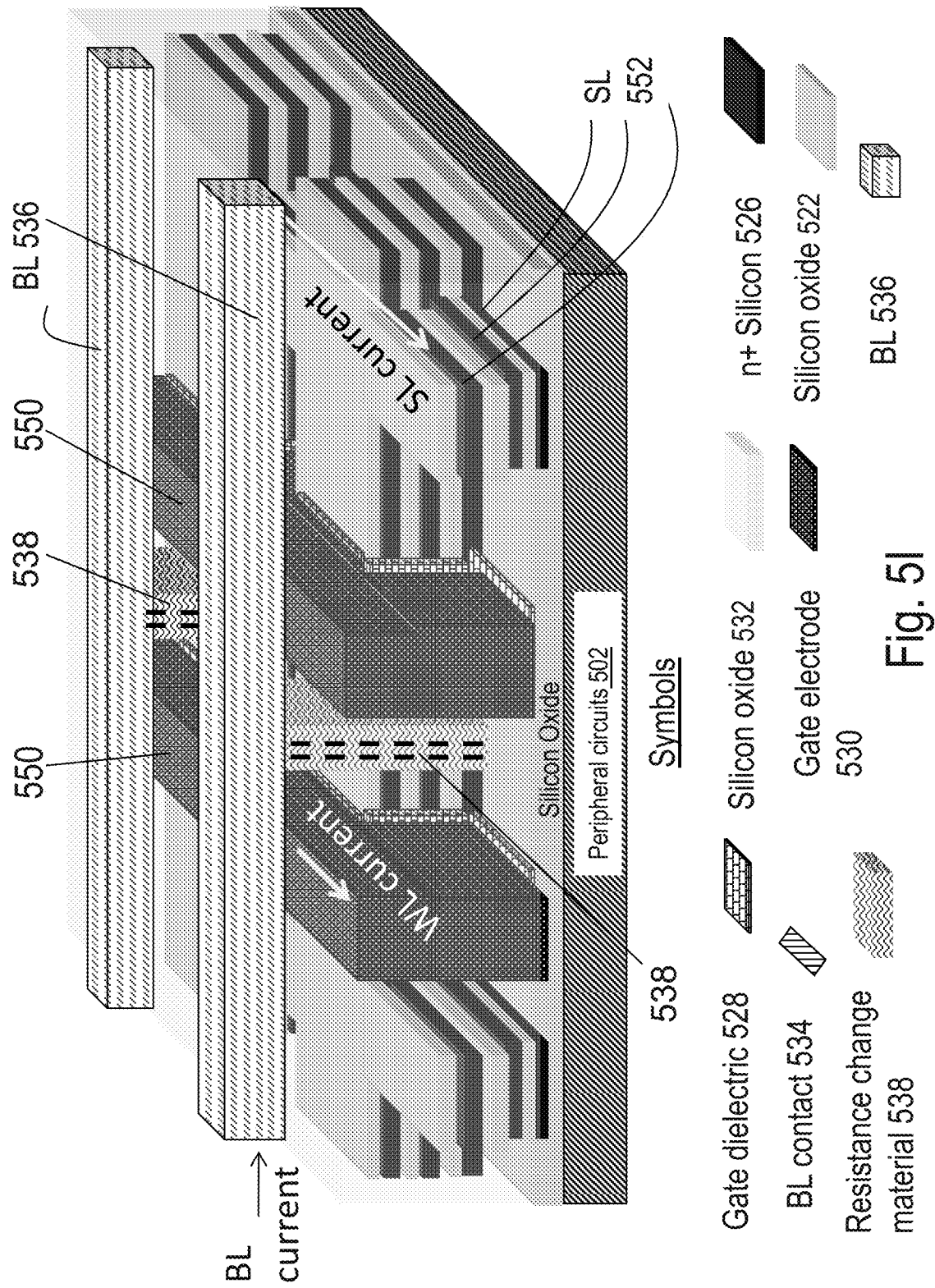

As illustrated in FIG. 5I, BL metal lines 536 may be formed and connected to the associated BL contacts 534 with resistance change material 538. Contacts and associated metal interconnect lines (not shown) may be formed for the WL and SL at the memory array edges. A through layer via (not shown) may be formed to electrically couple the BL, SL, and WL metallization to the acceptor substrate peripheral circuitry via an acceptor wafer metal connect pad (not shown).

Figure 5J:
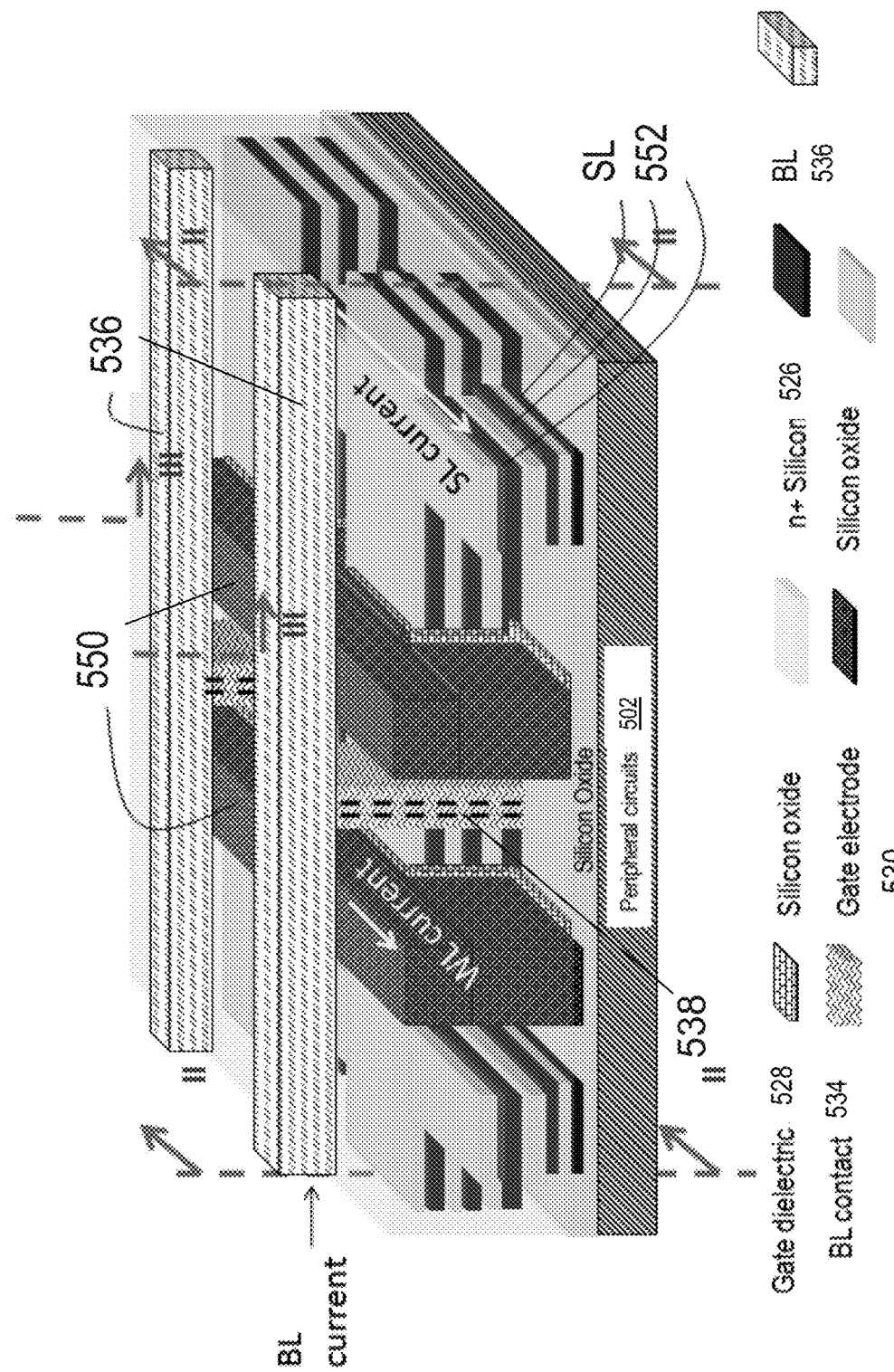

FIG. 5J1 is a cross sectional cut II view of FIG. 5J, while FIG. 5J2 is a cross sectional cut III view of FIG. 5J. FIG. 5J1 shows BL metal line 536, oxide 532, BL contact/electrode 534, resistive change material 538, WL regions 550, gate dielectric regions 528, crystallized N+ silicon regions 526, and peripheral circuits substrate 502. The BL contact/electrode 534 may couple to one side of the three levels of resistive change material 538. The other side of the resistive change material 538 may be coupled to crystallized N+ regions 526. FIG. 5J2 shows BL metal lines 536, oxide 532, gate electrode 530, gate dielectric regions 528, crystallized N+ silicon regions 526, interlayer oxide region ('ox'), and peripheral circuits substrate 502. The gate electrode 530 may be common to substantially all six crystallized N+ silicon regions 526 and may form six two-sided gated junction-less transistors as memory select transistors.

Figure 5K:
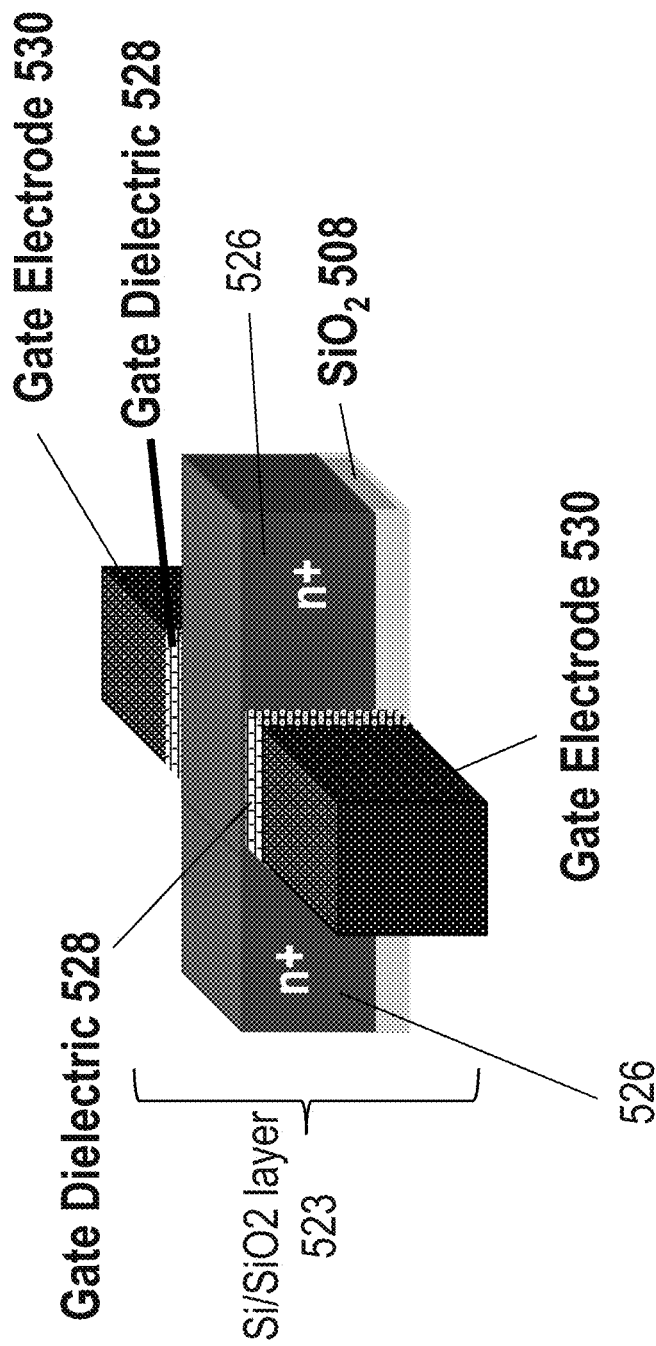

As illustrated in FIG. 5K, a single exemplary two-sided gated junction-less transistor on the first Si/SiO2 layer 523 may include crystallized N+ silicon region 526 (functioning as the source, drain, and transistor channel), and two gate electrodes 530 with associated gate dielectric regions 528. The transistor may be electrically isolated from beneath by oxide layer 508.

This flow may enable the formation of a resistance-based multi-layer or 3D memory array with zero additional masking steps per memory layer, which may utilize poly-crystalline silicon junction-less transistors and may have a resistance-based memory element in series with a select transistor, and may be constructed by layer transfer of wafer sized doped poly-crystalline silicon layers, and this 3D memory array may be connected to an underlying multi-metal layer semiconductor device.

Persons of ordinary skill in the art will appreciate that the illustrations in FIGS. 5A through 5K are exemplary only and are not drawn to scale. Such skilled persons will further appreciate that many variations may be possible such as, for example, the RTAs and/or optical anneals of the N+ doped poly-crystalline or amorphous silicon layers 506 as described for FIG. 5D may be performed after each Si/SiO2 layer is formed in FIG. 5C. Additionally, N+ doped poly-crystalline or amorphous silicon layer 506 may be doped P+, or with a combination of dopants and other polysilicon network modifiers to enhance the RTA or optical annealing and subsequent crystallization and lower the N+ silicon layer 516 resistivity. Moreover, doping of each crystallized N+ layer may be slightly different to compensate for interconnect resistances. Furthermore, each gate of the double gated 3D resistance based memory may be independently controlled for better control of the memory cell. Many other modifications within the scope of the illustrated embodiments of the invention will suggest themselves to such skilled persons after reading this specification. Thus the invention is to be limited only by the appended claims.

As illustrated in FIGS. 6A to 6J, an alternative embodiment of a resistance-based 3D memory with zero additional masking steps per memory layer may be constructed with methods that are suitable for 3D IC manufacturing. This 3D memory may utilize poly-crystalline silicon junction-less transistors that may have either a positive or a negative threshold voltage, a resistance-based memory element in series with a select or access transistor, and may have the periphery circuitry layer formed or layer transferred on top of the 3D memory array.

Figure 6A:
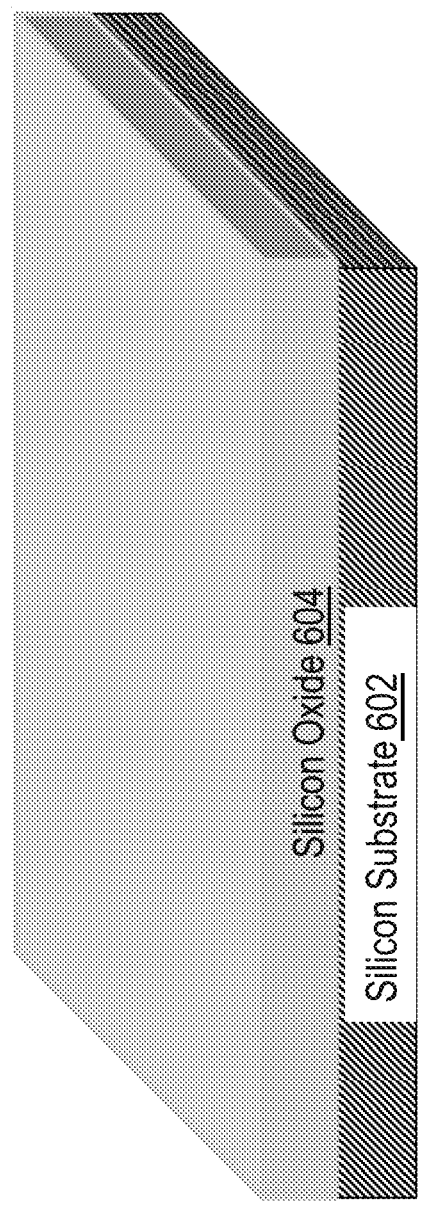
FIGS. 6A-6J are exemplary drawing illustrations of the formation of a resistive memory transistor with periphery on top.

As illustrated in FIG. 6A, a silicon oxide layer 604 may be deposited or grown on top of silicon substrate 602.

Figure 6B:
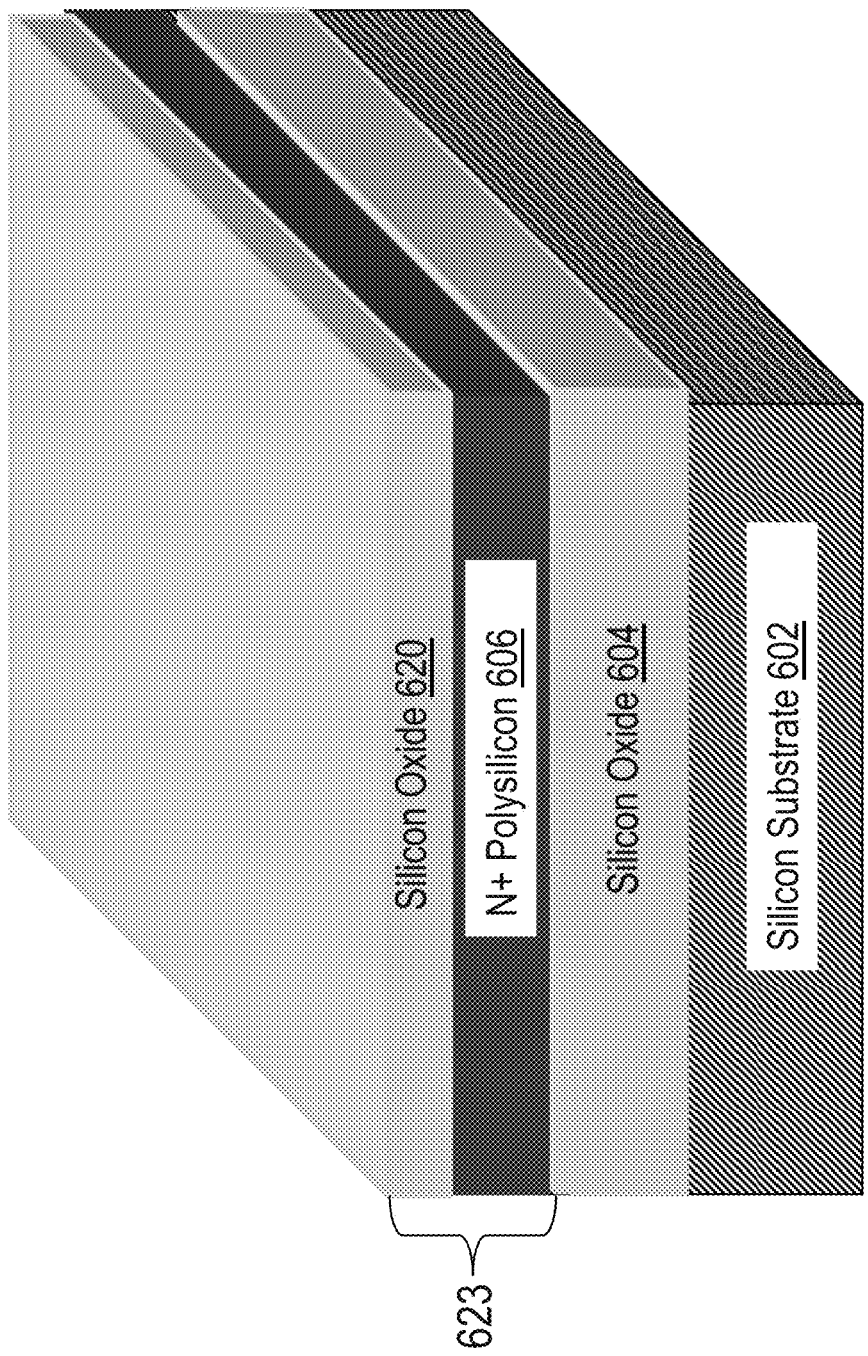

As illustrated in FIG. 6B, a layer of N+ doped poly-crystalline or amorphous silicon 606 may be deposited. The N+ doped poly-crystalline or amorphous silicon layer 606 may be deposited using a chemical vapor deposition process, such as LPCVD or PECVD, or other process methods, and may be deposited doped with N+ dopants, such as, for example, Arsenic or Phosphorous, or may be deposited un-doped and subsequently doped with, such as, for example, ion implantation or PLAD (PLasma Assisted Doping) techniques. Silicon Oxide 620 may then be deposited or grown. This oxide may now form the first Si/SiO2 layer 623 comprised of N+ doped poly-crystalline or amorphous silicon layer 606 and silicon oxide layer 620.

Figure 6C:
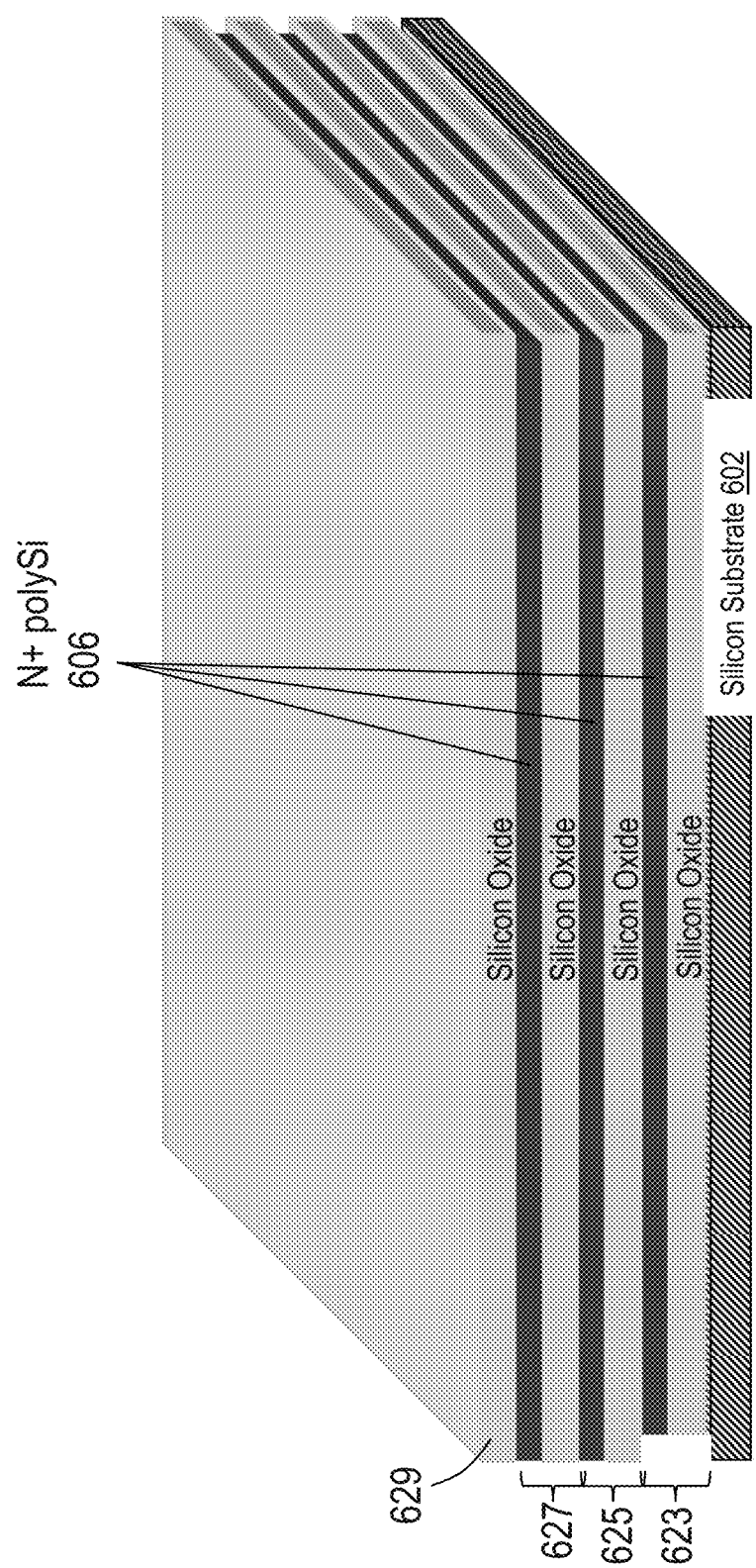

As illustrated in FIG. 6C, additional Si/SiO2 layers, such as, for example, second Si/SiO2 layer 625 and third Si/SiO2 layer 627, may each be formed as described in FIG. 6B. Oxide layer 629 may be deposited to electrically isolate the top N+ doped poly-crystalline or amorphous silicon layer.

Figure 6D:
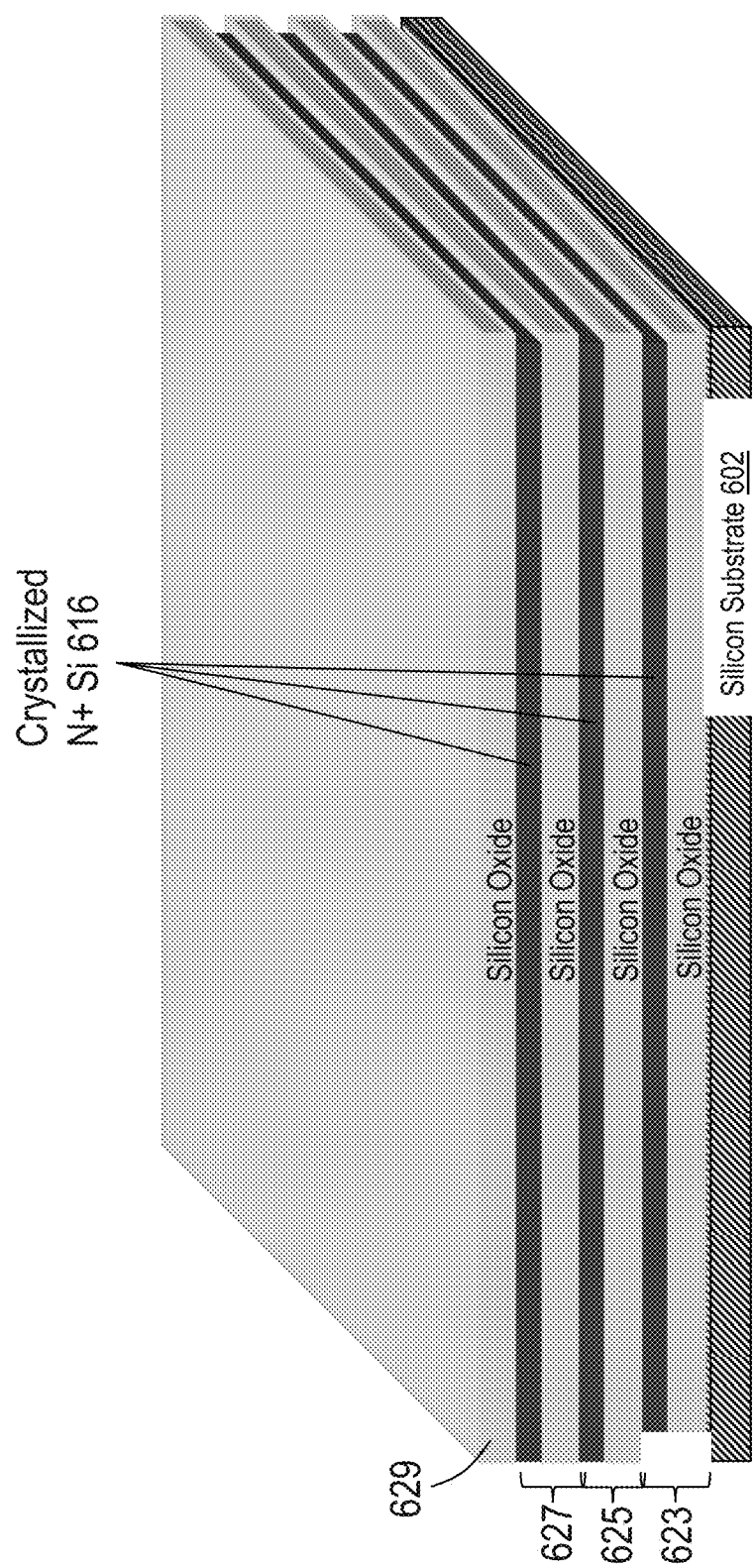

As illustrated in FIG. 6D, a Rapid Thermal Anneal (RTA) or flash anneal may be conducted to crystallize the N+ doped poly-crystalline silicon or amorphous silicon layers 606 of first Si/SiO2 layer 623, second Si/SiO2 layer 625, and third Si/SiO2 layer 627, forming crystallized N+ silicon layers 616. Alternatively, an optical anneal, such as, for example, a laser anneal, could be performed alone or in combination with the RTA or other annealing processes. Temperatures during this step could be as high as about 700° C., and could even be as high as, for example, 1400° C. Since there may be no circuits or metallization underlying these layers of crystallized N+ silicon, very high temperatures (such as, for example, 1400° C.) can be used for the anneal process, leading to very good quality poly-crystalline silicon with few grain boundaries and very high carrier mobilities approaching those of mono-crystalline crystal silicon.

Figure 6E:
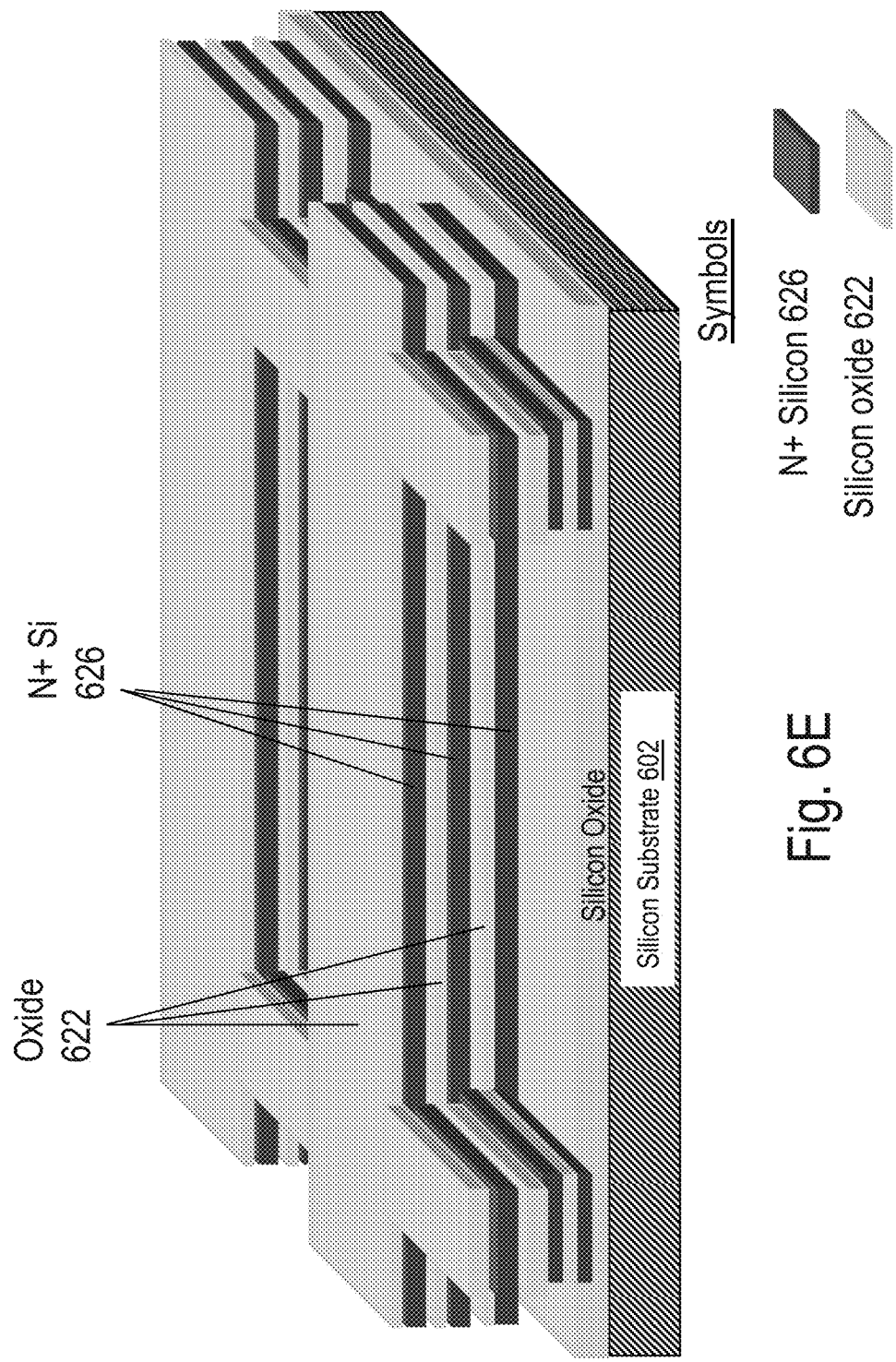

As illustrated in FIG. 6E, oxide layer 629, third Si/SiO2 layer 627, second Si/SiO2 layer 625 and first Si/SiO2 layer 623 may be lithographically defined and plasma/RIE etched to form a portion of the memory cell structure, which may now include multiple layers of regions of crystallized N+ silicon 626 (previously crystallized N+ silicon layers 616) and oxide 622. Thus, these transistor elements or portions may have been defined by a common lithography step, which also may be described as a single lithography step, same lithography step, or one lithography step.

Figure 6F:
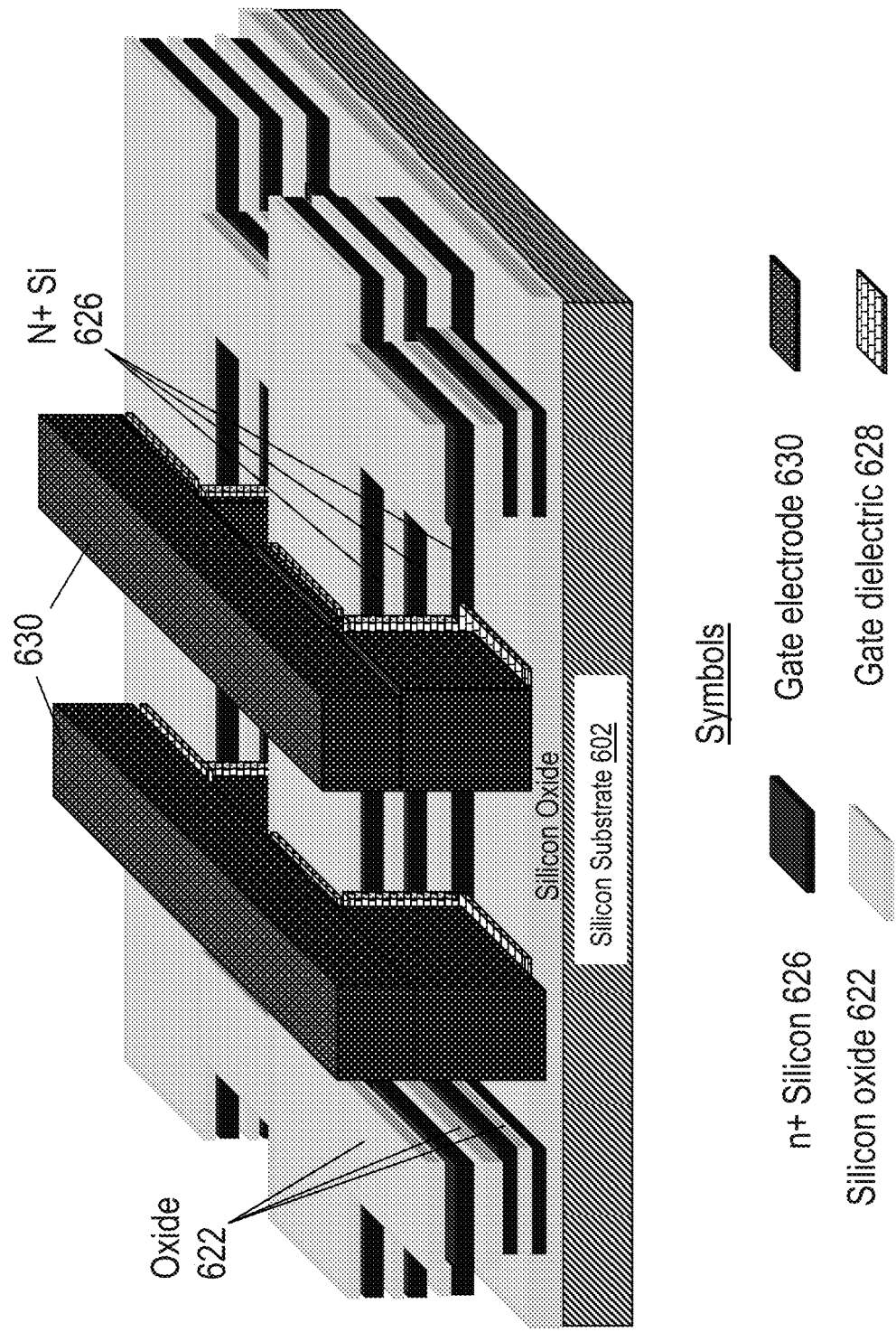

As illustrated in FIG. 6F, a gate dielectric and gate electrode material may be deposited, planarized with a chemical mechanical polish (CMP), and then lithographically defined and plasma/RIE etched to form gate dielectric regions 628 which may either be self-aligned to and covered by gate electrodes 630 (shown), or cover the entire crystallized N+ silicon regions 626 and oxide regions 622 multi-layer structure. The gate stack including gate electrode 630 and gate dielectric regions 628 may be formed with a gate dielectric, such as thermal oxide, and a gate electrode material, such as poly-crystalline silicon. Alternatively, the gate dielectric may be an atomic layer deposited (ALD) material that may be paired with a work function specific gate metal according to industry standard high k metal gate process schemes described previously. Additionally, the gate dielectric may be formed with a rapid thermal oxidation (RTO), a low temperature oxide deposition or low temperature microwave plasma oxidation of the silicon surfaces and then a gate electrode such as tungsten or aluminum may be deposited.

Figure 6G:
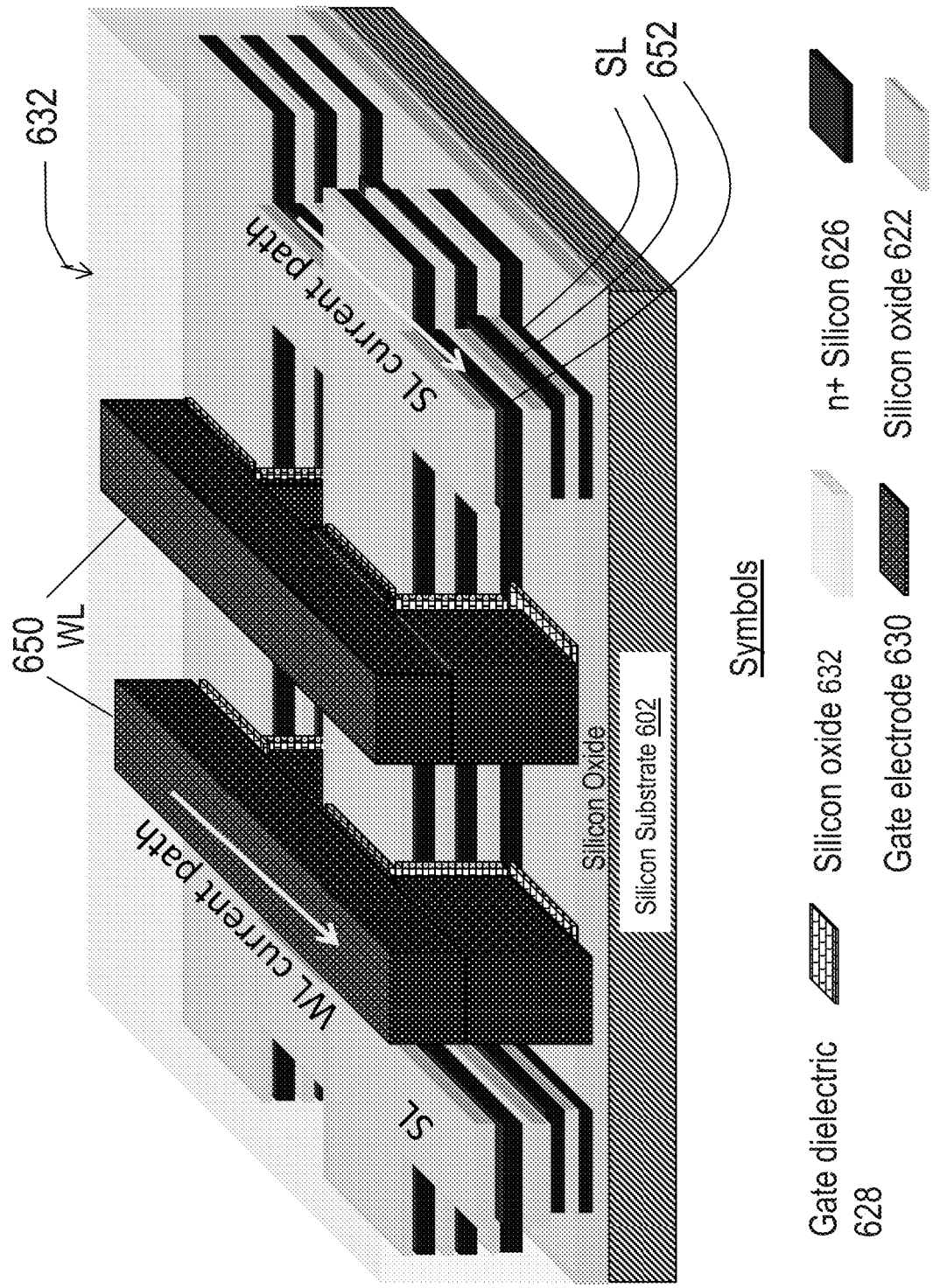

As illustrated in FIG. 6G, the entire structure may be covered with a gap fill oxide 632, which may be planarized with chemical mechanical polishing. The oxide 632 is shown transparently in the figure for clarity in illustration. Also shown are word-line regions (WL) 650, which may be coupled with and include gate electrodes 630, and source-line regions (SL) 652, including crystallized N+ silicon regions 626.

Figure 6H:
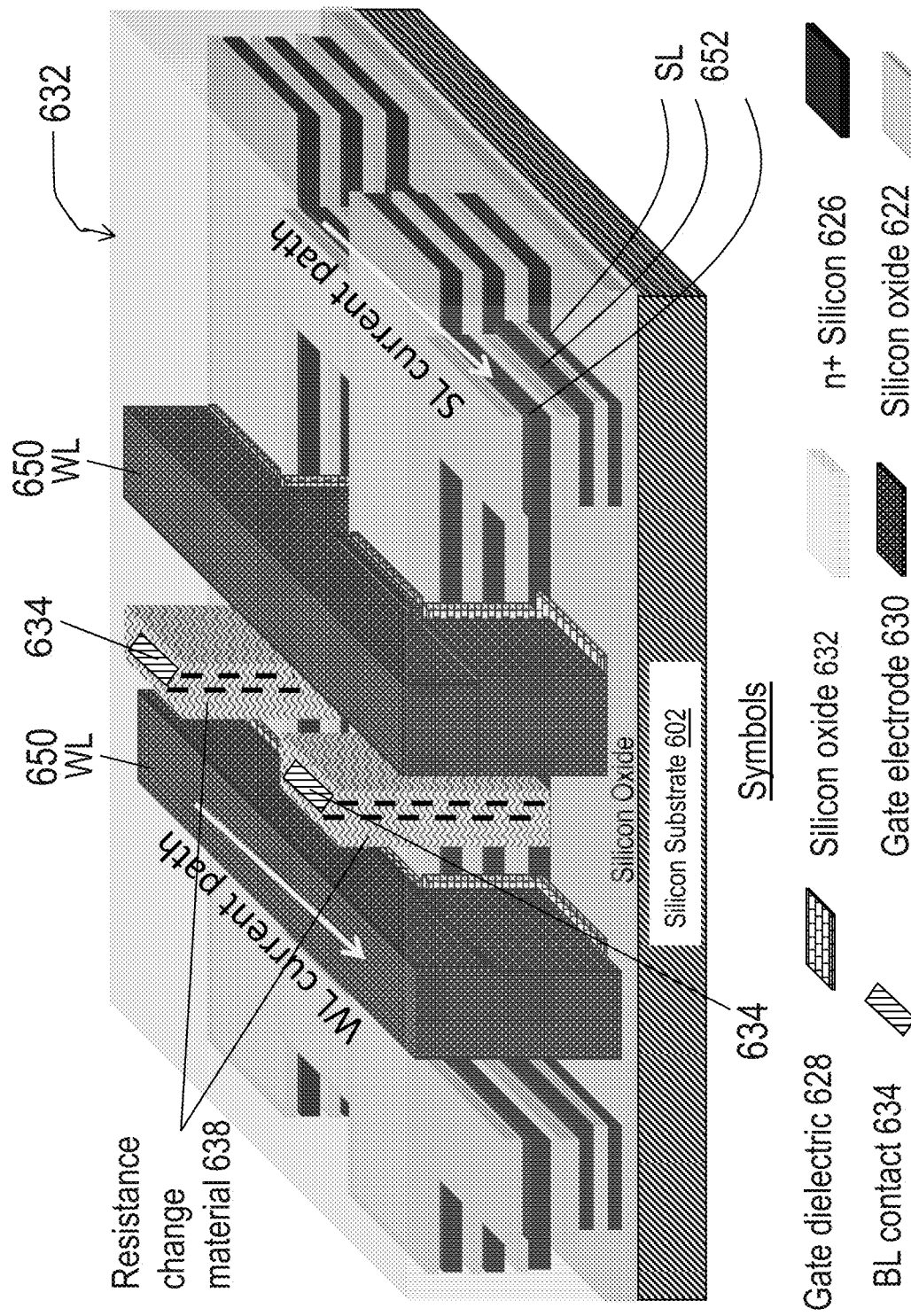

As illustrated in FIG. 6H, bit-line (BL) contacts 634 may be lithographically defined, etched with, for example, plasma/RIE, through oxide 632, the three crystallized N+ silicon regions 626, and the associated oxide vertical isolation regions to connect substantially all memory layers vertically. BL contacts 634 may then be processed by a photoresist removal. Resistance change material 638, such as hafnium oxides or titanium oxides, may then be deposited, for example, with atomic layer deposition (ALD). The electrode for the resistance change memory element may then be deposited by ALD to form the electrode/BL contact 634. The excess deposited material may be polished to planarity at or below the top of oxide 632. Each BL contact 634 with resistive change material 638 may be shared among substantially all layers of memory, shown as three layers of memory in FIG. 6H.

Figure 6I:
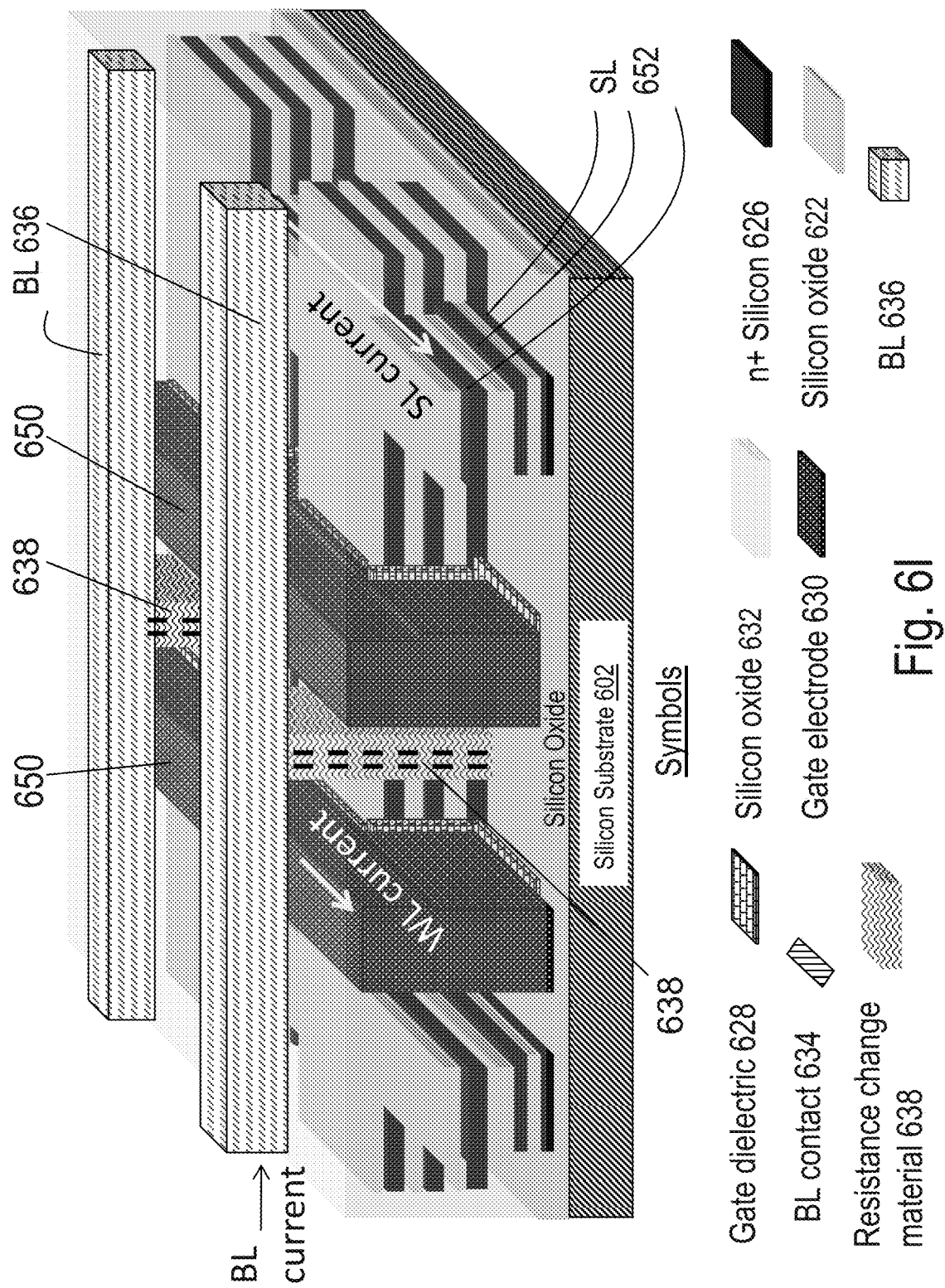

As illustrated in FIG. 6I, BL metal lines 636 may be formed and connected to the associated BL contacts 634 with resistive change material 638. Contacts and associated metal interconnect lines (not shown) may be formed for the WL and SL at the memory array edges.

Figure 6J:
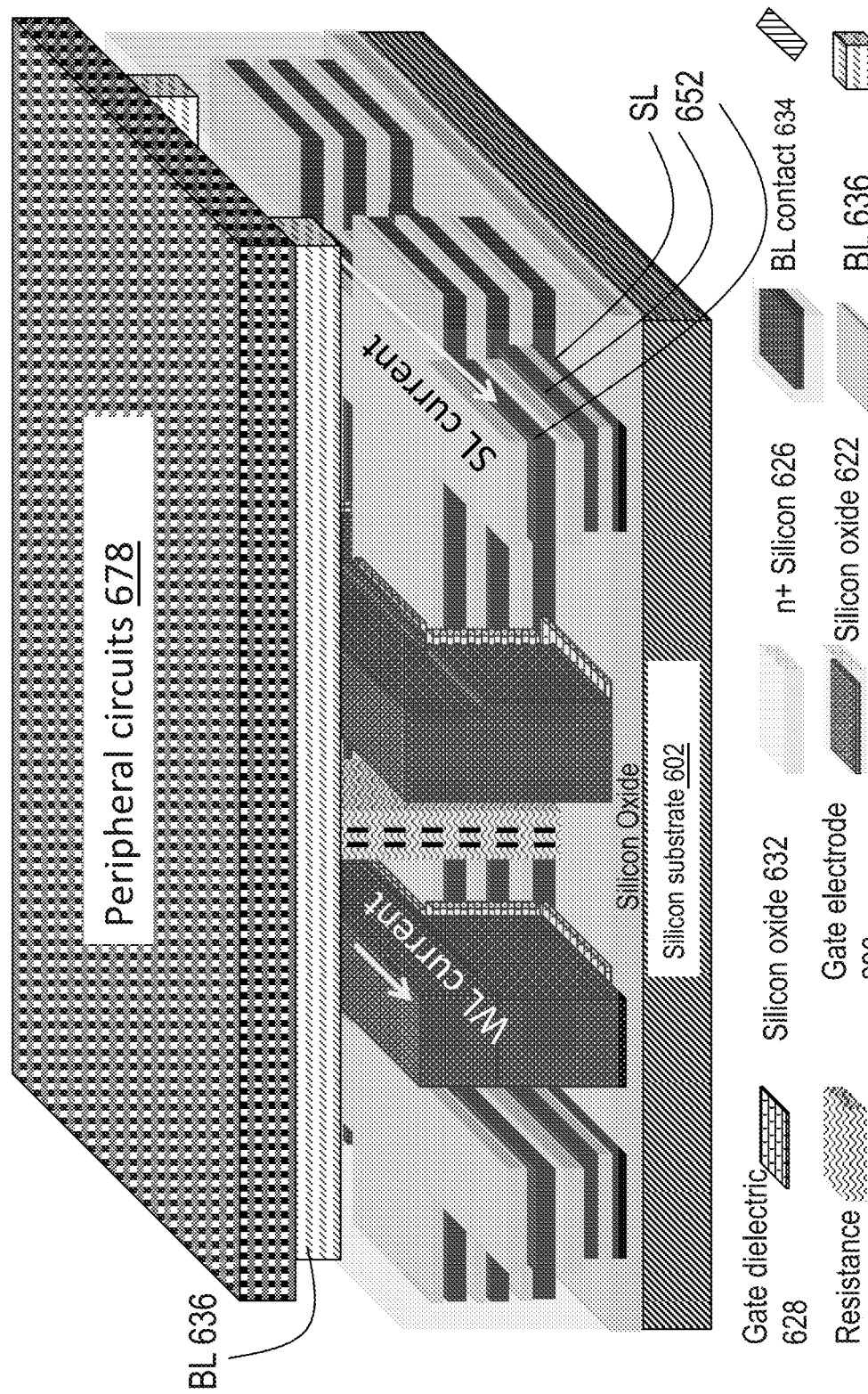

As illustrated in FIG. 6J, peripheral circuits 678 may be constructed and then layer transferred, using methods described previously such as, for example, ion-cut with replacement gates, to the memory array. Thru layer vias (not shown) may be formed to electrically couple the periphery circuitry to the memory array BL, WL, SL and other connections such as, for example, power and ground. Alternatively, the periphery circuitry may be formed and directly aligned to the memory array and silicon substrate 602 utilizing the layer transfer of wafer sized doped layers and subsequent processing, such as, for example, the junctionless, Recess Channel Array Transistor (RCAT), V-groove, or bipolar transistor formation flows as previously described in incorporated documents.

This flow may enable the formation of a resistance-based multi-layer or 3D memory array with zero additional masking steps per memory layer, which may utilize poly-crystalline silicon junction-less transistors and may have a resistance-based memory element in series with a select transistor, and may be constructed by layer transfers of wafer sized doped poly-crystalline silicon layers, and this 3D memory array may be connected to an overlying multi-metal layer semiconductor device or periphery circuitry.

Persons of ordinary skill in the art will appreciate that the illustrations in FIGS. 6A through 6J are exemplary only and are not drawn to scale. Such skilled persons will further appreciate that many variations may be possible such as, for example, the RTAs and/or optical anneals of the N+ doped poly-crystalline or amorphous silicon layers 606 as described for FIG. 6D may be performed after each Si/SiO2 layer may be formed in FIG. 6C. Additionally, N+ doped poly-crystalline or amorphous silicon layer 606 may be doped P+, or with a combination of dopants and other polysilicon network modifiers to enhance the RTA or optical annealing crystallization and subsequent crystallization, and lower the N+ silicon layer 616 resistivity. Moreover, doping of each crystallized N+ layer may be slightly different to compensate for interconnect resistances. Further, each gate of the double gated 3D resistance based memory may be independently controlled for better control of the memory cell. Furthermore, by proper choice of materials for memory layer transistors and memory layer wires (e.g., by using tungsten and other materials that withstand high temperature processing for wiring), standard CMOS transistors may be processed at high temperatures (e.g., greater than about 400° C.) to form the periphery circuits 678. Many other modifications within the scope of the illustrated embodiments of the invention will suggest themselves to such skilled persons after reading this specification. Thus the invention is to be limited only by the appended claims.

In this document, various terms may have been used while generally referring to the element. For example, "house" may refer to the first mono-crystalline layer with its transistors and metal interconnection layer or layers. This first mono-crystalline layer may have also been referred to as the main wafer and sometimes as the acceptor wafer and sometimes as the base wafer.

Some embodiments of the invention may include alternative techniques to build IC (Integrated Circuit) devices including techniques and methods to construct 3D IC systems. Some embodiments of the invention may enable device solutions with far less power consumption than prior art. These device solutions could be very useful for the growing application of mobile electronic devices and mobile systems, such as, for example, mobile phones, smart phone, and cameras. For example, incorporating the 3D IC semiconductor devices according to some embodiments of the invention within these mobile electronic devices and mobile systems could provide superior mobile units that could operate much more efficiently and for a much longer time than with prior art technology.

Smart mobile systems may be greatly enhanced by complex electronics at a limited power budget. The 3D technology described in the multiple embodiments of the invention would allow the construction of low power high complexity mobile electronic systems. For example, it would be possible to integrate into a small form function a complex logic circuit with high density high speed memory utilizing some of the 3D DRAM embodiments of the invention and add some non-volatile 3D NAND charge trap or RRAM described in some embodiments of the invention.

In U.S. application Ser. No. 12/903,862, filed by some of the inventors and assigned to the same assignee, a 3D micro display and a 3D image sensor are presented. Integrating one or both of these with complex logic and or memory could be very effective for mobile system. Additionally, mobile systems could be customized to some specific market applications by integrating some embodiments of the invention.

Moreover, utilizing 3D programmable logic or 3D gate array as had been described in some embodiments of the invention could be very effective in forming flexible mobile systems.

The need to reduce power to allow effective use of limited battery energy and also the lightweight and small form factor derived by highly integrating functions with low waste of interconnect and substrate could be highly benefitted by the redundancy and repair idea of the 3D monolithic technology as has been presented in embodiments of the invention. This unique technology could enable a mobile device that would be lower cost to produce or would require lower power to operate or would provide a lower size or lighter carry weight, and combinations of these 3D monolithic technology features may provide a competitive or desirable mobile system.

Another unique market that may be addressed by some of the embodiments of the invention could be a street corner camera with supporting electronics. The 3D image sensor described in the Ser. No. 12/903,862 application would be very effective for day/night and multi-spectrum surveillance applications. The 3D image sensor could be supported by integrated logic and memory such as, for example, a monolithic 3D IC with a combination of image processing and image compression logic and memory, both high speed memory such as 3D DRAM and high density non-volatile memory such as 3D NAND or RRAM or other memory, and other combinations. This street corner camera application would require low power, low cost, and low size or any combination of these features, and could be highly benefitted from the 3D technologies described herein.

3D ICs according to some embodiments of the invention could enable electronic and semiconductor devices with much a higher performance as a result from the shorter interconnect as well as semiconductor devices with far more complexity via multiple levels of logic and providing the ability to repair or use redundancy. The achievable complexity of the semiconductor devices according to some embodiments of the invention could far exceed what may be practical with the prior art technology. These potential advantages could lead to more powerful computer systems and improved systems that have embedded computers.

Some embodiments of the invention may enable the design of state of the art electronic systems at a greatly reduced non-recurring engineering (NRE) cost by the use of high density 3D FPGAs or various forms of 3D array base ICs with reduced custom masks as described previously. These systems could be deployed in many products and in many market segments. Reduction of the NRE may enable new product family or application development and deployment early in the product lifecycle by lowering the risk of upfront investment prior to a market being developed. The above potential advantages may also be provided by various mixes such as reduced NRE using generic masks for layers of logic and other generic masks for layers of memories and building a very complex system using the repair technology to overcome the inherent yield limitation. Another form of mix could be building a 3D FPGA and add on it 3D layers of customizable logic and memory so the end system could have field programmable logic on top of the factory customized logic. There may be many ways to mix the many innovative elements to form 3D IC to support the need of an end system, including using multiple devices wherein more than one device incorporates elements of embodiments of the invention. An end system could benefit from a memory device utilizing embodiments of the invention 3D memory integrated together with a high performance 3D FPGA integrated together with high density 3D logic, and so forth. Using devices that can use one or multiple elements according to some embodiments of the invention may allow for better performance or lower power and other illustrative advantages resulting from the use of some embodiments of the invention to provide the end system with a competitive edge. Such end system could be electronic based products or other types of systems that may include some level of embedded electronics, such as, for example, cars, and remote controlled vehicles.

Commercial wireless mobile communications have been developed for almost thirty years, and play a special role in today's information and communication technology Industries. The mobile wireless terminal device has become part of our life, as well as the Internet, and the mobile wireless terminal device may continue to have a more important role on a worldwide basis. Currently, mobile (wireless) phones are undergoing much development to provide advanced functionality. The mobile phone network is a network such as a GSM, GPRS, or WCDMA, 3G and 4G standards, and the network may allow mobile phones to communicate with each other. The base station may be for transmitting (and receiving) information to the mobile phone.

A typical mobile phone system may include, for example, a processor, a flash memory, a static random access memory, a display, a removable memory, a radio frequency (RF) receiver/transmitter, an analog base band (ABB), a digital base band (DBB), an image sensor, a high-speed bi-directional interface, a keypad, a microphone, and a speaker. A typical mobile phone system may include a multiplicity of an element, for example, two or more static random access memories, two or more displays, two or more RF receiver/transmitters, and so on.

Conventional radios used in wireless communications, such as radios used in conventional cellular telephones, typically may include several discrete RF circuit components. Some receiver architectures may employ superheterodyne techniques. In a super heterodyne architecture an incoming signal may be frequency translated from its radio frequency (RF) to a lower intermediate frequency (IF). The signal at IF may be subsequently translated to baseband where further digital signal processing or demodulation may take place. Receiver designs may have multiple IF stages. The reason for using such a frequency translation scheme is that circuit design at the lower IF frequency may be more manageable for signal processing. It is at these IF frequencies that the selectivity of the receiver may be implemented, automatic gain control (AGC) may be introduced, etc.

A mobile phone's need of a high-speed data communication capability in addition to a speech communication capability has increased in recent years. In GSM (Global System for Mobile communications), one of European Mobile Communications Standards, GPRS (General Packet Radio Service) has been developed for speeding up data communication by allowing a plurality of time slot transmissions for one time slot transmission in the GSM with the multiplexing TDMA (Time Division Multiple Access) architecture. EDGE (Enhanced Data for GSM Evolution) architecture provides faster communications over GPRS.

4th Generation (4G) mobile systems aim to provide broadband wireless access with nominal data rates of 100 Mbit/s. 4G systems may be based on the 3GPP LTE (Long Term Evolution) cellular standard, WiMax or Flash-OFDM wireless metropolitan area network technologies. The radio interface in these systems may be based on all-IP packet switching, MIMO diversity, multi-carrier modulation schemes, Dynamic Channel Assignment (DCA) and channel-dependent scheduling.

Prior art such as U.S. application Ser. No. 12/871,984 may provide a description of a mobile device and its block-diagram.

It is understood that the use of specific component, device and/or parameter names (such as those of the executing utility/logic described herein) are for example only and not meant to imply any limitations on the invention. The invention may thus be implemented with different nomenclature/terminology utilized to describe the components/devices/parameters herein, without limitation. Each term utilized herein is to be given its broadest interpretation given the context in which that term is utilized. For example, as utilized herein, the following terms are generally defined:

(1) Mobile computing/communication device (MCD): is a device that may be a mobile communication device, such as a cell phone, or a mobile computer that performs wired and/or wireless communication via a connected wireless/wired network. In some embodiments, the MCD may include a combination of the functionality associated with both types of devices within a single standard device (e.g., a smart phones or personal digital assistant (PDA)) for use as both a communication device and a computing device.

Some embodiments of the invention may include alternative techniques to build IC (Integrated Circuit) devices including techniques and methods to construct 3D IC systems. Some embodiments of the invention may enable device solutions with far less power consumption than prior art, or with more functionality in a smaller physical footprint. These device solutions could be very useful for the growing application of Autonomous in vivo Electronic Medical (AEM) devices and AEM systems such as ingestible "camera pills," implantable insulin dispensers, implantable heart monitoring and stimulating devices, and the like. One such ingestible "camera pill" is the Philips' remote control "iPill". For example, incorporating the 3D IC semiconductor devices according to some embodiments of the invention within these AEM devices and systems could provide superior autonomous units that could operate much more effectively and for a much longer time than with prior art technology. Sophisticated AEM systems may be greatly enhanced by complex electronics with limited power budget. The 3D technology described in many of the embodiments of the invention would allow the construction of a low power high complexity AEM system. For example it would be possible to integrate into a small form function a complex logic circuit with high density high speed memory utilizing some of the 3D DRAM embodiments herein and to add some non-volatile 3D NAND charge trap or RRAM described in embodiments herein. Also in another application Ser. No. 12/903,862 filed by some of the inventors and assigned to the same assignee a 3D micro display and a 3D image sensor are presented. Integrating one or both to complex logic and or memory could be very effective for retinal implants. Additional AEM systems could be customized to some specific market applications. Utilizing 3D programmable logic or 3D gate array as has been described in some embodiments herein could be very effective. The need to reduce power to allow effective use of battery and also the light weight and small form factor derived by highly integrating functions with low waste of interconnect and substrate could benefit from the redundancy and repair idea of the 3D monolithic technology as has been presented in some of the inventive embodiments herein. This unique technology could enable disposable AEM devices that would be at a lower cost to produce and/or would require lower power to operate and/or would require lower size and/or lighter to carry and combination of these features to form a competitive or desirable AEM system.

3D ICs according to some embodiments of the invention could also enable electronic and semiconductor devices with a much higher performance due to the shorter interconnect as well as semiconductor devices with far more complexity via multiple levels of logic and providing the ability to repair or use redundancy. The achievable complexity of the semiconductor devices according to some embodiments of the invention could far exceed what may be practical with the prior art technology. These advantages could lead to more powerful computer systems and improved systems that have embedded computers.

It will also be appreciated by persons of ordinary skill in the art that the invention is not limited to what has been particularly shown and described hereinabove. For example, drawings or illustrations may not show n or p wells for clarity in illustration. Moreover, transistor channels illustrated or discussed herein may include doped semiconductors, but may instead include undoped semiconductor material. Further, any transferred layer or donor substrate or wafer preparation illustrated or discussed herein may include one or more undoped regions or layers of semiconductor material. Rather, the scope of the invention includes both combinations and sub-combinations of the various features described herein above as well as modifications and variations which would occur to such skilled persons upon reading the foregoing description. Thus the invention is to be limited only by the appended claims.

What is claimed is:
1. A 3D semiconductor memory, the memory comprising:
a first level comprising first memory cells, first transistors, and a first control line,
wherein said first memory cells each comprise one of said first transistors;
a second level comprising second memory cells, second transistors, and a second control line,
wherein said second memory cells each comprise one of said second transistors,
wherein said second level overlays said first level,
wherein said second control line and said first control line have been processed following the same lithography step and accordingly are self-aligned,
wherein said first control line is directly connected to each source or drain of at least five of said first transistors, and
wherein said second control line is directly connected to each source or drain of at least five of said second transistors; and
an oxide layer disposed between said first control line and said second control line.
2. The 3D semiconductor memory according to claim 1, wherein said second control line comprises silicon.
3. The 3D semiconductor memory according to claim 1, wherein said first transistors each comprise a poly-silicon transistor channel.

4. The 3D semiconductor memory according to claim 1, wherein at least one of said first transistors is self-aligned to at least one of said second transistors, having been processed following the same lithography step.

5. The 3D semiconductor memory according to claim 1, further comprising:
a plurality of metalized memory control lines; and
a single crystal silicon substrate,
wherein said plurality of memory control lines are primarily disposed between said single crystal silicon substrate and said first level.

6. The 3D semiconductor memory according to claim 1, wherein said first control line comprises silicon.

7. The 3D semiconductor memory according to claim 1, further comprising:
a single crystal silicon substrate,
wherein said single crystal substrate comprises third transistors, and
wherein at least one of said third transistors is directly below at least a portion of said first transistors.

8. A 3D semiconductor memory, the memory comprising:
a first level comprising first memory cells, first transistors, and a first control line,
wherein said first memory cells each comprise one of said first transistors;
a second level comprising second memory cells, second transistors, and a second control line,
wherein said second memory cells each comprise one of said second transistors,
wherein said second level overlays said first level,
wherein said second control line and said first control line have been processed following the same lithography step and accordingly are self-aligned,
wherein said first control line is directly connected to each source or drain of at least five of said first transistors, and
wherein said second control line is directly connected to each source or drain of at least five of said second transistors; and
an oxide layer disposed between said first control line and said second control line,
wherein said second transistors each comprise a double gate.

9. The 3D semiconductor memory according to claim 8, wherein said second control line comprises silicon.

10. The 3D semiconductor memory according to claim 8, wherein said second transistor comprises a poly-silicon transistor channel.

11. The 3D semiconductor memory according to claim 8, wherein at least one of said first transistors is self-aligned to at least one of said second transistors, having been processed following the same lithography step.

12. The 3D semiconductor memory according to claim 8, further comprising:
a plurality of metalized memory control lines; and
a single crystal silicon substrate,
wherein said plurality of metalized memory control lines are primarily disposed between said single crystal silicon substrate and said first level.

13. The 3D semiconductor memory according to claim 8, wherein said first control line comprises silicon.

14. The 3D semiconductor memory according to claim 8, further comprising:
a single crystal silicon substrate,
wherein said single crystal silicon substrate comprises third transistors, and
wherein at least one of said third transistors is disposed directly below at least a portion of said first transistors.

15. A 3D semiconductor memory, the memory comprising:
a first level comprising first memory cells, first transistors, and a first control line,
wherein said first memory cells each comprise one of said first transistors;
a second level comprising second memory cells, second transistors, and a second control line,
wherein said second memory cells each comprise one of said second transistors,
wherein said second level overlays said first level,
wherein said second control line and said first control line have been processed following the same lithography step and accordingly are self-aligned,
wherein said first control line is directly connected to each source or drain of at least five of said first transistors, and
wherein said second control line is directly connected to each source or drain of at least five of said second transistors; and
an oxide layer disposed between said first control line and said second control line,
wherein said second transistors comprise a poly-silicon transistor channel.

16. The 3D semiconductor memory according to claim 15, wherein said second transistors each comprise a double gate.

17. The 3D semiconductor memory according to claim 15, wherein at least one of said first transistors is self-aligned to at least one of said second transistors, having been processed following the same lithography step.

18. The 3D semiconductor memory according to claim 15, further comprising:
a plurality of metalized memory control lines; and
a single crystal silicon substrate,
wherein said plurality of metalized memory control lines are primarily disposed between said single crystal silicon substrate and said first level.

19. The 3D semiconductor memory according to claim 15, wherein said first control line comprises silicon.

20. The 3D semiconductor memory according to claim 15, further comprising:
a single crystal silicon substrate,
wherein said single crystal silicon substrate comprises third transistors, and
wherein at least one of said third transistors is disposed directly below at least a portion of said first transistors.

* * * * *